US008624214B2

(12) United States Patent
Mikawa et al.

(10) Patent No.: US 8,624,214 B2
(45) Date of Patent: Jan. 7, 2014

(54) SEMICONDUCTOR DEVICE HAVING A RESISTANCE VARIABLE ELEMENT AND A MANUFACTURING METHOD THEREOF

(75) Inventors: Takumi Mikawa, Shiga (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 239 days.

(21) Appl. No.: 12/866,359

(22) PCT Filed: Jun. 8, 2009

(86) PCT No.: PCT/JP2009/002570
§ 371 (c)(1),
(2), (4) Date: Aug. 5, 2010

(87) PCT Pub. No.: WO2009/150814
PCT Pub. Date: Dec. 17, 2009

(65) Prior Publication Data
US 2010/0321095 A1     Dec. 23, 2010

(30) Foreign Application Priority Data
Jun. 10, 2008  (JP) .................. 2008-151320

(51) Int. Cl.
*H01L 29/02* (2006.01)
*H01L 47/00* (2006.01)
*H01L 21/00* (2006.01)

(52) U.S. Cl.
USPC ............. 257/2; 257/3; 257/4; 257/E29.308; 438/95

(58) Field of Classification Search
USPC ................. 257/2, 3, 4, E29.308; 438/95
See application file for complete search history.

(56) References Cited

U.S. PATENT DOCUMENTS

| 7,321,130 B2 | 1/2008 | Lung et al. |
| 7,781,230 B2* | 8/2010 | Odagawa et al. ............... 438/3 |
| 7,786,548 B2* | 8/2010 | Osano et al. ............... 257/528 |
| 2002/0045311 A1 | 4/2002 | Mikawa |
| 2005/0093043 A1* | 5/2005 | Morita et al. ............... 257/295 |
| 2005/0226062 A1 | 10/2005 | Aratani et al. |

(Continued)

FOREIGN PATENT DOCUMENTS

| EP | 1 056 128 A | 11/2000 |
| EP | 1 796 103 A | 6/2007 |

(Continued)

OTHER PUBLICATIONS

Japanese Office Action issued in Japanese Patent Application No. JP 2010-511835 dated May 18, 2010.

(Continued)

*Primary Examiner* — Phat X Cao
(74) *Attorney, Agent, or Firm* — McDermott Will & Emery, LLP

(57) ABSTRACT

A semiconductor device (100) of the present invention has a structure in which an interlayer insulating layer (115) is formed on an uppermost wire (114), contacts (116, 117) penetrate the interlayer insulating layer (115), a lower electrode (118*a*) of the resistance variable element is formed on the interlayer insulating layer (115) to cover the contact (116), and resistance variable layer (119) is formed on the interlayer insulating layer (115) to cover the lower electrode (118*a*) and the contact (117). The contact (116) and the lower electrode (118*a*) serve as a first terminal, while the contact (117) serves as a second terminal.

10 Claims, 34 Drawing Sheets

(56) References Cited

U.S. PATENT DOCUMENTS

| | | |
|---|---|---|
| 2005/0285170 A1 | 12/2005 | Mikawa et al. |
| 2006/0081961 A1* | 4/2006 | Tanaka et al. ............ 257/536 |
| 2007/0240995 A1 | 10/2007 | Odagawa et al. |
| 2008/0007737 A1 | 1/2008 | Sekiya et al. |
| 2010/0051892 A1 | 3/2010 | Mikawa et al. |

FOREIGN PATENT DOCUMENTS

| | | |
|---|---|---|
| JP | 2001-044376 | 2/2001 |
| JP | 2002-198494 | 7/2002 |
| JP | 2004-342843 | 12/2004 |
| JP | 2005-268494 | 9/2005 |
| JP | 2007-165873 | 6/2007 |
| JP | 2008-016577 | 1/2008 |
| JP | 2008-028248 | 2/2008 |
| JP | 2008-091601 | 4/2008 |
| JP | 2008-235427 | 10/2008 |
| WO | WO 2004/100266 A1 | 11/2004 |
| WO | WO 2008/050716 A1 | 5/2008 |

OTHER PUBLICATIONS

Chinese Office Action issued in Chinese Patent Application No. 200980105943.8 dated Jul. 31, 2012.

* cited by examiner (a)

(b)

US 8,624,214 B2

SEMICONDUCTOR DEVICE HAVING A RESISTANCE VARIABLE ELEMENT AND A MANUFACTURING METHOD THEREOF

RELATED APPLICATIONS

This application is the U.S. National Phase under 35 U.S.C. §371 of International Application No. PCT/JP2009/002570, filed on Jun. 8, 2009, which in turn claims the benefit of Japanese Application No. 2008-151320, filed on Jun. 10, 2008, the disclosures of which Applications are incorporated by reference herein.

TECHNICAL FIELD

The present invention relates to a semiconductor device including nonvolatile resistance variable elements which stably change resistance values to be retained, in response to voltage pulses applied, a manufacturing method of the semiconductor device, a semiconductor chip incorporating the semiconductor device, and an application system using the semiconductor device.

BACKGROUND ART

In recent years, with advancement of digital technologies, electronic hardware such as portable information devices and information home appliance have been developed to provide higher speeds and higher functionalities. With progresses of higher-speed and highly-functional electronic hardware, there has been an increasing demand for fuses with several hundreds bit level for regulation after completion of LSI or system boards.

The fuses have a wide variety of uses such as numerous process products and generation LSI such as state-of-the-art CMOS and bipolar CMOS analogs. Therefore, it is required that the fuses be easily applied to devices and processes.

Under the circumstances in which there have been such demands, electric fuse elements, polysilicon fuse elements, laser fuse elements and so on have been conventionally used. But, these fuse elements can overwrite only once in an operation principle.

An exemplary application of nonvolatile elements to fuses is a flash memory or a ferroelectric memory. These memories require many additional masks to process of the existing CMOS, for example, five to ten additional masks, which has a disadvantage in cost performance and provides low compatibility with other processes.

These days, as a use of the fuses, there has been proposed three-dimensional nonvolatile elements in cross-point array, comprising memory cells each including a resistance variable memory and a polycrystalline silicon diode which are stacked together (see patent document 1).

FIG. 32 shows a cross-section of a semiconductor device 10 of the proposed use. To be specific, a memory cell is constituted by a pillar 17 including a diode 18. The diode 18 is provided on a ReRAM stack 20 having a MIM structure composed of an upper electrode 66, a resistance variable layer 68, and a lower electrode 70. The ReRAM stack 20 is provided on a bit line 22, and the diode 18 is provided under a word line 12. As desired, a barrier layer 19 is provided between the ReRAM stack 20 and the diode 18. The cross-point of the bit line 22 and the word line 12 serves as the memory cell in the cross-point array.

PRIOR ART DOCUMENT

Patent Document

Patent document 1: Japanese Laid-Open Patent Application Publication No. 2007-165873

SUMMARY OF THE INVENTION

Problem to be Solved by the Invention

However, fuse elements using the above mentioned resistance variable elements are inevitably affected by post-process steps which are steps for forming contacts and wires above resistance variable layers, after forming the resistance variable layers. Especially when resistance variable layers containing oxygen which are represented by transition metal oxide are used, oxygen diffuses in the resistance variable layers due to thermal budget in the post-process steps, resulting in a variation in cell resistances.

The present invention is directed to solving the above mentioned problem, and an object of the present invention is to provide a semiconductor device in which nonvolatile resistance variable elements which stably change resistance without being affected by post-process steps such as a wiring step are formed in such a manner that resistance variable layers are formed at the upper side of uppermost wires and potential is led out from underlying layers of the resistance variable layers (i.e., potential of the resistance variable layers is detected from underlying layers of the resistance variable layers), and the nonvolatile resistance variable elements are used as fuse elements for application to various processes, and a manufacturing method of the semiconductor device.

Means for Solving the Problem

To achieve the above object, a semiconductor device of the present invention comprises a semiconductor substrate; a plurality of transistors formed on the semiconductor substrate; a multi-layered wire structure including wires arranged in different layers via an insulating layer above the plurality of transistors, the multi-layered wire structure connecting a resistance variable element to the transistor, the resistance variable element being configured to change its resistance in response to voltages applied thereto; a first terminal and a second terminal which are formed above an uppermost wire of the multi-layered wire structure and are electrically connected to the uppermost wire, or the first terminal and the second terminal which are formed in a part of the uppermost wire; and resistance variable layer which is arranged to cover and contact an upper surface of at least one of the first terminal and the second terminal; and the resistance variable element including the first terminal, the resistance variable layer and the second terminal.

In such a configuration, since the resistance variable layer is formed at the upper side of the uppermost wire and electric potential is led out from underlying layers, it is possible to implement a semiconductor device incorporating resistance variable memories stably without being affected by post-process steps.

When the first terminal and the second terminal are formed using a part of the uppermost wire, masks used to fabricate these terminals individually and steps for fabricating these terminals are omitted. Therefore, it is possible to implement a semiconductor device at a reduced process cost without increasing the number of process steps.

In the semiconductor device of the present invention, the resistance variable element may include the first terminal, the resistance variable layer and the second terminal such that the resistance variable element does not share the resistance variable layer with the other resistance variable elements.

In the above configuration, in the semiconductor device of the present invention, the resistance variable element is operable stably without being affected by writing to other adjacent resistance variable elements, and can serve as the fuse element effectively.

In the semiconductor device of the present invention, the resistance variable layer may be arranged to cover and contact an upper surface of both of the first terminal and the second terminal.

In this way, the resistance variable layer may be formed at the upper side of the uppermost wire and the resistance variable element may operate horizontally.

An upper surface of the resistance variable element may be covered with only a passivation layer. In such a configuration, only a step for forming the passivation layer is performed after forming the resistance variable element. This makes it possible to minimize an influence of thermal treatment and the like. Furthermore, since the entire upper surface of the resistance variable element is covered with the highly moisture-resistant passivation layer, the resistance variable element is allowed to have a stable resistance changing characteristic and reliability without being affected by external environment.

A material of the first terminal may be different from a material of the second terminal. In such a configuration, the resistance variable layer is allowed to change its resistance at a specified region which is an interface between the resistance variable layer and metal which provides higher compatibility with the resistance variable layer, and an incorrect operation at an opposite interface can be suppressed.

Either one of the first terminal and the second terminal may includes electrode layer comprising precious metal which is in contact with the resistance variable layer. The precious metal may include platinum and iridium. In such a configuration, precious metal does not react with the resistance variable layer at a low temperature and serves as a stable electrode. Especially, since platinum and iridium are relatively higher in standard electrode potential of redox for enabling a stable resistance changing operation to occur, a semiconductor device with a stable characteristic can be implemented using platinum and iridium. In some cases, precious metal may be a cause of junction leakage associated with the transistors. But, since the precious metal is used for the uppermost wire which are positioned distant from the transistors, there is substantially no fear of contamination which would be caused by diffusion of the precious metal. In the manufacturing method, the precious metal is used in a step which is close to a final step. This can significantly reduce semiconductor equipment exclusive for contamination of the precious metal.

A conductive layer which is lower in resistance than the resistance variable layer may be formed on the upper surface of the resistance variable layer. In such a configuration, since the conductive layer is lower in resistivity than the resistance variable layer, a wire resistance between the first terminal and the second terminal can be reduced. The conductive layers serve as the upper electrode of the resistance variable element, and in some cases, design flexibility is improved such that the resistance variable layer is allowed to change its resistance in a region at the upper electrode side.

The conductive layer may include electrode layer comprising precious metal in contact with the resistance variable layer. For the reason mentioned above, there is substantially no fear of contamination in addition to achievement of a stable resistance changing characteristic.

The resistance variable layer may comprise a transition metal oxide. In particular, the resistance variable layers may comprise a tantalum oxide. In such a configuration, the resistance variable layer has a reversible and stable rewrite characteristic and a good resistance value retention characteristic as well as high-speed operability. Especially when the tantalum oxide is used for the resistance variable layer, it is possible to implement a semiconductor device which can be manufactured with a manufacturing process which is highly compatible with a standard Si semiconductor process.

The resistance variable layer may include two transition metal oxide layers which are different from each other in oxygen concentration, and a portion of the resistance variable layer which is in contact with one of the first terminal, the second terminal and the conductive layer may be the transition metal oxide layer with higher oxygen concentration, of the two transition metal oxide layers. In such a configuration, the resistance variable layer is allowed to change its resistance at a specified region which is an interface where oxygen concentration is higher, and an incorrect operation at an opposite interface can be suppressed. In addition, a step (forming step) for allowing oxygen to concentrate at one of the first terminal and second terminal by applying a voltage after the end of diffusion of oxygen can be dispensed with. The resistance variable element is operable in a forming-less method, without a need for a high forming voltage, and at low voltages.

A method of manufacturing a semiconductor device of the present invention comprises the steps of: forming a plurality of transistors on a semiconductor substrate; forming wires in different layers via an insulating layer above the plurality of transistors; forming a first terminal and a second terminal on an uppermost wire such that the first terminal and the second terminal are electrically connected to the uppermost wire; forming a resistance variable layer such that the resistance variable layer covers and contacts the upper surface of at least one of the first terminal and the second terminal; and covering an entire surface of the resistance variable layer with a passivation layer.

In such a method, since the resistance variable layer is formed at the upper side of the uppermost wire and electric potential is led out from underlying layers, it is possible to implement a semiconductor device incorporating nonvolatile resistance variable memories which can change its resistance stably without being affected by post-process steps such as a wiring step.

A method of manufacturing a semiconductor device of the present invention, comprises the steps of: forming a plurality of transistors on a semiconductor substrate; forming wires in different layers via an insulating layer above the plurality of transistors; forming resistance variable layer such that the resistance variable layer covers and contacts the upper surface of a part of the uppermost wire; and covering an entire surface of the resistance variable layers with a passivation layer.

In such a method, in addition to the above advantage, masks used to fabricate the first terminal and the second terminal individually and the process steps for fabricating these terminals individually are omitted. Therefore, it is possible to implement a semiconductor device at a reduced process cost without increasing the number of process steps.

The method may further comprise a step of: forming conductive layers over the upper surface of the resistance variable layer, the conductive layer being lower in resistance than the resistance variable layer. With addition of such a step, since the conductive layer is lower in resistivity than the resistance variable layer, wire resistance between the first terminal and the second terminal can be reduced. The conductive layer serves as the upper electrode of the resistance variable element, and in some cases, the design flexibility is improved such that the resistance variable layer is allowed to change its resistance in a region at the upper electrode side.

A semiconductor chip of the present invention comprises the above semiconductor device of the present invention; and a semiconductor memory or an analog processing LSI. For example, the semiconductor chip may be a chip in which the above semiconductor device of the present invention is incorporated into a fuse circuit used to relieve faulty bits in semiconductor memories. Or, the semiconductor chip may be a chip in which the above semiconductor device of the present invention is incorporated as a correction circuit used to regulate the output of an analog circuit.

In such a configuration, the semiconductor device including the nonvolatile resistance variable element of the present invention makes it possible to relieve faulty bits in the semiconductor memory and regulate parameters of the analog processing LSI after completion of LSI or completion of a system board, which is adapted for achievement of higher speeds and higher functionalities of electronic hardware such as portable information devices and information home appliance.

A system of the present invention comprises a semiconductor chip incorporating the above semiconductor device of the present invention; and a chip incorporating a semiconductor memory or a chip incorporating an analog processing LSI, the chip being electrically connected to the semiconductor chip. For example, a system may comprise a semiconductor memory mounted chip; and a control LSI mounted chip electrically connected to the semiconductor memory mounted chip; wherein a fuse circuit using the above semiconductor device is incorporated into the control LSI mounted chip to relieve faulty bits in a semiconductor memory. Or, a system may comprise a semiconductor memory mounted chip; and a control LSI mounted chip electrically connected to the semiconductor memory mounted chip; wherein a fuse circuit using the above semiconductor device is incorporated into the semiconductor memory mounted chip to relieve faulty bits in a semiconductor memory. Or, a system may comprise an external information input device; an analog processing LSI mounted chip configured to receive an analog output signal from the external information input device; and a digital processing LSI mounted chip configured to receive a digital output signal from the analog processing LSI mounted chip, wherein a correction circuit using the above semiconductor device is incorporated into the analog processing LSI mounted chip to regulate an output of the analog processing LSI mounted chip.

In such a configuration, the semiconductor device of the present invention is capable of relieving faulty bits in the semiconductor memory of other chips and regulating parameters of analog processing LSI, outside a semiconductor chip into which the semiconductor device of the present invention is mounted. As a result, even a system for a variety of electronic hardware with higher speeds and higher functionality, can regulate a variation in a unified manner and can be made into a system having a regulation capability.

Advantages of the Invention

In the semiconductor device of the present invention, since the resistance variable layer is formed at the upper side of the uppermost wire and electric potential is led out from underlying layers, it is possible to implement a semiconductor device incorporating a nonvolatile resistance variable element which change resistance stably without being affected by post-process steps such as a wiring step. In addition, since the resistance variable element is formed in a final process step, the semiconductor device is easily incorporated into various process products and LSI for various generations, such as bipolar CMOS analog as well as state-of-the-art CMOS.

BRIEF DESCRIPTION OF THE DRAWINGS

FIG. 1 is a cross-sectional view showing an exemplary configuration of a semiconductor device according to Embodiment 1 of the present invention.

FIG. 1A is a plan view showing an exemplary configuration of the semiconductor device according to Embodiment 1 of the present invention.

FIG. 1B is a cross-sectional view taken in the direction of arrows along line A-A' of FIG. 1A.

FIGS. 2(a) to 2(d) are cross-sectional views showing a manufacturing method of major constituents of the semiconductor device according to Embodiment 1 of the present invention.

FIGS. 3(a) and 3(b) are cross-sectional views showing a manufacturing method of major constituents of the semiconductor device according to Embodiment 1 of the present invention.

FIG. 4 is a cross-sectional view showing an exemplary configuration of a semiconductor device according to Embodiment 2 of the present invention.

FIGS. 5(a) to 5(d) are cross-sectional views showing a manufacturing method of major constituents of the semiconductor device according to Embodiment 1 of the present invention.

FIGS. 6(a) and 6(b) are cross-sectional views showing a manufacturing method of major constituents of the semiconductor device according to Embodiment 2 of the present invention.

FIG. 7 is a cross-sectional view showing an exemplary configuration of a semiconductor device according to Embodiment 3 of the present invention.

FIGS. 8(a) to 8(e) are cross-sectional views showing a manufacturing method of major constituents of the semiconductor device according to Embodiment 3 of the present invention.

FIG. 9 is a cross-sectional view showing an exemplary configuration of a semiconductor device according to Embodiment 4 of the present invention.

FIGS. 10(a) to 10(e) are cross-sectional views showing a manufacturing method of major constituents of the semiconductor device according to Embodiment 4 of the present invention.

FIG. 11 is a cross-sectional view showing an exemplary configuration of a semiconductor device according to Embodiment 5 of the present invention.

FIGS. 12(a) to 12(d) are cross-sectional views showing a manufacturing method of major constituents of the semiconductor device according to Embodiment 5 of the present invention.

FIGS. 13(a) and 13(b) are cross-sectional views showing a manufacturing method of major constituents of the semiconductor device according to Embodiment 5 of the present invention.

FIG. 14 is a cross-sectional view showing an exemplary configuration of a semiconductor device according to Embodiment 6 of the present invention.

FIGS. 15(a) to 15(d) are cross-sectional views showing a manufacturing method of major constituents of the semiconductor device according to Embodiment 6 of the present invention.

FIG. 16 is a cross-sectional view showing an exemplary configuration of a semiconductor device according to Embodiment 7 of the present invention.

FIGS. 17(a) to 17(d) are cross-sectional views showing a manufacturing method of major constituents of the semiconductor device according to Embodiment 7 of the present invention.

FIGS. 18(a) and 18(b) are cross-sectional views showing a manufacturing method of major constituents of the semiconductor device according to Embodiment 7 of the present invention.

FIG. 19 is a cross-sectional view showing an exemplary configuration of a semiconductor device according to Embodiment 8 of the present invention.

FIGS. 20(a) to 20(e) are cross-sectional views showing a manufacturing method of major constituents of the semiconductor device according to Embodiment 8 of the present invention.

FIG. 21 is a cross-sectional view showing an exemplary configuration of a semiconductor device according to Embodiment 9 of the present invention.

FIGS. 22(a) to 22(d) are cross-sectional views showing a manufacturing method of major constituents of the semiconductor device according to Embodiment 9 of the present invention.

FIG. 23 is a cross-sectional view showing an exemplary configuration of a semiconductor device according to Embodiment 10 of the present invention.

FIGS. 24(a) to 24(e) are cross-sectional views showing a manufacturing method of major constituents of the semiconductor device according to Embodiment 10 of the present invention.

FIG. 25 is a view showing a voltage-current hysteresis characteristic of the semiconductor device according to Embodiment 1 of the present invention.

FIG. 26 is a view showing a change in a resistance value of a resistance variable layer with respect to a pulse number which occurs when electric pulses are applied to the semiconductor device of FIG. 25.

FIG. 27 is a block diagram showing an application of the semiconductor device of Embodiment 1 to LSI having a program function.

FIG. 28 is a circuit diagram showing a configuration of an address storage register for redundancy of FIG. 27.

FIG. 29 is a timing chart for explaining the operation of the address storage register for redundancy of FIG. 28.

FIG. 30(a) is a view showing an exemplary application of the semiconductor device of Embodiment 1 to a semiconductor system composed of DRAMs and control LSI, and FIG. 30(b) is a view showing another exemplary configuration provided for the same purpose as that of FIG. 30(a).

FIG. 31 is a view showing an exemplary application of the semiconductor device of Embodiment 1 to a system including an external information input device.

[FIG. 31]

EMBODIMENTS FOR CARRYING OUT THE INVENTION

Figure 1:
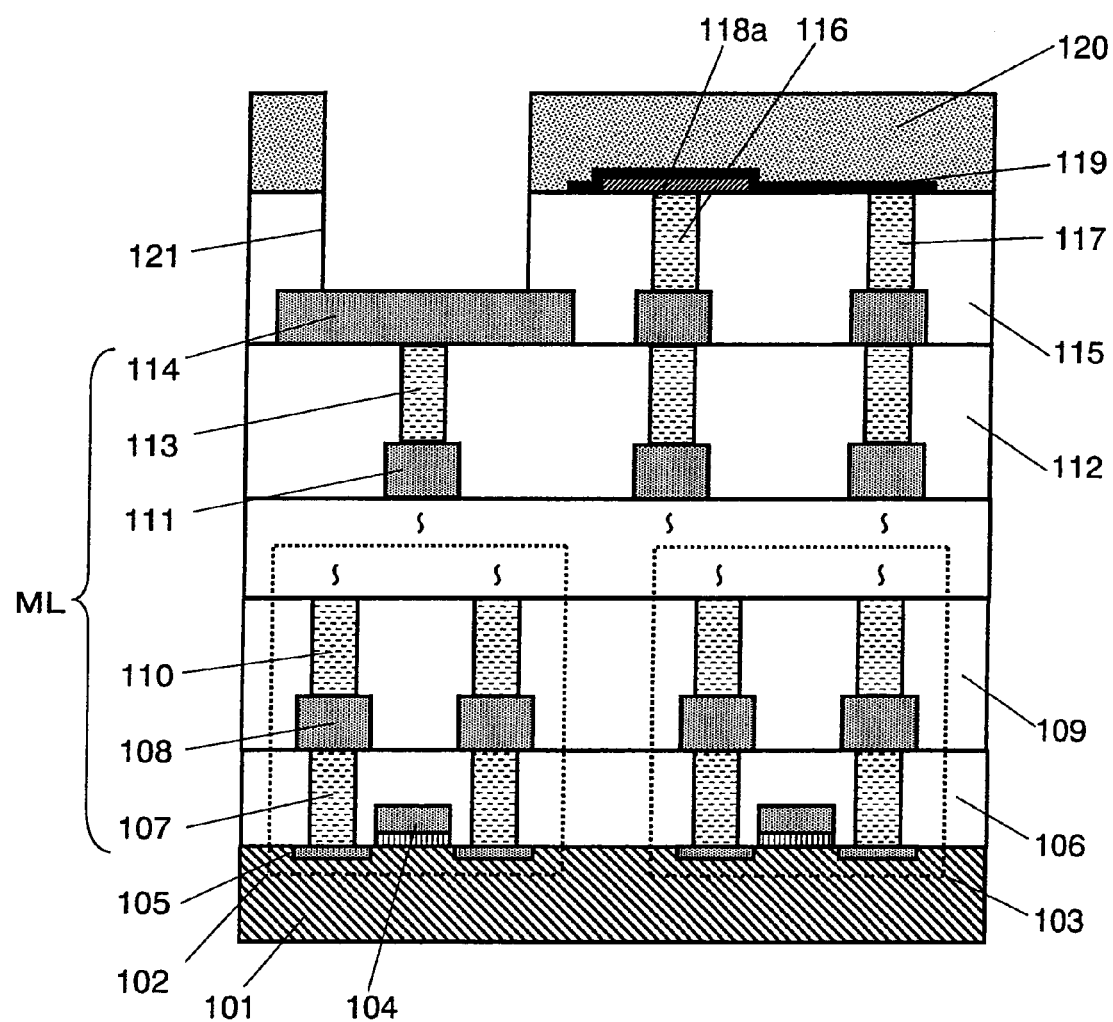
[FIG. 1]

Hereinafter, a semiconductor device and a manufacturing method thereof according to Embodiments of the present invention will be described with reference to the drawings. In the drawings, the constituents designated by the same reference numerals will not be described repetitively in some cases. For easier understanding, in the drawings, the constituents are schematically depicted and the shapes and others are not depicted correctly.

(Embodiment 1)

FIG. 1 is a cross-sectional view showing an exemplary configuration of a semiconductor device 100 according to Embodiment 1 of the present invention.

As shown in FIG. 1, the semiconductor device 100 of Embodiment 1 includes a substrate 101 provided with a plurality of transistors each including a gate electrode 104 and a diffusion layer 105, a first interlayer insulating layer 106 formed over the substrate 101 to cover the transistors, and a first contact 107 penetrating the first interlayer insulating layer 106 and electrically connected to the diffusion layer 105 of the transistor, resistively. A first wire 108 is formed on the first interlayer insulating layer 106 to cover the first contact 107. A second interlayer insulating layer 109 is formed over the first interlayer insulating layer 106 to cover the first wire 108. A second contact 110 is formed on the first wire 108 and is electrically connected to an upper wire. On the semiconductor substrate 101, a region corresponding to a device main circuit 102 such as memories or bipolar CMOS and a region corresponding to a resistance variable element rewrite fuse circuit 103 are formed.

As shown in FIG. 1, a multi-layered wire structure ML of the semiconductor device 100 comprises n (n: two or more) wire layers and n interlayer insulating layers and is used to connect the above mentioned transistors to resistance variable elements (described later in detail). In other words, in the multi-layered wire structure ML, wires are formed in difference layers via the interlayer insulating layer.

To be specific, an uppermost wire (n-th wire) 114 formed on the n-th interlayer insulating layer 112 is electrically connected to a (n−1)-th wire 111 via a n-th contact 113. Over the uppermost wire 114, a (n+1)-th interlayer insulating layer 115 is formed, and (n+1)-th contacts 116 and 117 that penetrate the (n+1)-th interlayer insulating layer 115 and are connected to the uppermost wire 114 are formed.

Each of the resistance variable elements comprises a resistance variable layer 119, and first and second terminals used to apply voltages to the resistance variable layer 119.

In this embodiment, lower electrode 118a of the resistance variable element is formed on the (n+1)-th interlayer insulating layers 115 to cover the (n+1)-th contact 116. The resistance variable layer 119 is formed on the (n+1)-th interlayer insulating layer 115 to cover the lower electrode 118a and the (n+1)-th contact 117. In this embodiment, the (n+1)-th contact 116 and the lower electrode 118a serve as the first terminal of the resistance variable element, and the (n+1)-th contact 117 serve as the second terminal of the resistance variable element.

As used herein, the term "electrode" of the resistance variable element refers to a conductive member which is adapted to draw oxygen in the resistance variable layer 119 and is in contact with a portion of the resistance variable layer 119 where resistance change occurs. The "electrode" commonly comprises precious metal such as platinum, which is relatively high in standard electrode potential of redox.

In this embodiment, only a passivation layer 120 is formed to directly cover the entire surface (especially the upper surface of the resistance variable element) including the resistance variable element. For example, if a highly moisture-resistant passivation layer such as silicon nitride is used, a thermal budget to the resistance variable element can be restricted to an amount of heat given at a deposition temperature of 400 degrees C. or lower for a very short deposition time of several minutes or less. In other words, in this embodiment, since the thermal budget to the resistance variable element is restricted to an amount of heat in a deposition step of silicon nitride, a total heat amount given to the resistance variable elements of this embodiment is much less than a total heat amount given to the conventional resistance variable element. This can effectively suppress a variation in cell resistance of the resistance variable element. Furthermore, a pad hole 121 for allowing transmission and reception of electric signals between the semiconductor device 100 and an external device penetrates the passivation layer 120 and the (n+1)-th interlayer insulating layer 115 and is connected to the uppermost wire 114.

In such a configuration, since the resistance variable layer is formed at the upper side of the uppermost wire and electric potential is led out from underlying layers, it is possible to implement a semiconductor device incorporating the resistance variable memory which change resistance stably without being affected by post-process steps such as a wiring step. In addition, since the entire upper surface of the resistance variable element is covered with the highly moisture-resistant passivation layer, the resistance variable element is not affected by the external environment and has a stable resistance changing characteristic and reliability.

In this embodiment, the (n+1)-th contacts 116 and 117 are made of a filling material containing tungsten as a major component, the lower electrode 118a comprises platinum, and the resistance variable layer 119 comprises tantalum oxide.

Thus, a portion of the first terminal which contacts the resistance variable layer 119 comprises a platinum, and the second terminal comprises a tungsten. That is, materials of these terminals are different from each other. In such a configuration, resistance change is allowed to occur at platinum where the standard electrode potential of redox is relatively higher.

The resistance variable layer 119 comprises oxide of transition metal (in this embodiment, tantalum) and includes at least two layers which are different from each other in oxygen concentration. To be specific, the lower layer (portion contacting the lower electrode 118a) of the resistance variable layer 119 is formed by a transition metal oxide layer with higher oxygen concentration (the same occurs in another embodiments including the lower electrode). This can dispense with a step (forming step) for allowing oxygen to concentrate at one of the first and second terminals by applying a voltage after the end of diffusion of oxygen. The resistance variable layer 119 is operable in a forming-less method, without a need for a high forming voltage, and at low voltages. The two-layered structure is accomplished by, for example, intentionally changing the flow rate of reactant gas (oxygen gas) in reactive sputtering or by oxidating the surface of the resistance variable layer 119.

Next, the structure of the semiconductor device 100 according to Embodiment 1 of the present invention when viewed from above will be described.

Figure 1A:
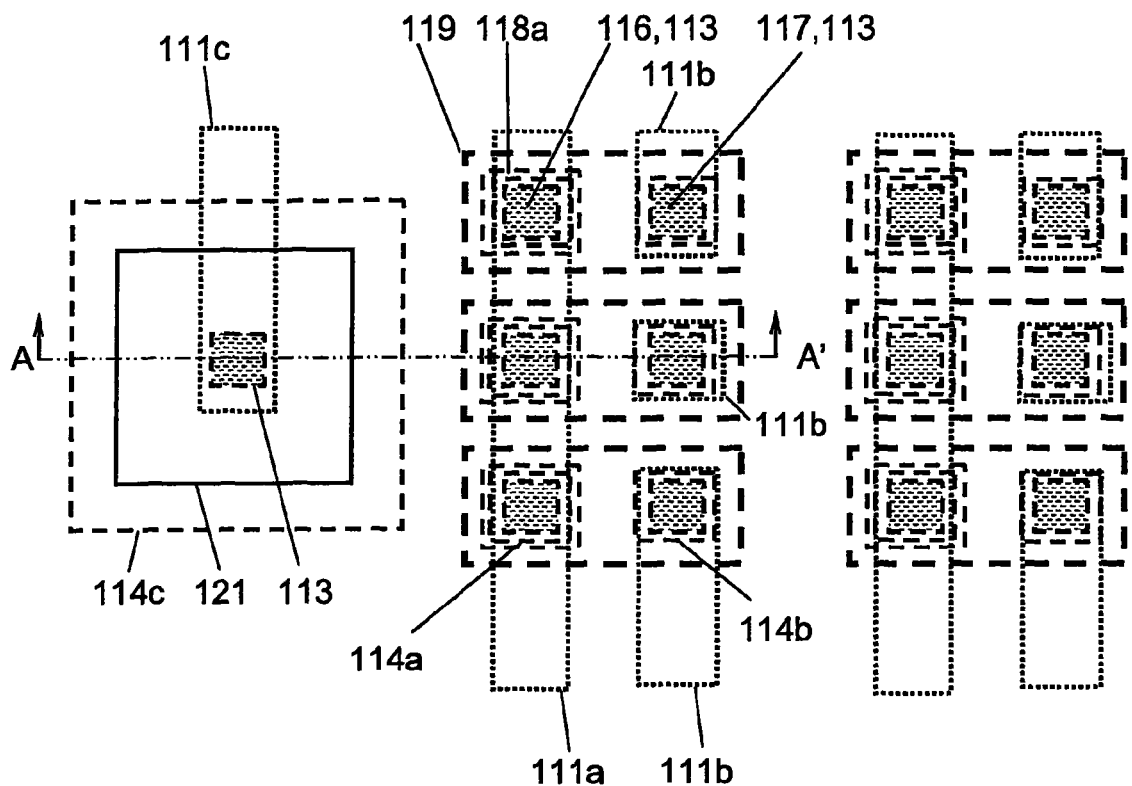
[FIG. 1A]

FIG. 1A is a plan view showing an exemplary configuration of the semiconductor device 100 according to Embodiment 1 of the present invention, in which a plurality of resistance variable elements are formed in array. The cross-section taken in the direction of arrows along line A-A' of FIG. 1A is depicted in FIG. 1B, and corresponds to a portion identical to that of the cross-section of FIG. 1.

Firstly, the planar configuration of the resistance variable element at the first terminal will be described.

Figure 1B:
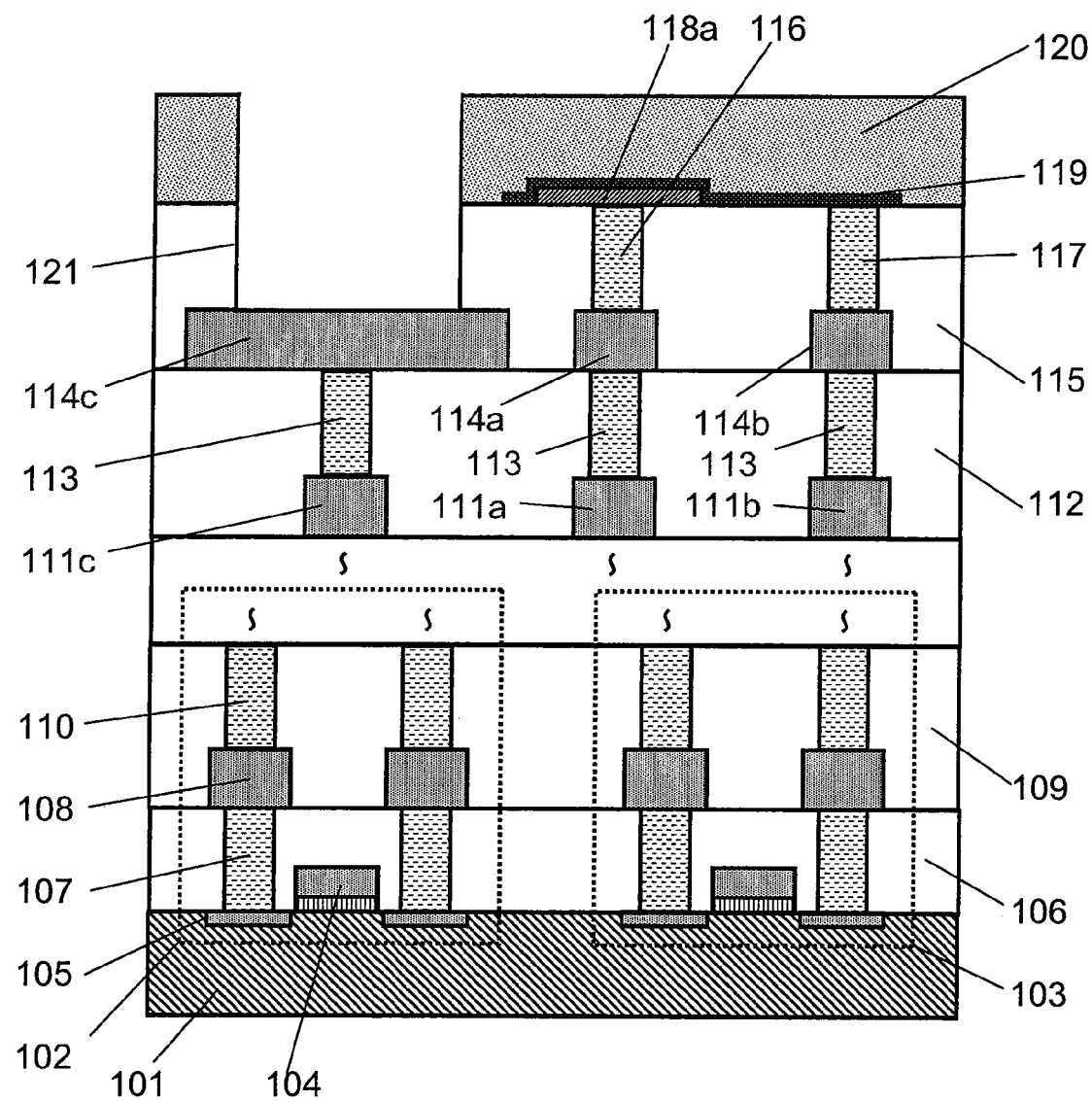
[FIG. 1B]

As shown in FIGS. 1A and 1B, the plurality of (n+1)-th contact 116 are arranged on the (n−1)-th wire 111a via the plurality of n-th contacts 113 and conductive rectangular patterns 114a defining the plurality of uppermost wires 114. The lower electrode 118a of the resistance variable element is individually formed to cover the (n+1)-th contact 116.

Next, the planar configuration of the resistance variable element at the second terminal will be described.

As shown in FIGS. 1A and 1B, the plurality of (n+1)-th contacts 117 are arranged on the (n−1)-th wire 111b individually formed, via the plurality of n-th contact 113 and conductive rectangular pattern 114b defining the plurality of uppermost wires 114.

Finally, the planar configuration of the resistance variable layers of the resistance variable elements will be described.

As shown FIGS. 1A and 1B, each of the resistance variable layers is formed to cover one lower electrode 118a and its adjacent one (n+1)-th contact 117.

Therefore, as shown in FIG. 1A (plan view), a number of resistance variable elements which are basic units are arranged in array in a two-dimensional configuration.

As should be appreciated from the above, the semiconductor device 100 of this embodiment has a feature that the contacts 117 serve as the electrodes, and a single resistance variable element comprises one resistance variable layer 119, one lower electrode 118a and one (n+1)-th contact 117. In other words, each of the resistance variable elements does not share the resistance variable layer 119 with its adjacent resistance variable elements.

As should be appreciated from the above planar configuration of the resistance variable elements, each of the plurality of resistance variable elements includes the first terminal, the resistance variable layer and the second terminal without sharing the resistance variable layer with other resistance variable elements. Therefore, each of the resistance variable elements of this embodiment is operable stably without being affected by writing for other adjacent resistance variable elements, and thus is able to operate effectively as a fuse element.

FIGS. 2(a) to 2(d) and FIGS. 3(a) and 3(b) are cross-sectional views showing the manufacturing method of the major constituents which are the uppermost wire 114 and the following constituents of the semiconductor device 100 of Embodiment 1. The steps for forming the transistors and the lower wires are omitted. The manufacturing method of the major constituents of the semiconductor device 100 of Embodiment 1 will be described with reference to these Figures.

Figure 2:
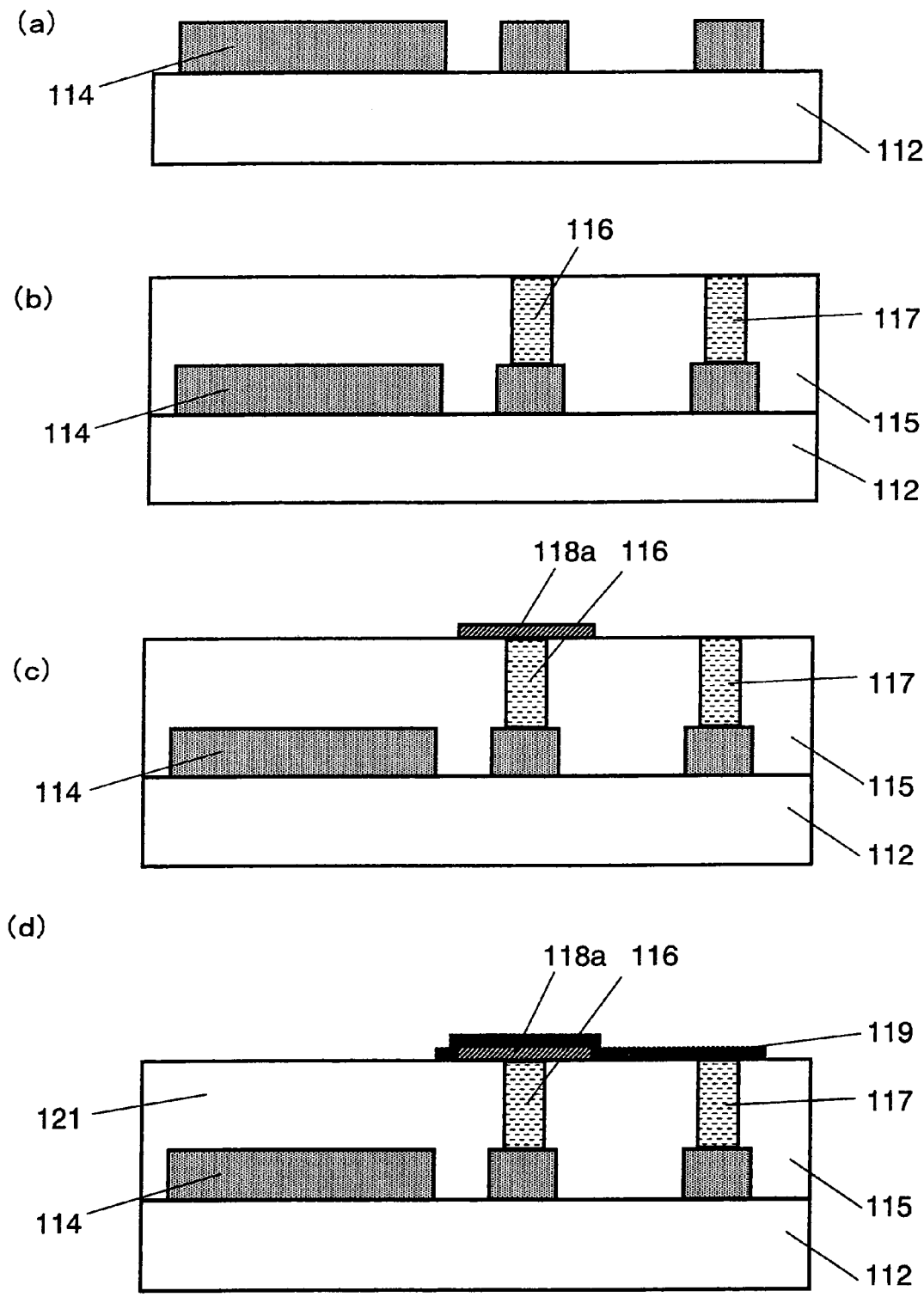
[FIG. 2]
Figure 3:
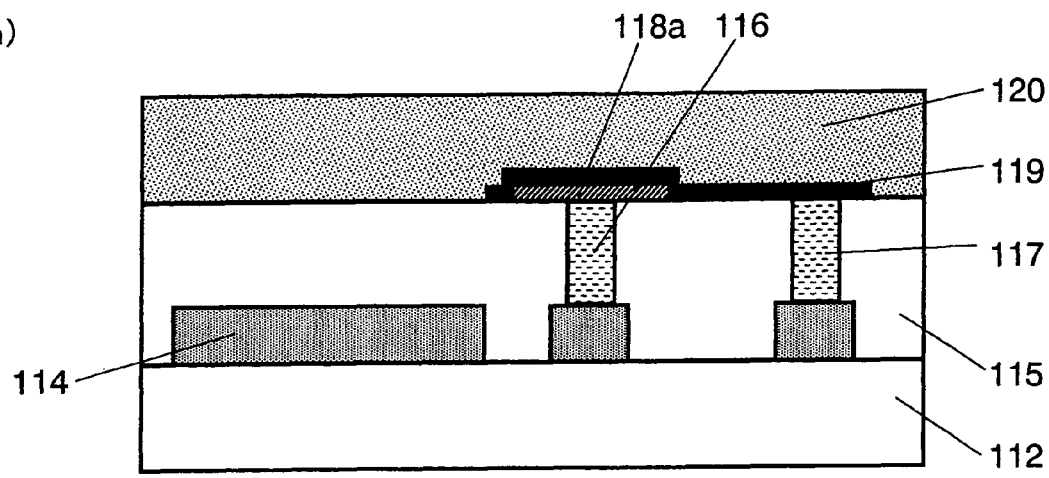
[FIG. 3]
Figure 3:
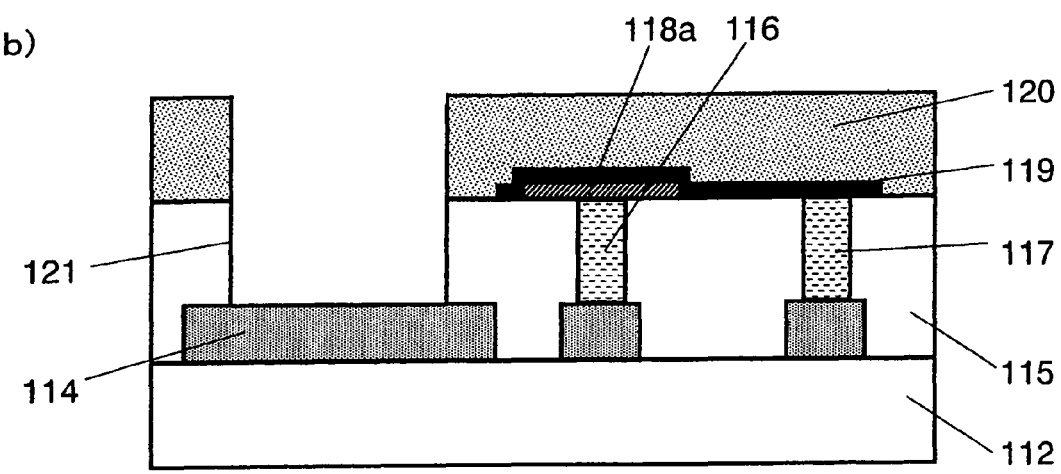

As shown in FIGS. 2 and 3, the manufacturing method of Embodiment 1 includes a step for forming the uppermost wire 114, a step for forming the (n+1)-th contacts 116 and 117, a step for forming the lower electrode 118a, a step for forming the resistance variable layer 119, a step for forming the passivation layer 120, and a step for forming the pad hole 121.

As shown in FIG. 2(a), in the step for forming the uppermost wire 114, the uppermost wire 114 are formed using a desired mask on the n-th interlayer insulating layer 112 covering the transistors and the lower wires. In this case, concurrently, pad metal for allowing signal transmission and reception between the semiconductor device 100 and the external device is formed.

Then, as shown in FIG. 2(b), in the step for forming the (n+1)-th contacts 116 and 117, the (n+1)-th interlayer insulating layer 115 is formed over the entire surface to cover the uppermost wire 114, and then the (n+1)-th contacts 116 and 117 are formed to penetrate the (n+1)-th interlayer insulating layer 115 and to be connected to the upper most wire 114. The contacts are filled with a filling material containing tungsten as a major component.

Then, as shown in FIG. 2(c), in the step for forming the lower electrode 118a of the resistance variable elements, the lower electrode 118a of the resistance variable element is formed by patterning using a desired mask on the (n+1)-th interlayer insulating layer 115 to cover the (n+1)-th contact 116. In this case, the upper layer of the lower electrode 118a comprises platinum and the lower layer of the lower electrode 118a comprises titanium nitride. This is because platinum provides a stable resistance changing characteristic and titanium nitride improves adhesiveness to the interlayer insulating layer.

Then, as shown in FIG. 2(d), in the step of forming the resistance variable layer 119, the resistance variable layer 119 is formed by patterning using a desired mask on the (n+1)-th interlayer insulating layer 115 to cover the lower electrode 118a and the (n+1)-th contact 117. In this case, the resistance variable layer 119 comprises tantalum oxide, in order to provide a reversible and stable rewrite characteristic and a good resistance value retention characteristic as well as high-speed operability and to implement a manufacturing process which is highly compatible with a standard Si semiconductor process. In the above configuration, the (n+1)-th contact 116 and the lower electrode 118a serve as the first terminal, while the (n+1)-th contact 117 serves as the second terminal.

Then, as shown in FIG. 3(a), in the step of forming the passivation layer 120, the passivation layer 120 is formed to directly cover the entire surface (especially, upper surface of the resistance variable element) of the resistance variable element, including the resistance variable layer 119. For example, if a highly moisture-resistant passivation layer such as silicon nitride is used, a thermal budget can be restricted to an amount of heat given at deposition temperature of 400 degrees C. or lower for a very short deposition time of several minutes or less.

Then, as shown in FIG. 3(b), in the step of forming the pad hole 121, the pad hole 121 for allowing transmission and reception of electric signals between the semiconductor device 100 and the external device is formed by patterning using a desired mask such that the pad hole 121 penetrates the passivation layer 120 and the (n+1)-th interlayer insulating layer 115 and is connected to the uppermost wire 114.

In such a method, since the resistance variable layer is formed at the upper side of the uppermost wire and the electric potential is led out from the underlying layers, it is possible to manufacture the semiconductor device including a resistance variable memory stably without being affected by the post-process steps such as the wiring step. In addition, since the entire upper surface of the resistance variable element is covered with the highly moisture-resistant passivation layer, it is possible to manufacture the semiconductor device having a stable resistance changing characteristic and reliability without being affected by external environment.

(Embodiment 2)

Figure 4:
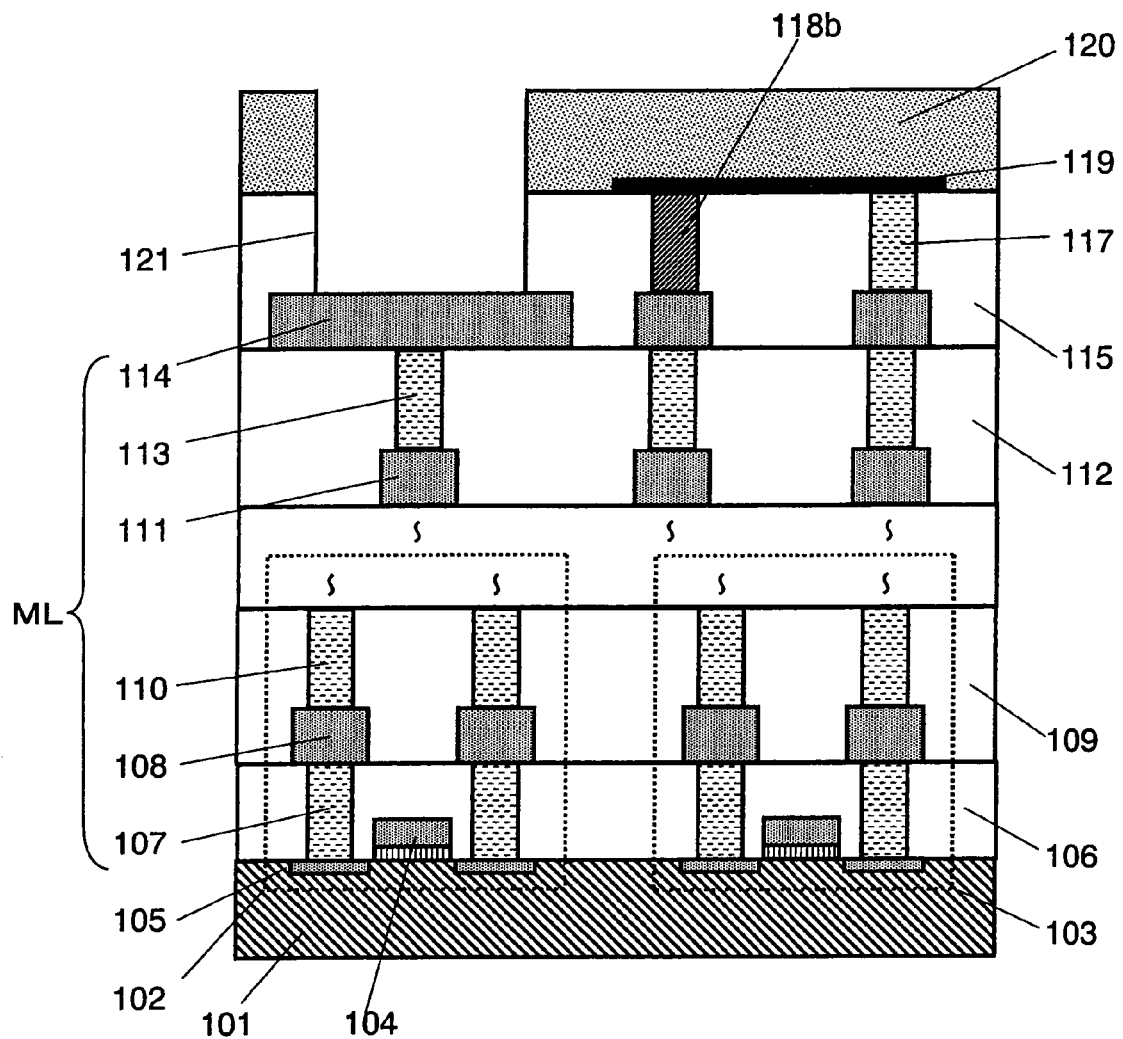
[FIG. 4]

FIG. 4 is a cross-sectional view showing an exemplary configuration of a semiconductor device 200 according to Embodiment 2 of the present invention.

As shown in FIG. 4, in the semiconductor device 200 of Embodiment 2, on the uppermost wire 114, the (n+1)-th interlayer insulating layer 115 is formed, and lower electrode 118b of the resistance variable element and the (n+1)-th contact 117 that penetrate the (n+1)-th interlayer insulating layer 115 and are connected to the uppermost wire 114 are formed. The resistance variable layer 119 is formed on the (n+1)-th interlayer insulating layer 115 to cover the lower electrode 118b and the (n+1)-th contact 117. In this case, the lower electrode 118b serves as the first terminal and the (n+1)-th contact 117 serves as the second terminal. Only the passivation layer 120 is formed to directly cover the entire surface (especially, upper surface of the resistance variable element) including the resistance variable element. The pad hole 121 for allowing transmission and reception of electric signals between the semiconductor device 200 and the external device penetrates the passivation layer 120 and the (n+1)-th interlayer insulating layer 115 and is connected to the uppermost wire 114. The uppermost wire 114 and the underlying constituents are identical in structure to those of the semiconductor device 100 and will not be described repetitively.

In such a configuration, since the resistance variable layer is formed at the upper side of the uppermost wires and electric potential is led out from underlying layers, it is possible to implement a semiconductor device incorporating a resistance variable memory stably without being affected by the post-process steps such as the wiring step. In addition, since the entire upper surface of the resistance variable element is covered with the highly moisture-resistant passivation layer, the resistance variable element is not affected by the external environment and have a stable resistance changing characteristic and reliability.

Furthermore, the semiconductor device 200 has an advantage over the semiconductor device 100 in that the resistance variable layer is allowed to have a flat surface without unevenness, a thickness with a less variation, and a stable resistance changing characteristic.

FIGS. 5(a) to 5(d) and FIGS. 6(a) and 6(b) are cross-sectional views showing the manufacturing method of the major constituents which are the uppermost wire 114 and the following constituents of the semiconductor device 200 of Embodiment 2. The steps for forming the transistors and the lower wires are omitted. The manufacturing method of the major constituents of the semiconductor device 200 of Embodiment 2 will be described with reference to these Figures.

Figure 5:
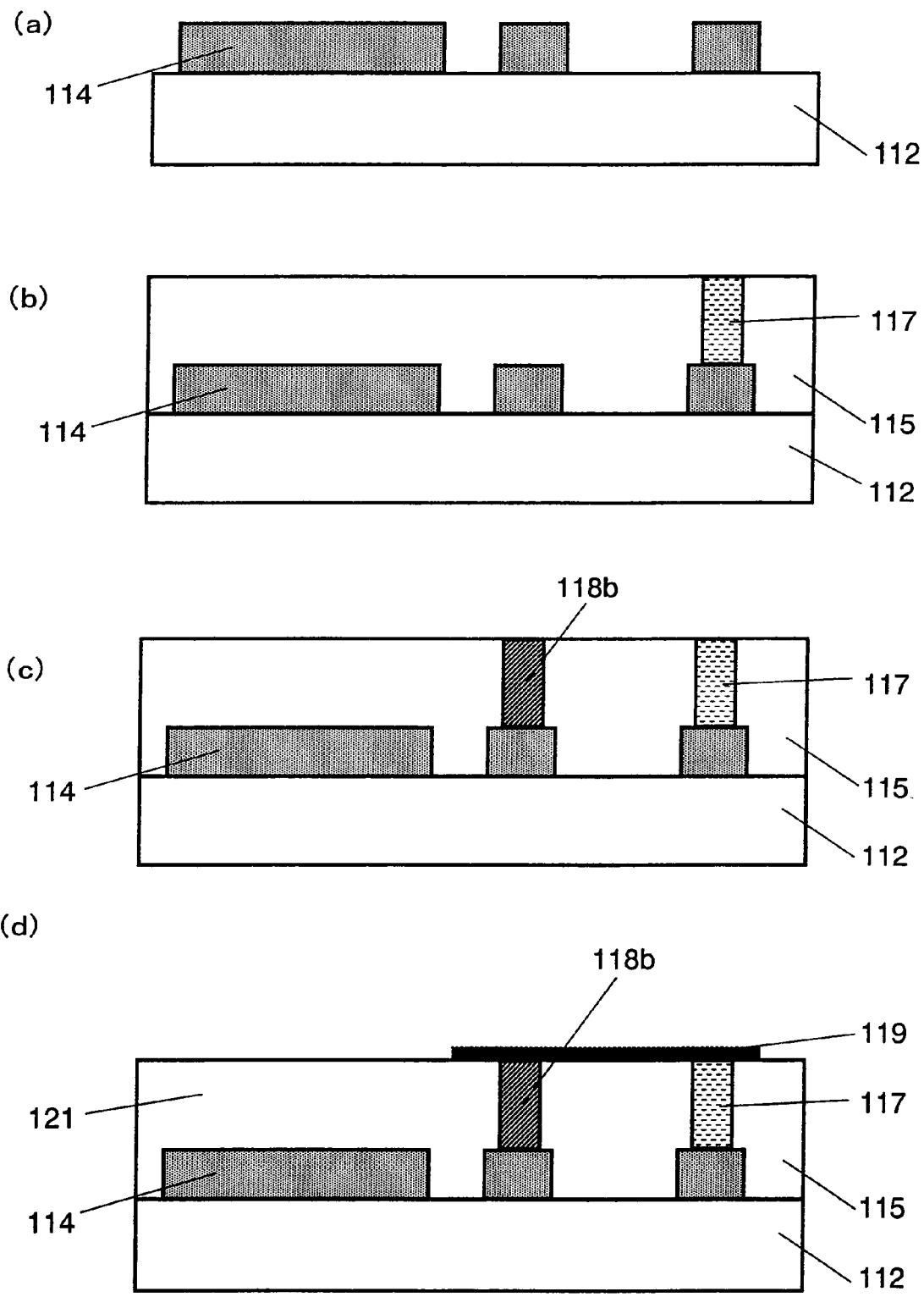
[FIG. 5]
Figure 6:
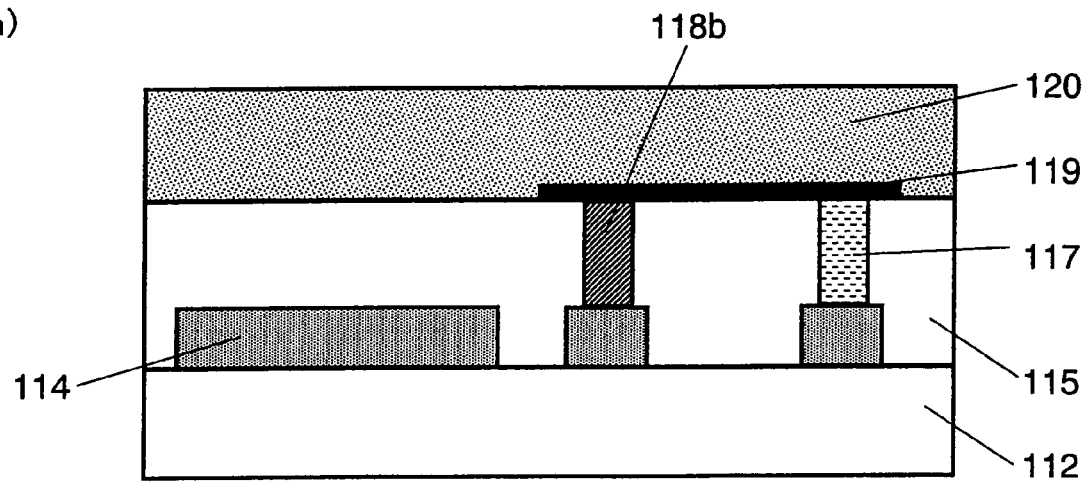
[FIG. 6]
Figure 6:
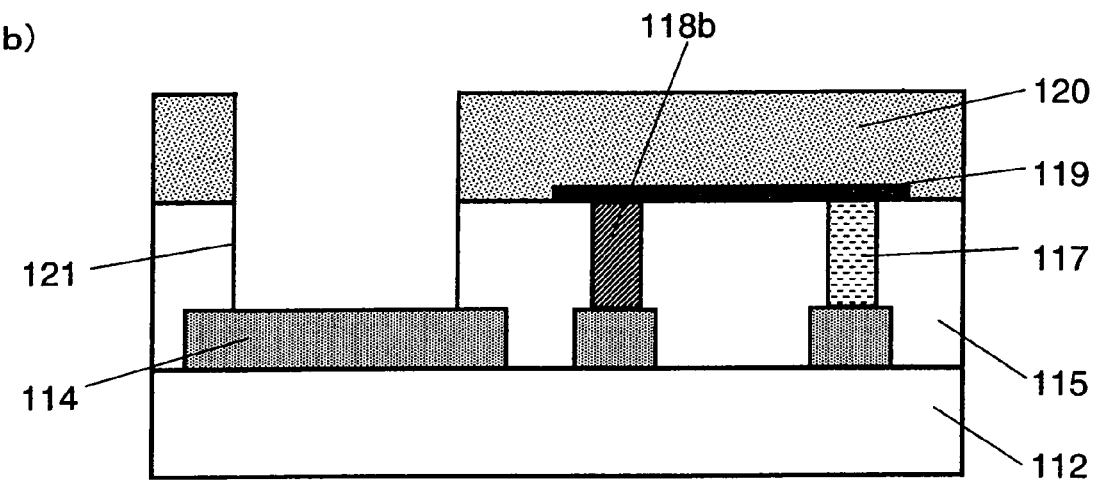

As shown in FIGS. 5 and 6, the manufacturing method of Embodiment 2 includes a step for forming the uppermost wire 114, a step for forming the (n+1)-th contact 117, a step for forming the lower electrode 118b, a step for forming the resistance variable layer 119, a step for forming the passivation layer 120, and a step for forming the pad hole 121.

As shown in FIG. 5(a), in the step for forming the uppermost wire 114, the uppermost wire 114 are formed using a desired mask on the n-th interlayer insulating layer 112 covering the transistors and the lower wires. In this case, concurrently, pad metal for allowing signal transmission and reception between the semiconductor device 100 and the external device is formed.

Then, as shown in FIG. 5(b), in the step for forming the (n+1)-th contact 117, the (n+1)-th interlayer insulating layer 115 is formed over the entire surface to cover the uppermost wire 114, and then the (n+1)-th contact 117 is formed to penetrate the (n+1)-th interlayer insulating layer 115 and to be connected to the upper most wire 114. The contact 117 is filled with a filling material containing tungsten as a major component.

Then, as shown in FIG. 5(c), in the step of forming the lower electrode 118b, a hole is formed again to penetrate the (n+1)-th interlayer insulating layer 115 and be connected to the uppermost wire 114, and then is filled by platinum plating, thereby forming the lower electrode 118b. Although in this step, the hole into which the lower electrode 118b will be filled and the hole of the (n+1)-th contact 117 is formed using different masks, the same mask may be used when the same material is filled or a filling material is selectively grown for each hole. This has an advantage that the number masks can be reduced and the process cost can be reduced.

Then, as shown in FIG. 5(d), in the step of forming the resistance variable layer 119, the resistance variable layer 119 is formed by patterning using a desired mask on the (n+1)-th interlayer insulating layer 115 to cover the lower electrode 118b and the (n+1)-th contact 117. In contrast to the semiconductor device 100, the underlying portion has no unevenness, and therefore the resistance variable layer 119 may be formed by spin coating as well as sputtering or CVD. In the above configuration, the lower electrode 118b serve as the first terminals, while the (n+1)-th contact 117 serves as the second terminal.

Then, as shown in FIG. 6(a), in the step of forming the passivation layer 120, the passivation layer 120 is formed to directly cover the entire surface (especially, upper surface of the resistance variable element) of the resistance variable element, including the resistance variable layer 119.

Then, as shown in FIG. 6(b), in the step of forming the pad hole 121, the pad hole 121 for allowing transmission and reception of electric signals between the semiconductor device 200 and the external device is formed by patterning using a desired mask such that the pad hole 121 penetrates the passivation layer 120 and the (n+1)-th interlayer insulating layer 115 and is connected to the uppermost wire 114.

In such a method, since the resistance variable layer is formed at the upper side of the uppermost wire and the electric potential is led out from the underlying layers, it is possible to manufacture a semiconductor device including a resistance variable memory stably without being affected by the post-process steps. In addition, since the entire upper surface of the resistance variable element is covered with the highly moisture-resistant passivation layer, it is possible to manufacture the semiconductor device having a stable resistance changing characteristic and reliability without being affected by external environment.

(Embodiment 3)

Figure 7:
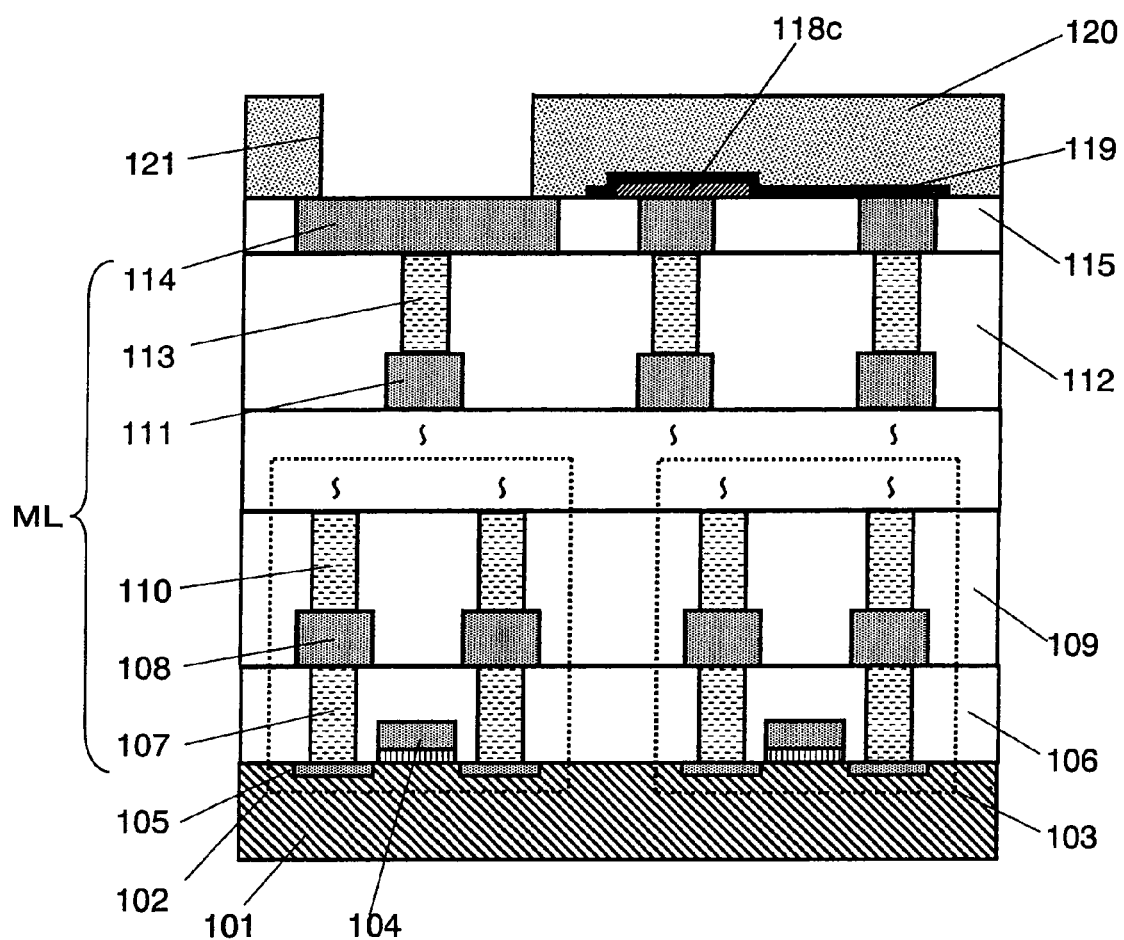
[FIG. 7]

FIG. 7 is a cross-sectional view showing an exemplary configuration of a semiconductor device 300 according to Embodiment 3 of the present invention.

As shown in FIG. 7, the semiconductor device 300 of Embodiment 3 has a configuration in which the (n+1)-th interlayer insulating layer 115 is formed between the uppermost wire 114, and the uppermost wire 114 and the (n+1)-th interlayer insulating layer 115 are substantially equal in height from the semiconductor substrate 101, and form a flat surface. The lower electrode 118c of the resistance variable element is formed to be connected to a part of the uppermost wire 114. The resistance variable layer 119 is formed on the (n+1)-th interlayer insulating layer 115 to cover the lower electrode 118c and a part of the uppermost wire. In this case, the lower electrode 118c serves as the first terminal, while the uppermost wire 114 which is at a different electric potential from the lower electrode 118c serves as the second terminal. Only the passivation layer 120 is formed to directly cover the entire surface (especially, upper surface of the resistance variable element) including the resistance variable element. The pad hole 121 for allowing transmission and reception of electric signals between the semiconductor device 300 and the external device is formed such that the pad hole 121 penetrates the passivation layer 120 and is connected to the uppermost wire 114. The uppermost wire 114 and the underlying constituents are identical in structure to those of the semiconductor device 100, and will not be described repetitively.

In such a configuration, since the resistance variable layer is formed at the upper side of the uppermost wire and the electric potential is led out from the underlying layers, it is possible to implement a semiconductor device including a resistance variable memory stably without being affected by the post-process steps. In addition, since the upper surfaces of the resistance variable element is entirely covered with the highly moisture-resistant passivation layer, the resistance variable element has a stable resistance changing characteristic and reliability without being affected by external environment.

Furthermore, the semiconductor device 300 has an advantage over the semiconductor device 100 in that the number of masks is less by one than the number of masks for the semiconductor device 100, and the resistance variable elements can be incorporated into the existing LSI by adding two masks at least, which results in a reduced process cost.

FIGS. 8(a) to 8(e) are cross-sectional views showing the manufacturing method of the major constituents which are the uppermost wire 114 and the following constituents of the semiconductor device 300 of Embodiment 3. The steps for forming the transistors and the lower wires are omitted. The manufacturing method of the major constituents of the semiconductor device 300 of Embodiment 3 will be described with reference to the drawings.

Figure 8:
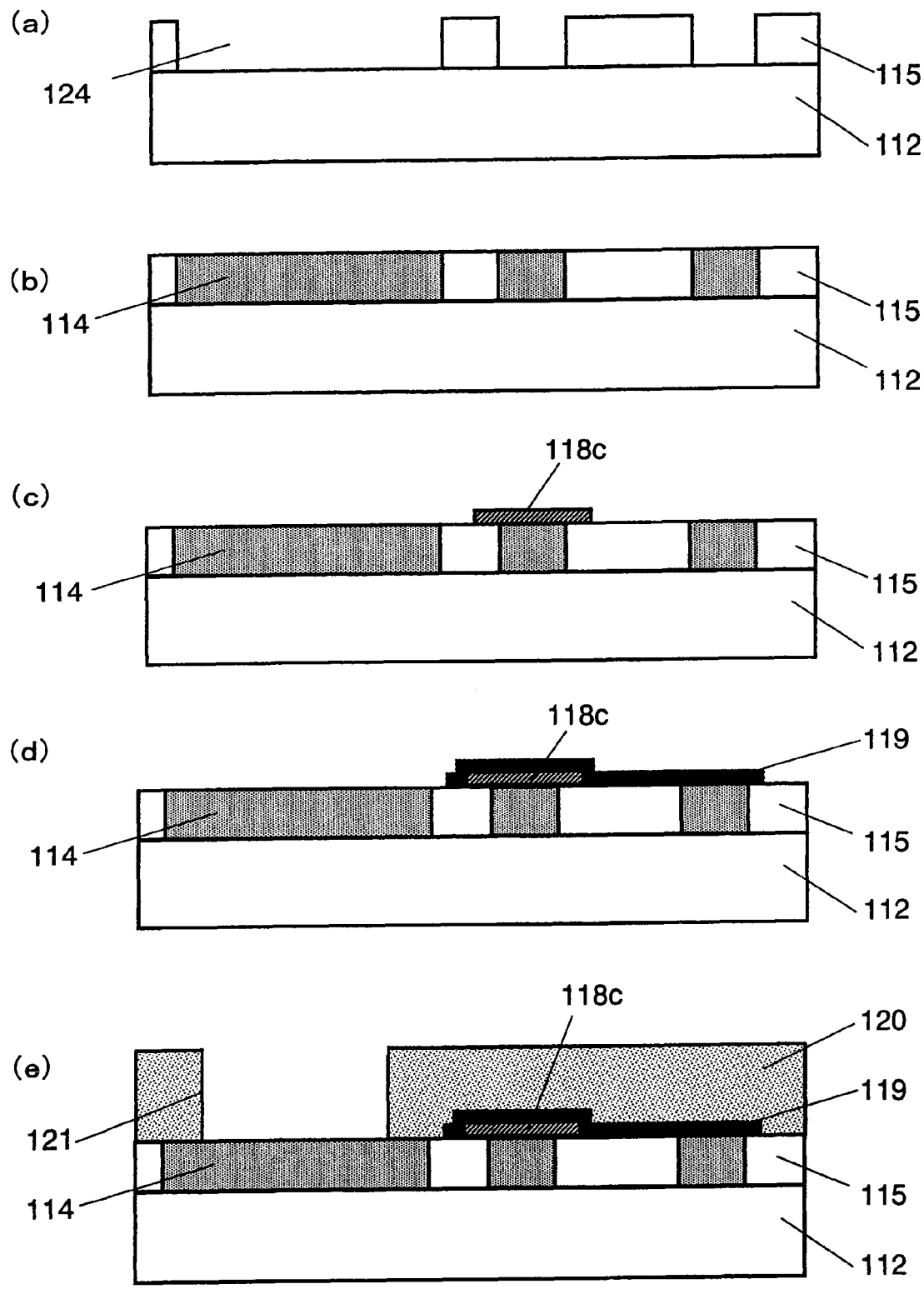
[FIG. 8]

As shown in FIG. 8, the manufacturing method of Embodiment 3 includes a step for forming a wire trench 124 into which the uppermost wire 114 will be formed, a step for forming the uppermost wire 114, a step for forming the lower electrode 118c, a step of forming the resistance variable layer 119, and a step for forming the passivation layer 120 and the pad hole 121.

As shown in FIG. 8(a), in the step of forming the wire trench 124 into which the uppermost wire 114 will be formed, the wire trench 124 into which the uppermost wire 114 will be formed is formed using a desired mask in the (n+1)-th interlayer insulating layer 115 formed on the n-th interlayer insulating layer 112 covering the transistors and the lower wires.

Then, as shown in FIG. 8(b), in the step of forming the uppermost wire 114, a conductive material is filled into the wire trench, thereby forming the uppermost wire 114. In this case, concurrently, pad metal for allowing signal transmission and reception between the semiconductor device 300 and the external device is formed. In this embodiment, a damascene process is conducted using tantalum for the barrier layer and copper for the wires as a major component.

Then, as shown in FIG. 8(c), in the step of forming the lower electrodes 118a, the lower electrode 118c of the resistance variable element is formed by patterning using a desired mask on the (n+1)-th interlayer insulating layer 115 such that the lower electrode 118c are connected to a part of the uppermost wire 114. In this case, the upper layer of the lower electrode 118a comprises platinum and the lower layer of the upper electrode 118a comprises titanium nitride. This is because platinum provides a stable resistance changing characteristic and titanium nitride improves adhesiveness to the interlayer insulating layer.

Then, as shown in FIG. 8(d), in the step of forming the resistance variable layer 119, the resistance variable layer 119 is formed by patterning using a desired mask on the (n+1)-th interlayer insulating layer 115 to cover the lower electrode 118c and a part of the uppermost wire 114 which are at a different electric potential from the lower electrode 118c. In the above configuration, the lower electrode 118c serves as the first terminal, while the uppermost wire 114 which is at a different electric potential from the lower electrode 118c serves as the second terminal.

Then, as shown in FIG. 8(a), in the step of forming the passivation layer 120 and the pad hole 121, the passivation layer 120 is formed to directly cover the entire surface (especially, upper surface of the resistance variable element) of the resistance variable element including the resistance variable layer 119, and then the pad hole 121 for allowing transmission and reception of electric signals between the semiconductor device 300 and the external device is formed such that the pad hole 121 penetrates the passivation layer 120 and is connected to the uppermost wire 114.

In such a method, since the resistance variable layers are formed at the upper side of the uppermost wire and the electric potential is led out from the underlying layers, it is possible to manufacture a semiconductor device including a resistance variable memory stably without being affected by the post-process steps such as the wiring step. In addition, since the entire upper surface of the resistance variable element is covered with the highly moisture-resistant passivation layer, it is possible to manufacture a semiconductor device having a stable resistance changing characteristic and reliability without being affected by external environment.

(Embodiment 4)

Figure 9:
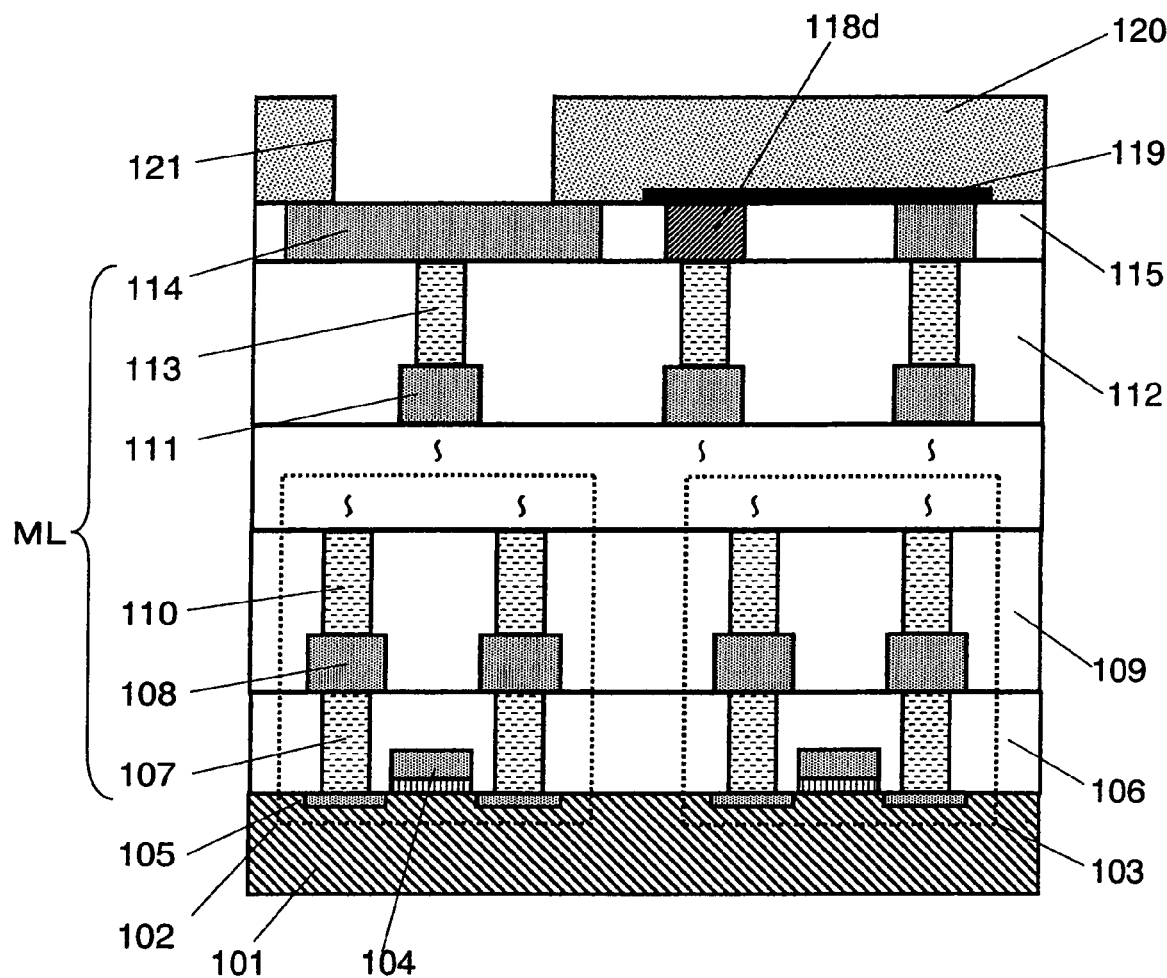
[FIG. 9]

FIG. 9 is a cross-sectional view showing an exemplary configuration of a semiconductor device 400 according to Embodiment 4 of the present invention.

As shown in FIG. 9, the semiconductor device 400 of Embodiment 4 has a configuration in which the (n+1)-th interlayer insulating layer 115 is formed between the uppermost wire 114, and the uppermost wire 114 and the (n+1)-th interlayer insulating layer 115 are substantially equal in height from the semiconductor substrate 101, and form a flat surface. Further, the lower electrode 118d of the resistance variable element is filled into the wire trench. The resistance variable layer 119 is formed on the (n+1)-th interlayer insulating layer 115 to cover the lower electrode 118d and a part of the uppermost wire. The lower electrode 118d serves as the first terminal, while the uppermost wire 114 which is at a different electric potential from the lower electrode 118d serves as the second terminal. Only the passivation layer 120 is formed to directly cover the entire surface (especially, upper surface of the resistance variable element) including the resistance variable element. The pad hole 121 for allowing transmission and reception of electric signals between the semiconductor device 400 and the external device is formed such that the pad hole 121 penetrates the passivation layer 120 and is connected to the uppermost wire 114. The uppermost wire 114 and the underlying constituents are similar in structure to those of the semiconductor device 100, and will not be described repetitively.

In such a configuration, since the resistance variable layer is formed at the upper side of the uppermost wire and the electric potential is led out from the underlying layers, it is possible to implement a semiconductor device including a resistance variable memory stably without being affected by the post-process steps such as the wiring step. In addition, since the entire upper surface of the resistance variable element is covered with the highly moisture-resistant passivation layer, the resistance variable element has a stable resistance changing characteristic and reliability without being affected by external environment.

The semiconductor device 400 has an advantage over the semiconductor device 100 in that the number of masks is less by one than the number of masks for the semiconductor device 100, and the resistance variable element can be incorporated into the existing LSI by adding two masks at least, which results in a reduced process cost. Furthermore, the semiconductor device 400 has an advantage over the semiconductor device 100 in that the resistance variable layer is allowed to have flat surfaces without unevenness, a thickness with a less variation, and a stable resistance changing characteristic.

FIGS. 10(a) to 10(e) are cross-sectional views showing the manufacturing method of the major constituents which are the uppermost wire 114 and the following constituents of the semiconductor device 400 of Embodiment 4. The steps for forming the transistors and the lower wires are omitted. The manufacturing method of the major constituents of the semiconductor device 400 of Embodiment 4 will be described with reference to these Figures.

Figure 10:
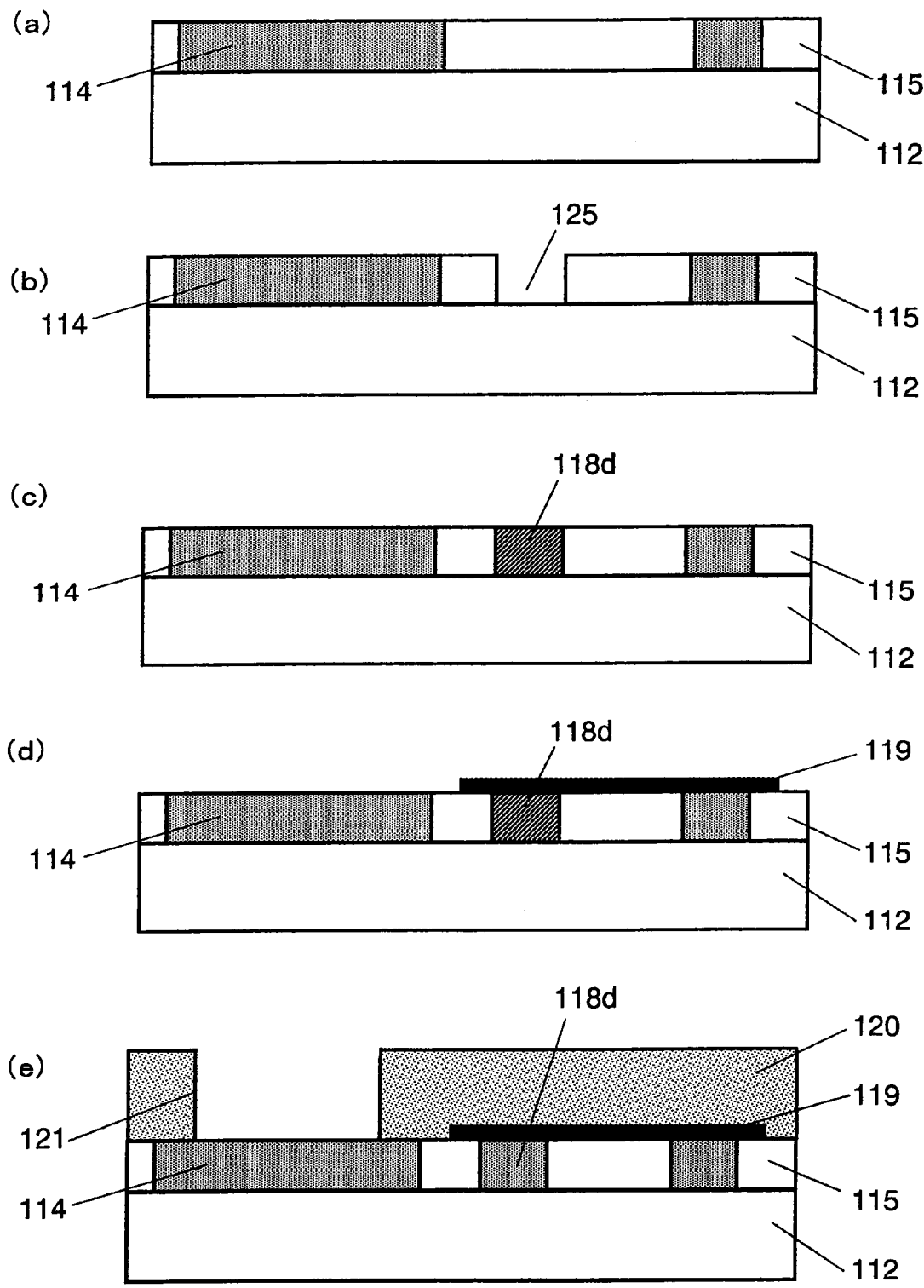
[FIG. 10]

As shown in FIG. 10, the manufacturing method of Embodiment 4 includes a step for forming the uppermost wire 114, a step for forming a wire trench 125 into which the lower electrode 118d will be formed, a step for forming the lower electrode 118d, a step for forming the resistance variable layer 119, and a step for forming the passivation layer 120 and the pad hole 121. The step of forming the wire trench 124 into which the uppermost wire 114 will be formed have been described above with reference to FIG. 8(a) and will not be described repetitively.

As shown in FIG. 10(a), in the step of forming the uppermost wire 114, a conductive material is filled into the wire trench, thereby forming the uppermost wire 114. In this case, concurrently, pad metal for allowing signal transmission and reception between the semiconductor device 400 and the external device is formed. In this embodiment, a damascene process is conducted using tantalum for the barrier layer and copper for the wires as a major component.

Then, as shown in FIG. 10(b), in the step of forming the wire trench 125 into which the lower electrode 118d will be formed, the wire trench 125 into which the lower electrode 118d will be formed, are formed using a desired mask in the (n+1)-th interlayer insulating layer 115 embedded with the uppermost wire 114.

Then, as shown in FIG. 10(c), in the step of forming the lower electrode 118d, the conductive material is filled into the wire trench to form the lower electrode 118d. In this case, a damascene process is conducted using tantalum for the barrier layer and platinum for the wires as a major component. Although in this step, the holes of the wire trench 125 into which the lower electrode 118d will be filled and the holes of the wire trench 124 into which the uppermost wire 114 will be filled are formed using different masks, the same mask may be used when the same material is filled or a filling material is selectively grown for each hole. This has an advantage that the number of masks can be reduced and the process cost can be reduced.

Then, as shown in FIG. 10(d), in the step of forming the resistance variable layer 119, the resistance variable layer 119 is formed by patterning using a desired mask on the (n+1)-th interlayer insulating layer 115 to cover the lower electrode 118d and a part of the uppermost wire 114 which are at a different potential from the lower electrode 118d. In the above configuration, the lower electrode 118d serves as the first terminal, while the uppermost wire 114 which is at a different electric potential from the lower electrode 118d serves as the second terminal.

Then, as shown in FIG. 10(e), in the step of forming the passivation layer 120 and the pad hole 121, the passivation layer 120 is formed to directly cover the entire surface (especially, upper surface of the resistance variable element) of the resistance variable element including the resistance variable layer 119, and then the pad hole 121 for allowing transmission and reception of electric signals between the semiconductor device 400 and the external device is formed by patterning using a desired mask such that the pad hole 121 penetrates the passivation layer 120 and is connected to the uppermost wire 114.

In such a method, since the resistance variable layer is formed at the upper side of the uppermost wire and the electric potential is led out from the underlying layers, it is possible to manufacture a semiconductor device including a resistance variable memory stably without being affected by the post-process steps such as the wiring step. In addition, since the entire upper surface of the resistance variable element is covered with the highly moisture-resistant passivation layer, it is possible to manufacture the semiconductor device having a stable resistance changing characteristic and reliability without being affected by external environment.
(Embodiment 5)

Figure 11:
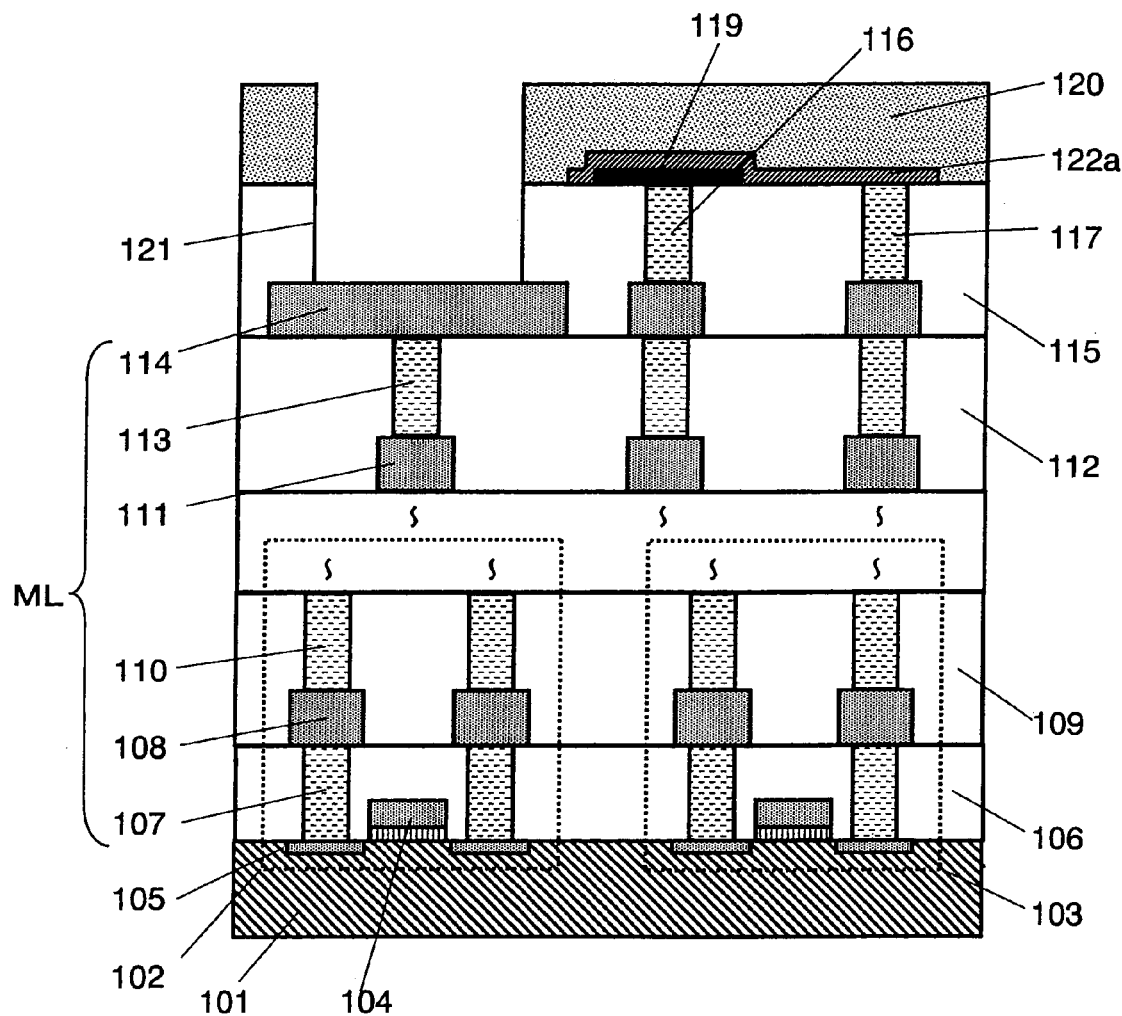
[FIG. 11]

FIG. 11 is a cross-sectional view showing an exemplary configuration of a semiconductor device 500 according to Embodiment 5 of the present invention.

As shown in FIG. 11, in the semiconductor device 500 of Embodiment 5, the (n+1)-th interlayer insulating layer 115 is formed on the uppermost wire 114, and the (n+1)-th contacts 116 and 117 are formed to penetrate the (n+1)-th interlayer insulating layer 115 and to be connected to the uppermost wire 114.

The resistance variable layer 119 of the resistance variable element is formed on the (n+1)-th interlayer insulating layer 115 to cover the (n+1)-th contact 116. Further, an upper electrode 122a is formed on the (n+1)-th interlayer insulating layer 115 to cover the resistance variable layer 119 and the (n+1)-th contact 117. In this case, the (n+1)-th contact 116 serves as the first terminal, while the upper electrode 122a and the (n+1)-th contact 117 serve as the second terminals.

Only the passivation layer 120 is formed to directly cover the entire surface (especially, upper surface of the resistance variable element) including the resistance variable element. The pad hole 121 for allowing transmission and reception of electric signals between the semiconductor device 400 and the external device penetrates the passivation layer 120 and the (n+1)-th interlayer insulating layer 115 and is connected to the uppermost wire 114.

The uppermost wire 114 and the underlying constituents are identical in structure to those of the semiconductor device 100 and will not be described repetitively.

In such a configuration, since the resistance variable layers are formed at the upper side of the uppermost wires and potential is led out from underlying layers, it is possible to implement a semiconductor device incorporating a resistance variable memory stably without being affected by the post-process steps such as the wiring step. In addition, since the entire upper surfaces of the resistance variable element is covered with the highly moisture-resistant passivation layer, the resistance variable element is not affected by the external environment and has a stable resistance changing characteristic and reliability.

In this embodiment, the (n+1)-th contacts 116 and 117 comprise tungsten as a major component, the upper electrode 122a comprises platinum, and the resistance variable layer 119 comprises tantalum oxide.

Therefore, the first terminal comprises tungsten, a portions of the second terminal which contacts the resistance variable layer 119 comprises platinum. Thus, these terminals comprises different materials. In such a configuration, resistance change is allowed to occur at platinum side (upper electrode side) where the standard electrode potential of redox is relatively high.

The resistance variable layer 119 comprises oxide of transition metal (in this embodiment tantalum) and includes at least two layers which are different in oxygen concentration. To be specific, the upper layer (portion corresponding to the upper surface and side surfaces of the resistance variable layer 119 which contacts the upper electrode 122a) is formed by a transition metal oxide layer with high oxygen concentration. This can dispense with a step (forming step) for allowing oxygen to concentrate at one of the first and second terminals by applying a voltage after the end of diffusion of oxygen. The resistance variable layer 119 is operable in a forming-less method, without a need for a high forming voltage, and at low-voltages.

FIGS. 12(a) to 12(d) and FIGS. 13(a) and 13(b) are cross-sectional views showing the manufacturing method of the major constituents which are the uppermost wire 114 and the following constituents of the semiconductor device 500 of Embodiment 5. The steps for forming the transistors and the lower wires are omitted. The manufacturing method of the major constituents of the semiconductor device 500 of Embodiment 5 will be described with reference to these Figures.

Figure 12:
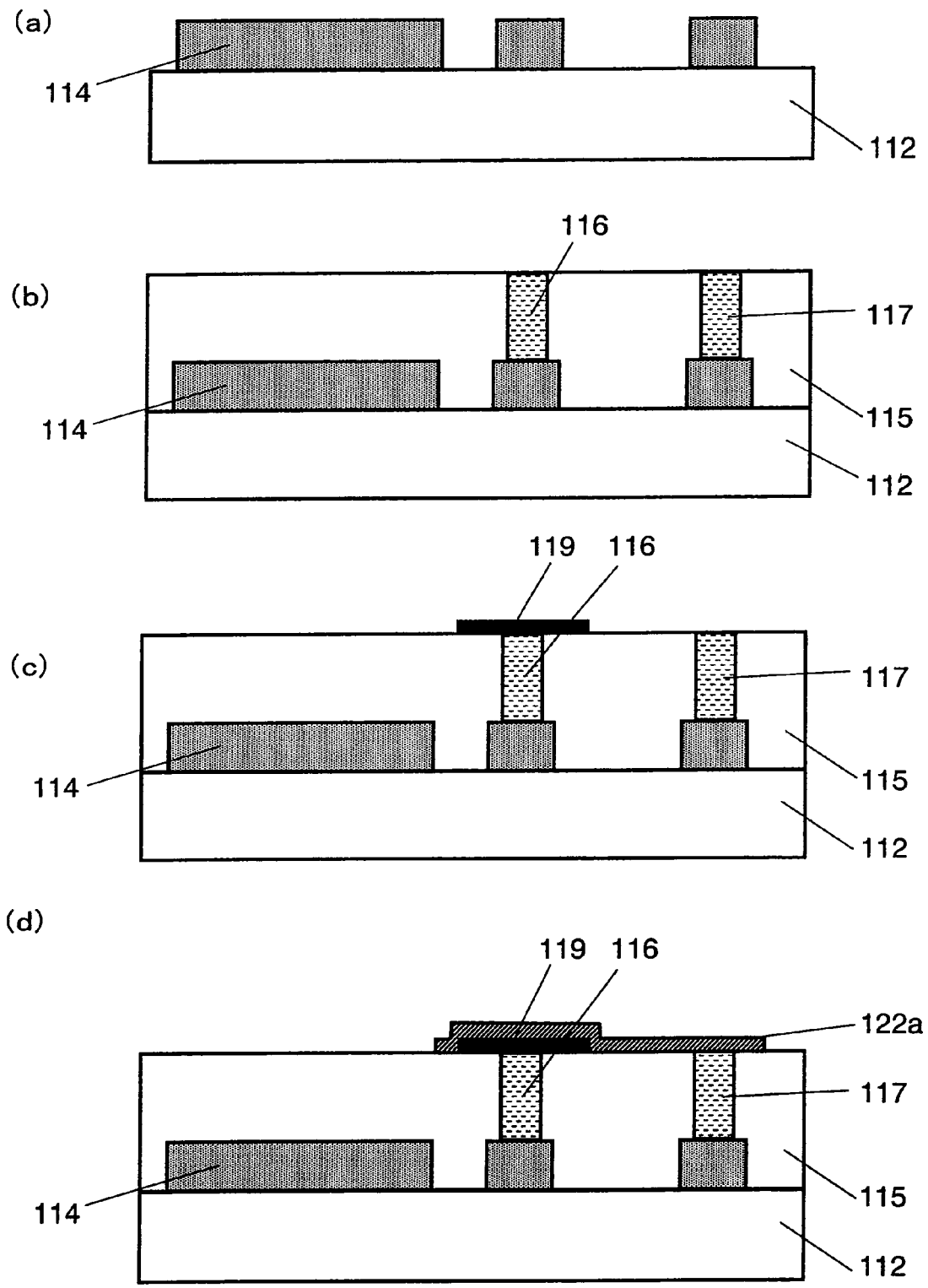
[FIG. 12]
Figure 13:
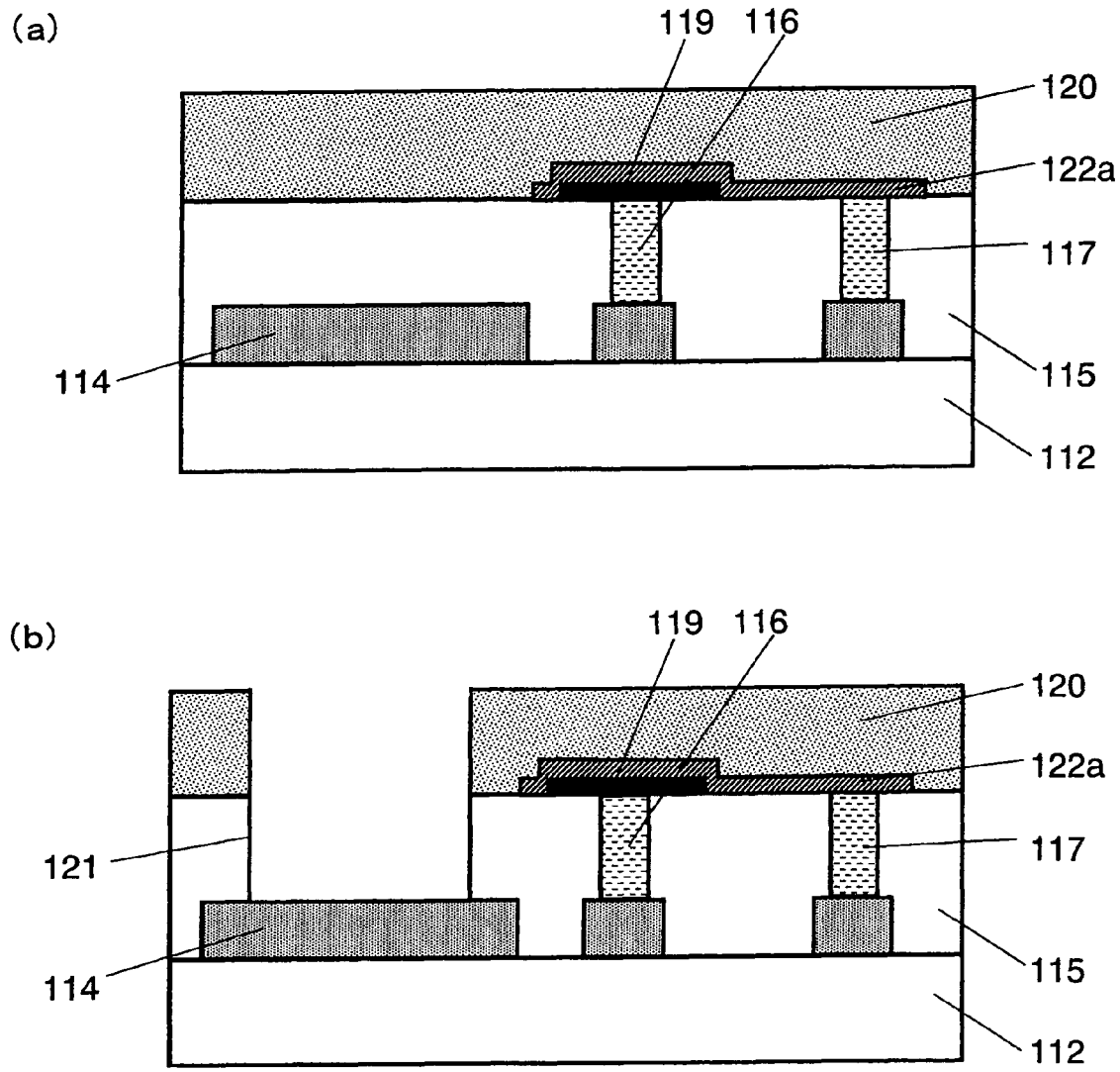
[FIG. 13]

As shown in FIGS. 12 and 13, the manufacturing method of Embodiment 5 includes a step for forming the uppermost wire 114, a step for forming the (n+1)-th contacts 116 and 117, a step for forming the resistance variable layer 119, a step for forming the upper electrode 122a, a step for forming the passivation layer 120, and a step for forming the pad hole 121.

As shown in FIG. 12(a), in the step for forming the uppermost wire 114, the uppermost wire 114 is formed using a desired mask on the n-th interlayer insulating layer 112 covering the transistors and the lower wires. In this case, concurrently, pad metal for allowing signal transmission and reception between the semiconductor device 500 the external device is formed.

Then, as shown in FIG. 12(b), in the step for forming (n+1)-th contacts 116 and 117, the (n+1)-th interlayer insulating layer 115 is formed over the entire surface to cover the uppermost wire 114, and then the (n+1)-th contacts 116 and 117 are formed to penetrate the (n+1)-th interlayer insulating layer 115 and to be connected to the upper most wire 114. The contact is filled with a filling material containing tungsten as a major component.

Then, as shown in FIG. 12(c), in the step of forming the resistance variable layer 119 of the resistance variable element, the resistance variable layer 119 is formed by patterning using a desired mask on the (n+1)-th interlayer insulating layer 115 so as to cover the (n+1)-th contact 116. In this case, the resistance variable layer 119 comprises tantalum oxide, in order to provide a reversible and stable rewrite characteristic and a good resistance value retention characteristic as well as high-speed operability and to implement a manufacturing process which is highly compatible with a standard Si semiconductor process.

Then, as shown in FIG. 12(d), in the step for forming the upper electrode 122a, the upper electrode 122a are formed by patterning using a desired mask on the (n+1)-th interlayer insulating layer 115 to cover the resistance variable layer 119 and the (n+1)-th contact 117. In this case, the lower layer of the upper electrode 122a comprises platinum and the upper layer of the upper electrode 122a comprises titanium nitride. This is because platinum provides a stable resistance changing characteristic and titanium nitride improves adhesiveness to the interlayer insulating layer. In the above configuration, the (n+1)-th contact 116 serves as the first terminal, while the upper electrode 122a and the (n+1)-th contact 117 serve as the second terminal.

Then, as shown in FIG. 13(a), in the step of forming the passivation layer 120, the passivation layer 120 is formed to directly cover the entire surface (especially, upper surface of the resistance variable element) of the resistance variable element including the upper electrode 122a.

Then, as shown in FIG. 13(b), in the step of forming the pad hole 121, the pad hole 121 for allowing transmission and reception of electric signals between the semiconductor device 500 and the external device is formed by patterning using a desired mask such that the pad hole 121 penetrates the passivation layer 120 and the (n+1)-th interlayer insulating layer 115 and is connected to the uppermost wire 114.

In such a method, since the resistance variable layer is formed at the upper side of the uppermost wire and the electric potential is led out from the underlying layers, it is possible to manufacture a semiconductor device including a resistance variable memory stably without being affected by the post-process steps such as the wiring step. In addition, since the entire upper surface of the resistance variable element is covered with the highly moisture-resistant passivation layer, it is possible to manufacture the semiconductor device having a stable resistance changing characteristic and reliability without being affected by external environment.

(Embodiment 6)

Figure 14:
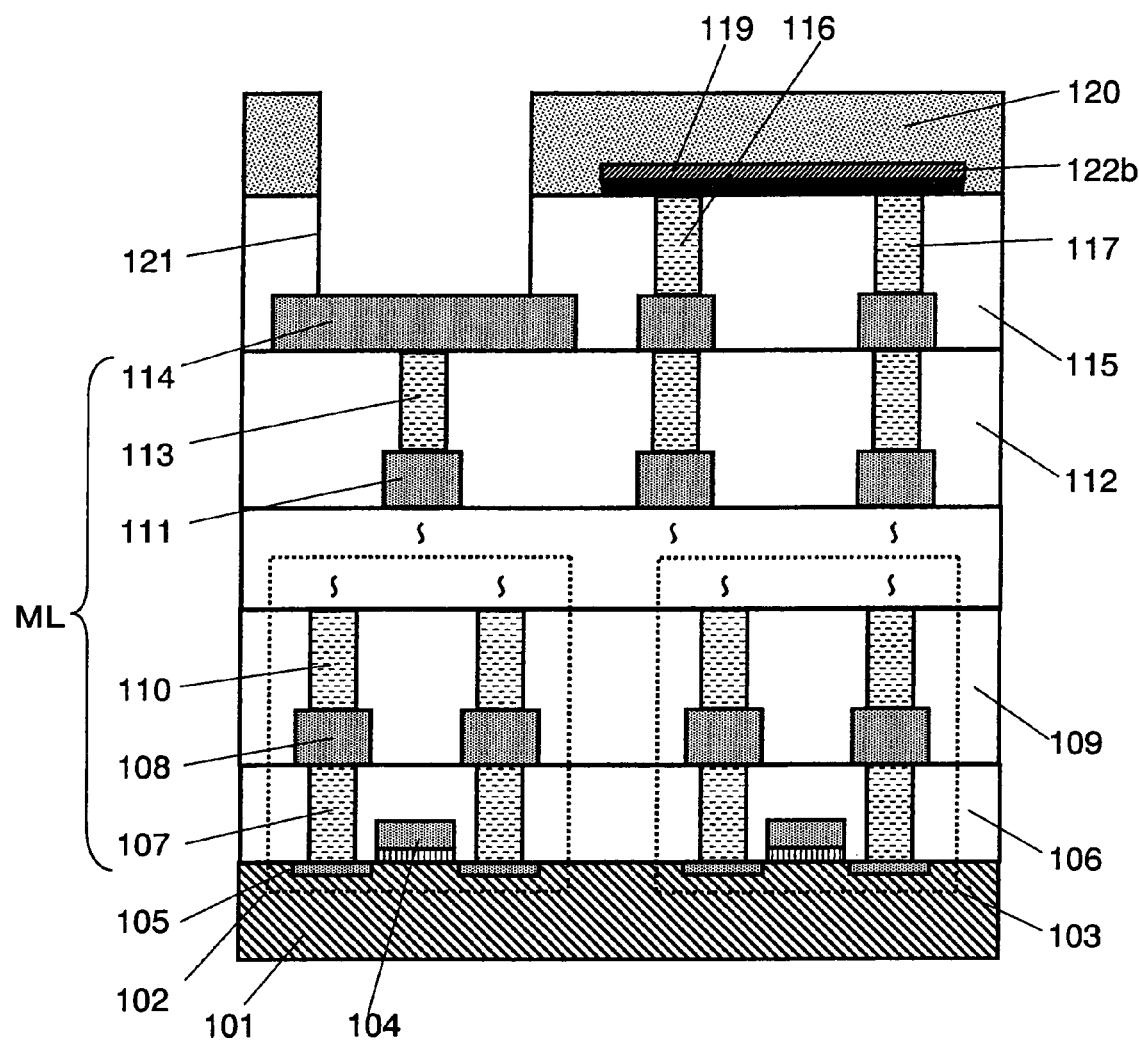
[FIG. 14]

FIG. 14 is a cross-sectional view showing an exemplary configuration of a semiconductor device 600 according to Embodiment 6 of the present invention.

As shown in FIG. 14, in the semiconductor device 600 of Embodiment 6, the (n+1)-th interlayer insulating layer 115 is formed on uppermost wire 114. The (n+1)-th contacts 116 and 117 that penetrate the (n+1)-th interlayer insulating layer 115 and are connected to the uppermost wire 114 are formed.

The resistance variable layer 119 of the resistance variable element is formed on the (n+1)-th interlayer insulating layer 115 to cover the (n+1)-th contacts 116 and 117. The upper electrode 122b is formed to cover the resistance variable layer 119. The (n+1)-th contact 116 and the upper electrode 122b serve as the first terminal, while the (n+1)-th contact 117 serves as the second terminal.

Only the passivation layer 120 is formed to directly cover the entire surface (especially upper surface of the resistance variable element) including the resistance variable element. Furthermore, the pad hole 121 for allowing transmission and reception of electric signals between the device 600 and the external device is formed to penetrate the passivation layer 120 and the (n+1)-th interlayer insulating layer 115 and be connected to the uppermost wire 114.

The uppermost wire 114 and the underlying constituents are identical in structure to those of the semiconductor device 100 and will not be described repetitively.

In such a configuration, since the resistance variable layer is formed at the upper side of the uppermost wire and electric potential is led out from underlying layers, it is possible to implement a semiconductor device incorporating a resistance variable memory stably without being affected by the post-process steps such as the wiring step. In addition, since the entire upper surface of the resistance variable element is covered with the highly moisture-resistant passivation layer, the resistance variable element is not affected by the external environment and has a stable resistance changing characteristic and reliability.

In this embodiment, the (n+1)-th contacts 116 and 117 are made of a filling material containing tungsten as a major component, the upper electrode 122b comprises platinum, and the resistance variable layer 119 comprises tantalum oxide.

Thus, a portion of the first terminal which contacts the resistance variable layer 119 comprises tungsten and platinum, and the second terminal comprises the material (to be specific tungsten) different from platinum which is the material of the first terminal. Thus, resistance change is allowed to occur at platinum side (upper electrode side) where the standard electrode potential of redox is relatively higher.

The resistance variable layer 119 comprises oxide of transition metal (in this embodiment, tantalum) and comprises at least two layers which are different in oxygen concentration. To be specific, the upper layer (a portion corresponding to upper surface of each of the resistance variable layer 119 which contacts the upper electrode 122b) is formed by a transition metal oxide layer with higher oxygen concentration. This can dispense with a step (forming step) for allowing oxygen to concentrate at one of the first and second terminals by applying a voltage after the end of diffusion of oxygen. The resistance variable element is operable in a forming-less method, without a need for a high forming voltage, and at low voltages.

In a reversed material relationship of this embodiment, the (n+1)-th contacts 116 and 117 may comprise a filling material containing platinum as a major component, the upper electrode 122b may comprise tungsten, and the resistance variable layer 119 may comprise tantalum oxide.

In such a configuration, resistance change is allowed to occur at platinum side (first terminal side or second terminal side) where the standard electrode potential of redox is relatively higher. The upper electrode 122b assists in reducing resistance of wire connecting the first terminal to the second terminal.

In this case, the lower layer (portion corresponding to bottom surface of the resistance variable layer 119 which contacts the (n+1)-th contact 116 and 117) of the resistance variable layer 119 is formed by a transition metal oxide layer with higher oxygen concentration.

FIGS. 15(a) to 15(d) are cross-sectional views showing the manufacturing method of the major constituents which are the uppermost wire 114 and the following constituents of the semiconductor device 600 of Embodiment 6. The steps for forming the transistors and the lower wires are omitted. The manufacturing method of the major constituents of the semiconductor device 600 of Embodiment 6 will be described with reference to these Figures.

Figure 15:
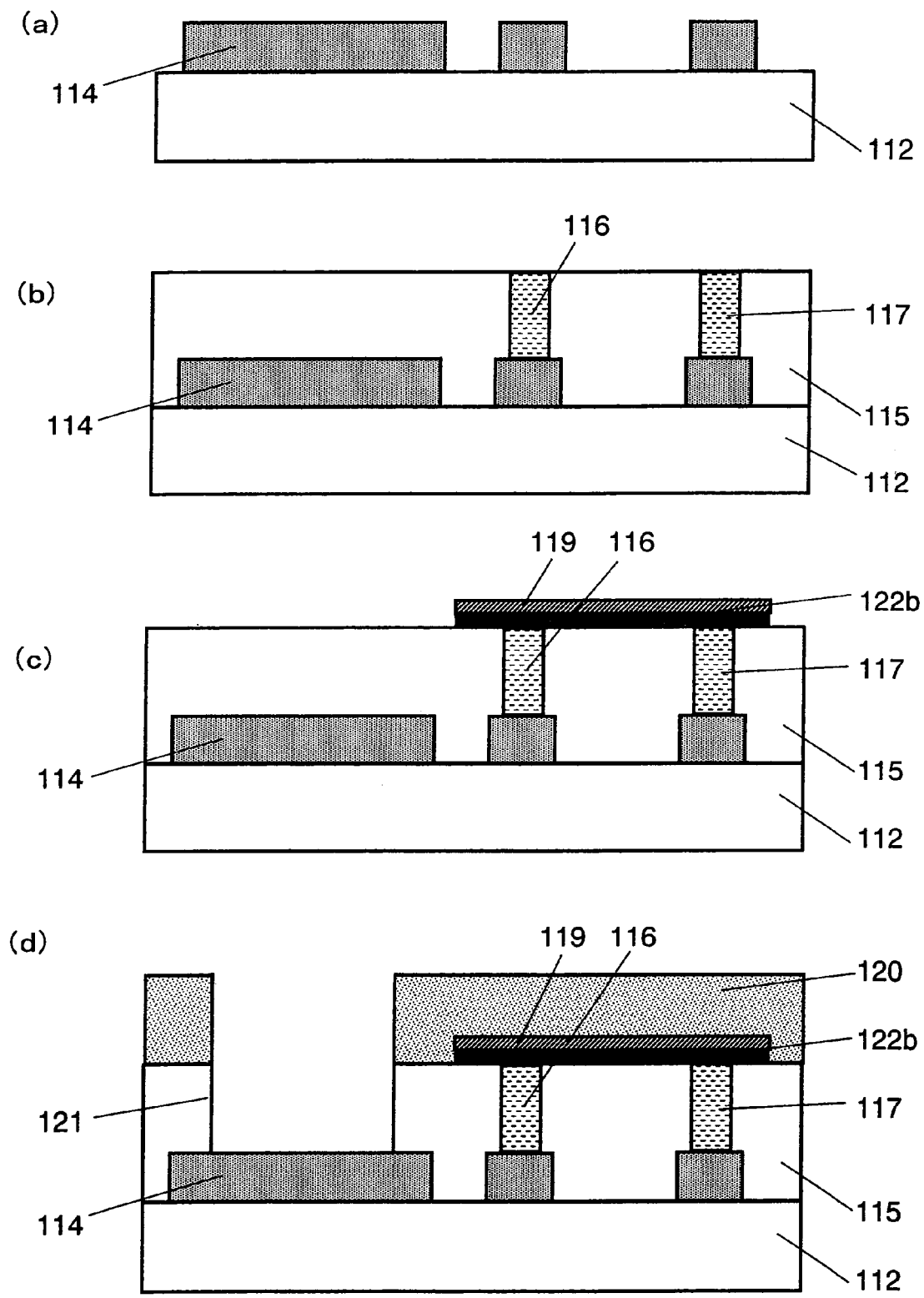
[FIG. 15]

As shown in FIG. 15, the manufacturing method of Embodiment 6 includes a step for forming the uppermost wire 114, a step for forming (n+1)-th contacts 116 and 117, a step for forming the resistance variable layer 119 and the upper electrode 122b, and a step for forming the passivation layer 120 and the pad hole 121.

As shown in FIG. 15(a), in the step for forming the uppermost wire 114, the uppermost wire 114 is formed using a desired mask on the n-th interlayer insulating layer 112 covering the transistors and the lower wires. In this case, concurrently, pad metal for allowing signal transmission and reception between the semiconductor device 600 and the external device is formed.

Then, as shown in FIG. 15(b), in the step for forming (n+1)-th contacts 116 and 117, the (n+1)-th interlayer insulating layer 115 is formed over the entire surface to cover the uppermost wire 114, and then the (n+1)-th contacts 116 and 117 are formed to penetrate the (n+1)-th interlayer insulating layer 115 and to be connected to the uppermost wire 114. The contacts are filled with a filling material containing platinum as a major component.

Then, as shown in FIG. 15(c), in the step of forming the resistance variable layer 119 and the upper electrode 122b of the resistance variable element, the resistance variable layer 119 and the upper electrode 122b of the resistance variable element is formed by patterning using a desired mask on the (n+1)-th interlayer insulating layer 115 to cover the (n+1)-th contacts 116 and 117. In this case, the resistance variable layer 119 comprises tantalum oxide and the upper electrode 122b comprises tungsten, in order to provide a reversible and stable rewrite characteristic and a good resistance value retention characteristic as well as high-speed operability and to implement a manufacturing process which is highly compatible with a standard Si semiconductor process. In the above configuration, the (n+1)-th contact 116 serves as the first terminal, while the (n+1)-th contact 117 serves as the second terminal.

Then, as shown in FIG. 15(d), in the step of forming the passivation layer 120 and the pad hole 121, the passivation layer 120 is formed to directly cover the entire surface (especially, upper surface of the resistance variable element) including the resistance variable element, and then the pad hole 121 for allowing transmission and reception of electric signals between the semiconductor device 600 and the external device is formed by patterning using a desired mask such that the pad hole 121 penetrates the passivation layer 120 and is connected to the uppermost wire 114.

In such a method, since the resistance variable layer is formed at the upper side of the uppermost wire and electric potential is led out from underlying layers, it is possible to manufacture a semiconductor device incorporating a resistance variable memory stably without being affected by the post-process steps such as the wiring step. In addition, since the entire upper surface of the resistance variable element is covered with the highly moisture-resistant passivation layer, it is possible to manufacture the semiconductor device having a stable resistance changing characteristic and reliability without being affected by the external environment.

(Embodiment 7)

Figure 16:
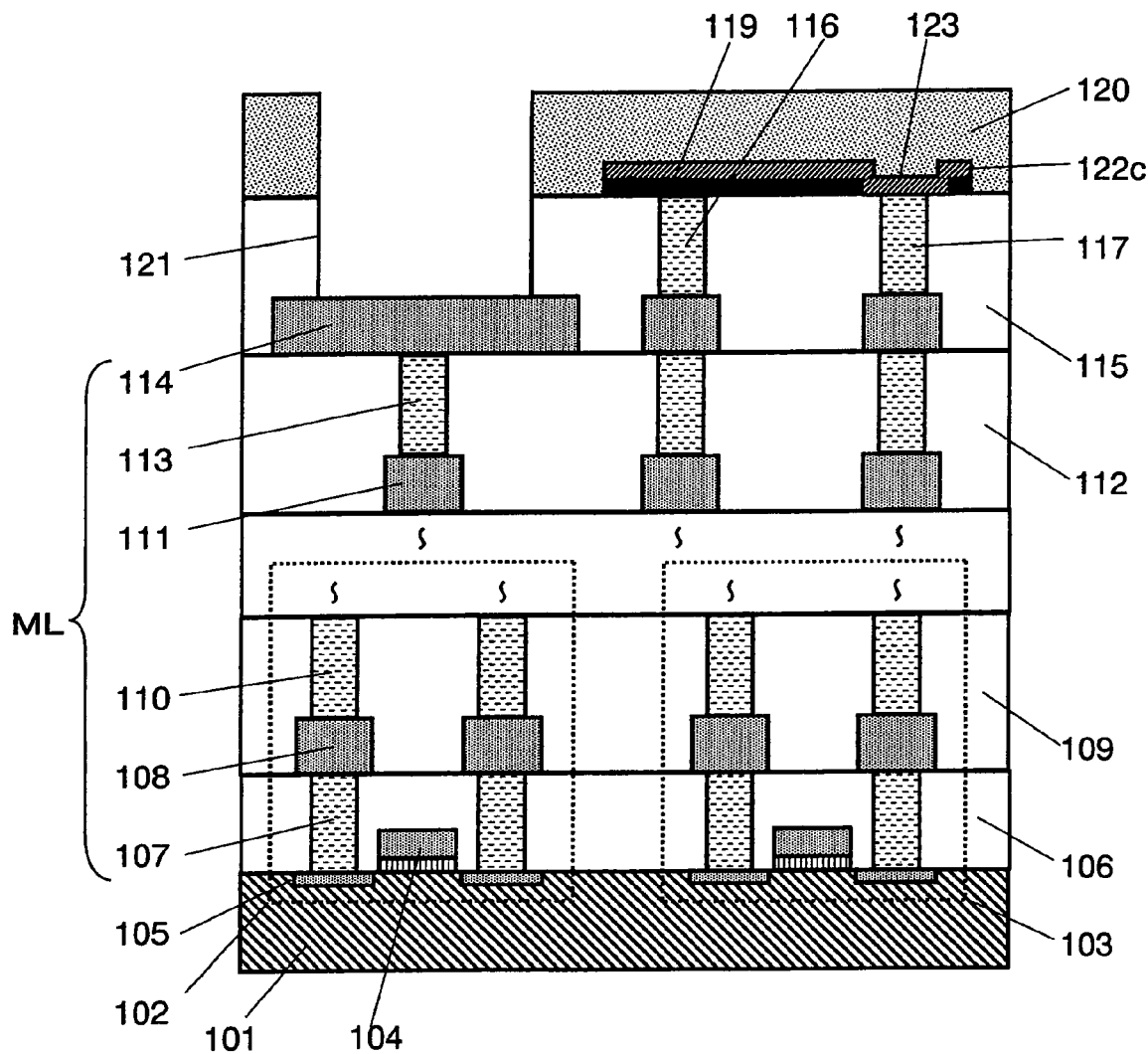
[FIG. 16]

FIG. 16 is a cross-sectional view showing an exemplary configuration of a semiconductor device 700 according to Embodiment 7 of the present invention.

As shown in FIG. 16, in the semiconductor device 700 of Embodiment 6, the (n+1)-th interlayer insulating layer 115 is formed on uppermost wire 114. The (n+1)-th contacts 116 and 117 that penetrate the (n+1)-th interlayer insulating layer 115 and are connected to the uppermost wire 114 are formed.

The resistance variable layer 119 of the resistance variable element is formed on the (n+1)-th interlayer insulating layer 115 to cover the (n+1)-th contact 116. The upper electrode 122c is formed to cover the resistance variable layer 119. The upper electrode 122c are connected to the (n+1)-th contact 117 via the hole 123 of the resistance variable layer. The (n+1)-th contact 116 serves as the first terminal, while the upper electrode 122c and the (n+1)-th contact 117 serves as the second terminal.

Only the passivation layer 120 is formed to directly cover the entire surface (especially upper surface of the resistance variable element) including the resistance variable element. Furthermore, the pad hole 121 for allowing transmission and reception of electric signals between the semiconductor device 700 and the external device is formed to penetrate the passivation layer 120 and the (n+1)-th interlayer insulating layer 115 and be connected to the uppermost wire 114.

The uppermost wire 114 and the underlying constituents are identical in structure to those of the semiconductor device 100 and therefore will not be described repetitively.

In such a configuration, since the resistance variable layer is formed at the upper side of the uppermost wire and electric potential is led out from underlying layers, it is possible to implement a semiconductor device incorporating a resistance variable memory stably without being affected by the post-process steps such as the wiring step. In addition, since the entire upper surfaces of the resistance variable element is covered with the highly moisture-resistant passivation layer, the resistance variable element is not affected by the external environment and has a stable resistance changing characteristic and reliability.

In this embodiment, the (n+1)-th contacts 116 and 117 comprise a filling material containing tungsten as a major component, the upper electrod 122c comprises platinum, and the resistance variable layer 119 comprises tantalum oxide.

As should be appreciated, the first terminal comprises tungsten, and a portion of the second terminal which contacts the resistance variable layer 119 comprises platinum. Thus, these terminals comprise different materials. In such a configuration, resistance change is allowed to occur at platinum side (upper electrode side) where the standard electrode potential of redox is relatively higher.

The resistance variable layer 119 comprises oxide of transition metal (in this embodiment, tantalum) and comprises at least two layers which are different in oxygen concentration. To be specific, the upper layer (a portion corresponding to upper surface and side surfaces of each of the resistance variable layer 119 which contacts the upper electrode 122c) is formed by a transition metal oxide layer with higher oxygen concentration. This can dispense with a step (forming step) for allowing oxygen to concentrate at one of the first and second terminals by applying a voltage after the end of diffusion of oxygen. The resistance variable element is operable in a forming-less method, without a need for a high forming voltage, and at low voltages.

FIGS. 17(a) to 17(d) and FIGS. 18(a) and 18(b) are cross-sectional views showing the manufacturing method of the major constituents which are the uppermost wires 114 and the following constituents of the semiconductor device 700 of Embodiment 7. The steps for forming the transistors and the lower wires are omitted. The manufacturing method of the major constituents of the semiconductor device 700 of Embodiment 7 will be described with reference to these Figures.

Figure 17:
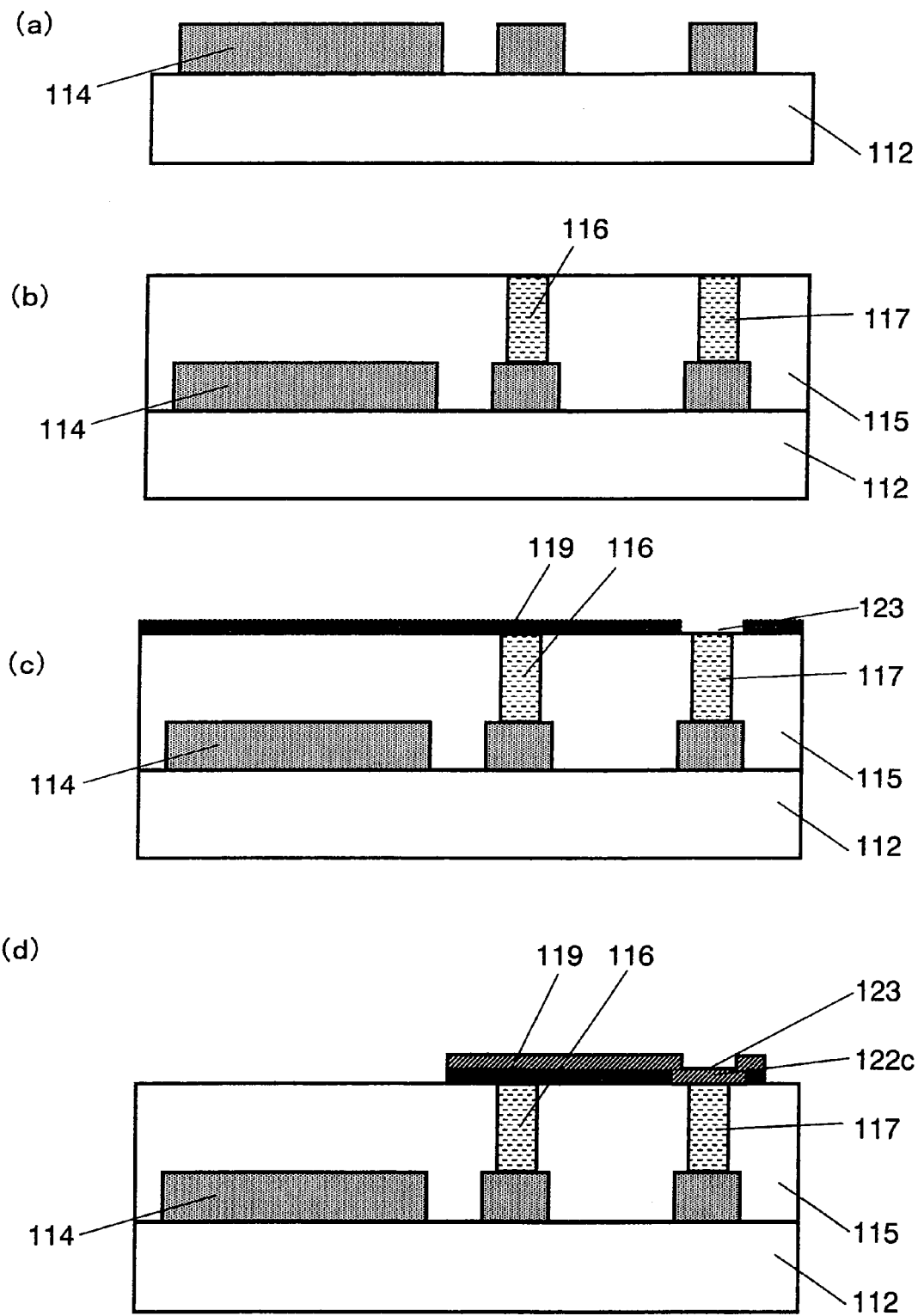
[FIG. 17]
Figure 18:
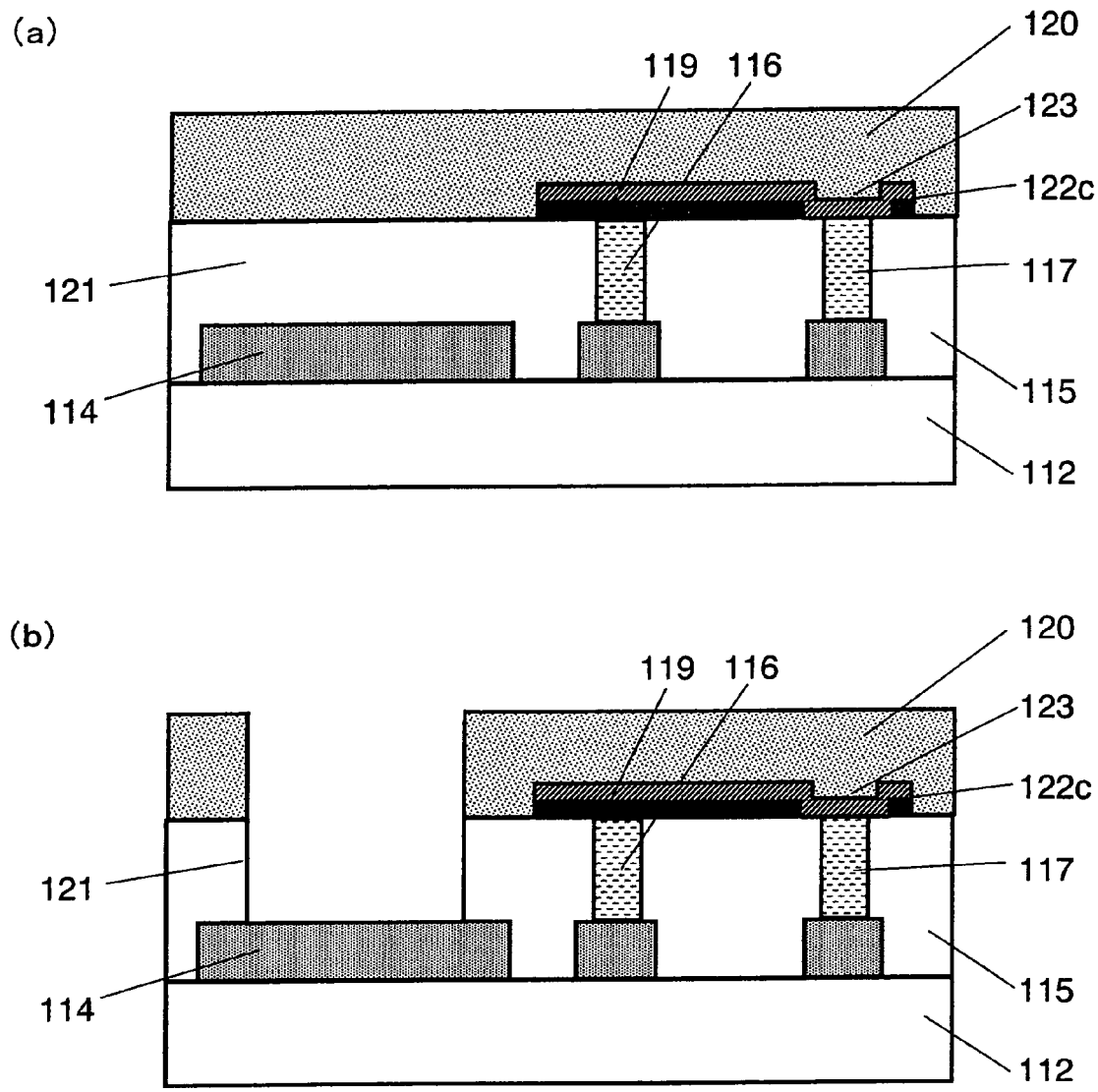
[FIG. 18]

As shown in FIGS. 17 and 18, the manufacturing method of Embodiment 7 includes a step for forming the uppermost wire 114, a step for forming the (n+1)-th contacts 116 and 117, a step of forming the holes 123 in the resistance variable layer 119, a step for forming the resistance variable layer 119 and the upper electrode 122c, a step for forming the passivation layer 120, and a step for forming the pad hole 121.

As shown in FIG. 17(a), in the step for forming the uppermost wire 114, the uppermost wire 114 is formed using a desired mask on the n-th interlayer insulating layer 112 covering the transistors and the lower wires. In this case, concurrently, pad metal for allowing signal transmission and reception between the semiconductor device 700 and the external device is formed.

Then, as shown in FIG. 17(b), in the step for forming the (n+1)-th contacts 116 and 117, the (n+1)-th interlayer insulating layer 115 is formed over the entire surface to cover the uppermost wire 114, and then the (n+1)-th contacts 116 and 117 are formed to penetrate the (n+1)-th interlayer insulating layer 115 and to be connected to the uppermost wire 114. The contacts are filled with a filling material containing tungsten as a major component.

Then, as shown in FIG. 17(c), in the step of forming the hole 123 in the resistance variable layer 119, the resistance variable layer is formed over the entire surface of the (n+1)-th interlayer insulating layer 115, and then the hole 123 connected with the (n+1)-th contact 117 are formed by patterning using a desired mask. In this case, the resistance variable layer 119 comprises tantalum oxide, in order to provide a reversible and stable rewrite characteristic and a good resistance value retention characteristic as well as high-speed operability and to implement a manufacturing process which is highly compatible with a standard Si semiconductor process.

Then, as shown in FIG. 17(d), in the step of forming the resistance variable layer 119 and the upper electrode 122c, the upper electrode is formed over the entire surface of resistance variable layer, and then the resistance variable layer 119 and the upper electrode 122c are formed concurrently by patterning using a desired mask to cover the (n+1)-th contact 116 and the hole 123 of the resistance variable layer. In this case, the upper electrode 122c comprises platinum. In the above configuration, the (n+1)-th contact 116 serves as the first terminal, while the upper electrode 122c and the (n+1)-th contact 117 serve as the second terminal.

Then, as shown in FIG. 18(a), in the step of forming the passivation layer 120, the passivation layer 120 is formed to directly cover the entire surface, including the upper electrode 122c.

Then, as shown in FIG. 18(b), in the step of forming the pad hole 121, the pad hole 121 for allowing transmission and reception of electric signals between the semiconductor device 700 and the external device is formed by patterning using a desired mask such that the pad hole 121 penetrates the passivation layer 120 and the (n+1)-th interlayer insulating layer 115 and is connected to the uppermost wire 114.

In such a method, since the resistance variable layers are formed at the upper side of the uppermost wire and potential is led out from underlying layers, it is possible to manufacture a semiconductor device incorporating a resistance variable memory stably without being affected by the post-process steps such as the wiring step. In addition, since the entire upper surface of the resistance variable element is covered with the highly moisture-resistant passivation layer, it is possible to manufacture the semiconductor device having a stable resistance changing characteristic and reliability without being affected by external environment.

(Embodiment 8)

Figure 19:
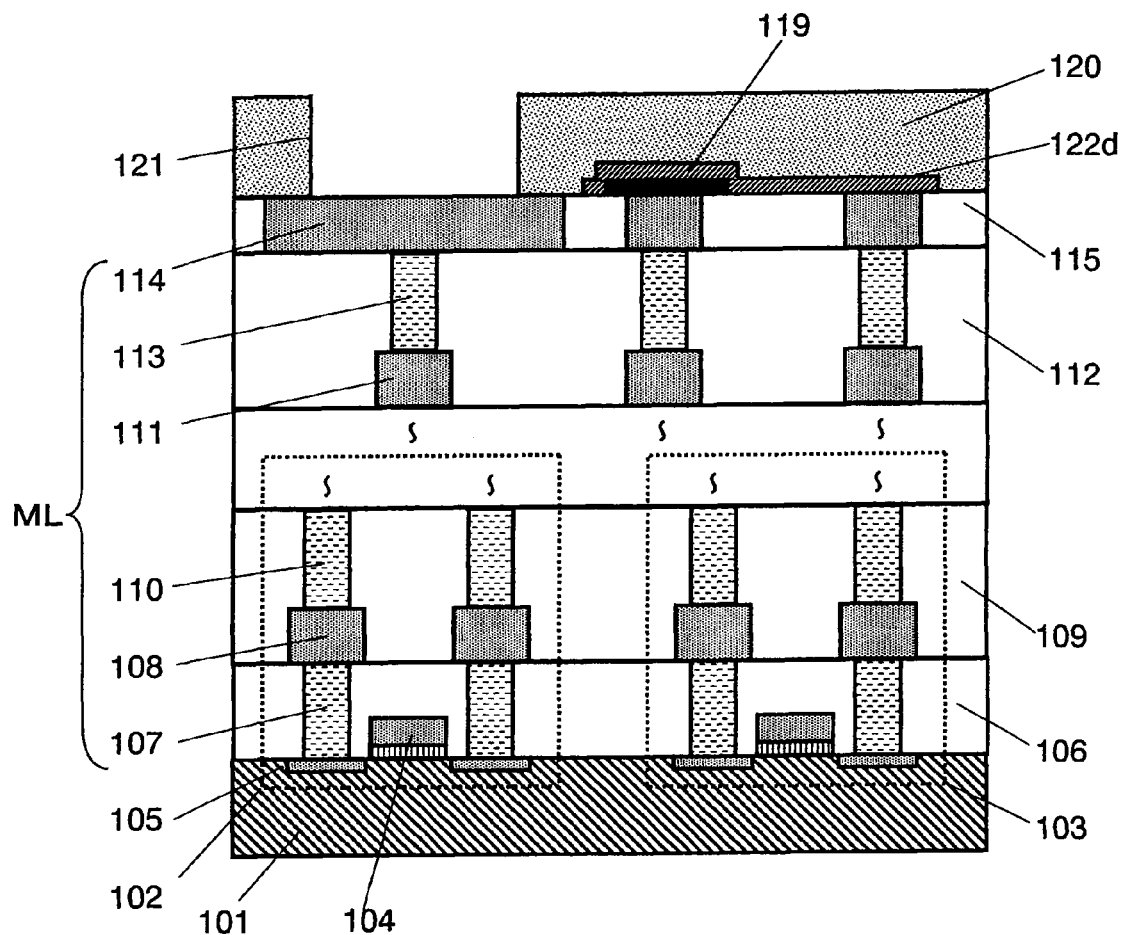
[FIG. 19]

FIG. 19 is a cross-sectional view showing an exemplary configuration of a semiconductor device 800 according to Embodiment 8 of the present invention.

As shown in FIG. 19, the semiconductor device 800 of Embodiment 8 has a configuration in which the (n+1)-th interlayer insulating layer 115 is formed between the uppermost wire 114, and the uppermost wire 114 and the (n+1)-th interlayer insulating layer 115 are substantially equal in height from the semiconductor substrate 101, and form a flat surface. The resistance variable layer 119 of the resistance variable element is connected to a part of the uppermost wire 114. The upper electrode 122d are formed on the (n+1)-th interlayer insulating layer 115 to cover the resistance variable layer 119 and a part of the uppermost wire 114. In this case, portions of the uppermost wire 114 serves as the first terminal, while other portions of uppermost wires 114 and the upper electrode 122d which are at a different potential from the portions of the uppermost wire 114 serves as the second terminal. Only the passivation layer 120 is formed to cover the entire surface including the upper electrode 122d. The pad hole 121 for allowing transmission and reception of electric signals between the semiconductor device 800 and the external device is formed such that the pad hole 121 penetrates the passivation layer 120 and is connected to the uppermost wire 114. The uppermost wire 114 and the underlying constituents are identical in structure to those of the semiconductor device 100, and will not be described repetitively.

In such a configuration, since the resistance variable layer is formed at the upper side of the uppermost wire and electric potential is led out from underlying layers, it is possible to implement a semiconductor device incorporating a resistance variable memory stably without being affected by the post-process steps such as the wiring step. In addition, since the entire upper surface of the resistance variable element is covered with the highly moisture-resistant passivation layer, the resistance variable element is not affected by the external environment and has a stable resistance changing characteristic and reliability.

Furthermore, the semiconductor device 800 has an advantage over the semiconductor device 500 in that the number of masks is less by one than the number of masks for the semiconductor device 500, and the resistance variable elements can be incorporated into the existing LSI by adding two masks at least, which results in a reduced process cost.

FIGS. 20(a) to 20(e) are cross-sectional views showing the manufacturing method of the major constituents which are the uppermost wire 114 and the following constituents in the semiconductor device 800 of Embodiment 8. The steps for forming the transistors and the lower wires are omitted. The manufacturing method of the major constituents of the semiconductor device 800 of Embodiment 8 will be described with reference to these drawings.

Figure 20:
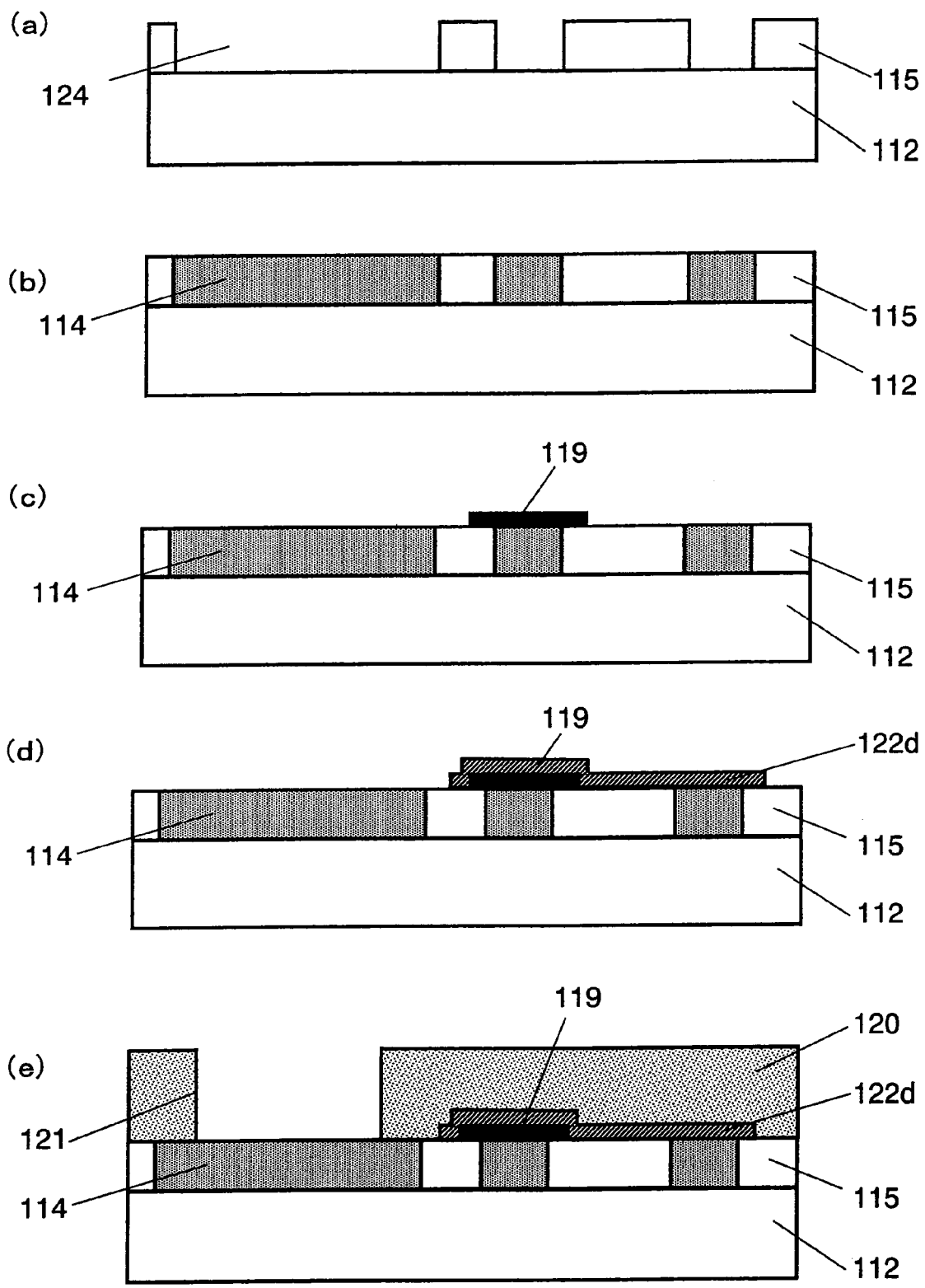
[FIG. 20]

As shown in FIG. 20, the manufacturing method of Embodiment 8 includes a step for forming the wire trench 124 into which the uppermost wire 114 will be formed, a step for forming the uppermost wire 114, a step of forming the resistance variable layer 119, a step for forming the upper electrode 122d, and a step for forming the passivation layer 120 and the pad hole 121.

As shown in FIG. 20(a), in the step of forming the wire trench 124 into which the uppermost wire 114 will be formed, the wire trench 124 into which the uppermost wire 114 will be formed is formed using a desired mask in the (n+1)-th interlayer insulating layer 115 formed on the n-th interlayer insulating layer 112 covering the transistors and the lower wires.

Then, as shown in FIG. 20(b), in the step of forming the uppermost wire 114, a conductive material is filled into the wire trench, thereby forming the uppermost wire 114. In this case, concurrently, pad metal for allowing signal transmission and reception between the semiconductor device 800 and the external device is formed. In this case, a damascene process is conducted using tantalum for the barrier layer and copper for the wires as a major component.

Then, as shown in FIG. 20(c), in the step of forming the resistance variable layer 119, the resistance variable layer 119 of the resistance variable element is formed by patterning using a desired mask on the (n+1)-th interlayer insulating layer 115 such that the resistance variable layer 119 is connected to a part of the uppermost wire 114. In this case, the resistance variable layer 119 comprises tantalum oxide, in order to provide a reversible and stable rewrite characteristic and a good resistance value retention characteristic as well as high-speed operability and to implement a manufacturing process which is highly compatible with a standard Si semiconductor process.

Then, as shown in FIG. 20(d), in the step of forming the upper electrode 122d, the upper electrode 122d is formed by patterning using a desired mask on the (n+1)-th interlayer insulating layer 115 to cover the resistance variable layer 119 and a part of the uppermost wire 114. In this case, the lower layer of the upper electrode 122d comprises platinum and the upper layer of the upper electrode 122d comprises titanium nitride. This is because platinum provides a stable resistance changing characteristic and titanium nitride improves adhesiveness to the passivation layer. In the above configuration, portions of the uppermost wire 114 serves as the first terminal, while the other portion of the uppermost wire 114 and the upper electrode 122*d* which is at a different electric potential from the portion of uppermost wire 114 serves as the second terminal.

Then, as shown in FIG. 20(*e*), in the step of forming the passivation layer 120 and the pad hole 121, the passivation layer 120 is formed to directly cover the entire surface (especially, upper surface of the resistance variable element) of the resistance variable element, including the upper electrode 122*d*, and then the pad hole 121 for allowing transmission and reception of electric signals between the semiconductor device 800 and the external device is formed such that the pad hole 121 penetrates the passivation layer 120 and is connected to the uppermost wire 114.

In such a method, since he resistance variable layer is formed at the upper side of the uppermost wire and the electric potential is led out from the underlying layer, it is possible to manufacture a semiconductor device incorporating a resistance variable memory stably without being affected by the post-process steps such as the wiring step. In addition, since the entire upper surface of the resistance variable element is covered with the highly moisture-resistant passivation layer, it is possible to manufacture a semiconductor device having a stable resistance changing characteristic and reliability without being affected by external environment.

(Embodiment 9)

Figure 21:
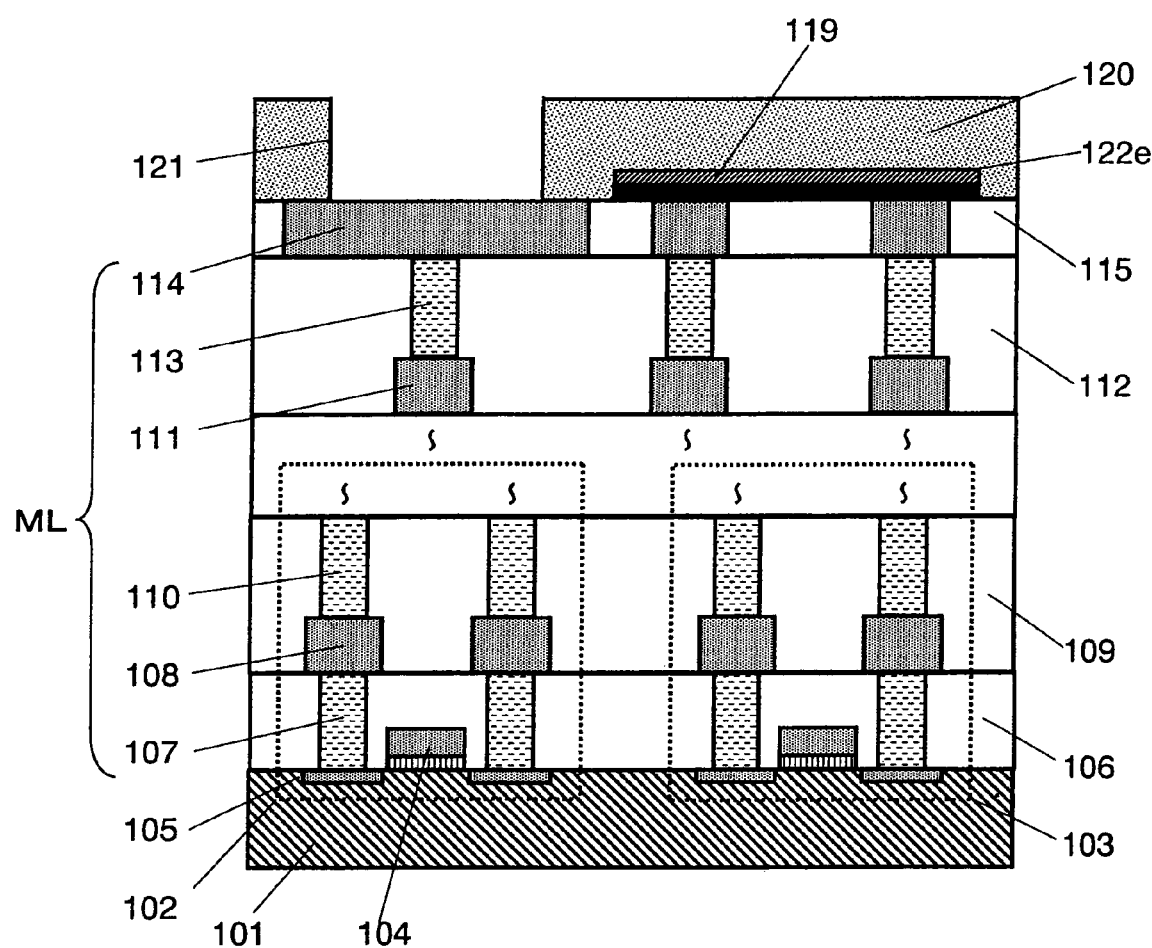
[FIG. 21]

FIG. 21 is a cross-sectional view showing an exemplary configuration of a semiconductor device 900 according to Embodiment 9 of the present invention.

As shown in FIG. 21, the semiconductor device 900 of Embodiment 9 has a configuration in which the (n+1)-th interlayer insulating layer 115 is formed between the uppermost wire 114, and the uppermost wire 114 and the (n+1)-th interlayer insulating layer 115 are substantially equal in height from the semiconductor substrate 101, and form a flat surface. The resistance variable layer 119 and the upper electrode 122*e* are formed on the (n+1)-th interlayer insulating layer 115 to cover the uppermost wire 114. In this case, portions of the uppermost wire 114 serves as the first terminal, while the other portion of the uppermost wire 114 and the upper electrode 122*e* which are at a different electric potential from the portion of the uppermost wire 114 serves as the second terminal. Only the passivation layer 120 is formed to directly cover the entire surface (especially, upper surface of the resistance variable element) including the resistance variable element. The pad hole 121 for allowing transmission and reception of electric signals between the semiconductor device 900 and the external device is formed such that the pad hole 121 penetrates the passivation layer 120 and is connected to the uppermost wire 114. The uppermost wire 114 and the underlying constituents are identical in structure to those of the semiconductor device 100, and will not be described repetitively.

In such a configuration, since the resistance variable layer is formed at the upper side of the uppermost wire and electric potential is led out from underlying layers, it is possible to implement a semiconductor device incorporating a resistance variable memory stably without being affected by the post-process steps such as the wiring step. In addition, since the entire upper surface of the resistance variable element is covered with the highly moisture-resistant passivation layer, the resistance variable element is not affected by the external environment and has a stable resistance changing characteristic and reliability.

Furthermore, the semiconductor device 900 has an advantage over the semiconductor device 600 in that the number of masks is less by one than the number of masks for the semiconductor device 600, and resistance variable element can be incorporated into the existing LSI by adding two masks at least, which results in a reduced process cost. Moreover, the semiconductor device 900 has an advantage over the semiconductor device 600 in that the resistance variable layer is allowed to have flat surfaces without unevenness, a thickness with a less variation, and a stable resistance changing characteristic.

In this embodiment, the uppermost wire 114 comprises a filling material containing copper as a major component, the upper electrode 122*e* comprises platinum, and the resistance variable layer 119 comprises tantalum oxide. In such a configuration, resistance change is allowed to occur at platinum side (upper electrode side) where the standard electrode potential of redox is relatively higher.

Each of the resistance variable layer 119 comprises oxide of transition metal (in this embodiment, tantalum) and comprises at least two layers which are different in oxygen concentration. To be specific, the upper layer (a portion corresponding to upper surface of each of the resistance variable layer 119 which contacts the upper electrode 122*e*) is formed by a transition metal oxide layer with higher oxygen concentration. This can dispense with a step (forming step) for allowing oxygen to concentrate at one of the first and second terminals by applying a voltage after the end of diffusion of oxygen. The resistance variable layer 119 is operable in a forming-less method, without a need for a high forming voltage, and at low voltages.

In a reversed material relationship of this embodiment, the uppermost wire may comprises a filling material containing platinum as a major component, and the upper electrode 122*e* may comprises tungsten.

In such a configuration, resistance change is allowed to occur at platinum side (first terminal side or second terminal side) where the standard electrode potential of redox is relatively higher. The upper electrode 122*e* assists in reducing resistance of wires connecting the first terminal to the second terminal.

In this case, the lower layer of each of the resistance variable layer 119 (a portion corresponding to bottom surface of each of the resistance variable layer 119 which contacts the uppermost wire 114) is formed by a transition metal oxide with higher oxygen concentration.

Figure 22:
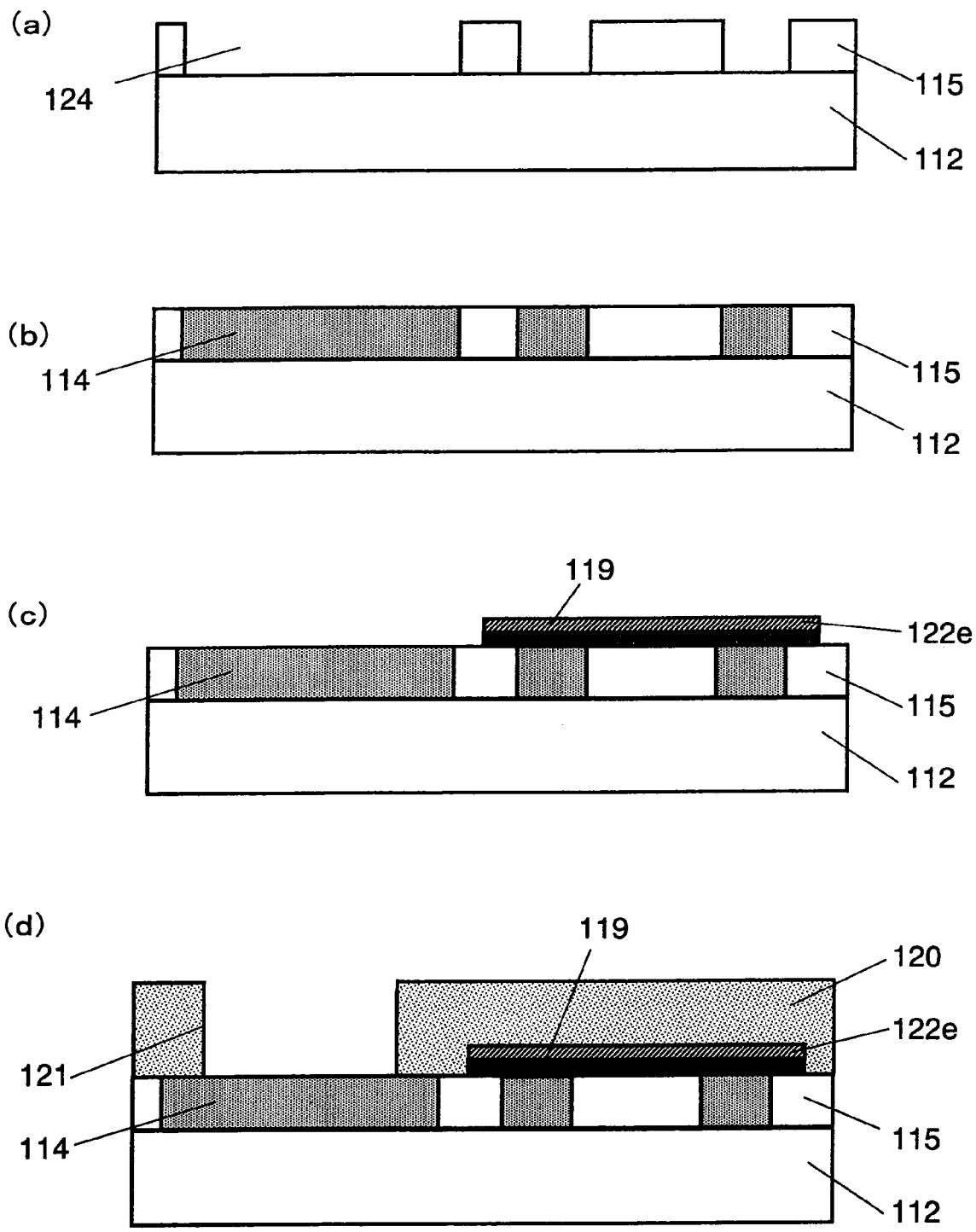
[FIG. 22]

FIGS. 22(*a*) to 22(*d*) are cross-sectional views showing the manufacturing method of the major constituents which are the uppermost wire 114 and the following constituents in the semiconductor device 900 of Embodiment 9. The steps for forming the transistors and the lower wires are omitted. The manufacturing method of the major constituents of the semiconductor device 900 of Embodiment 9 will be described with reference to these drawings.

As shown in FIG. 22, the manufacturing method of Embodiment 9 includes a step for forming the wire trench 124 into which the uppermost wire 114 will be formed, a step for forming the uppermost wire 114, a step for forming the resistance variable layer 119 and the upper electrode 122*e*, and a step for forming the passivation layer 120 and the pad hole 121.

As shown in FIG. 22(*a*), in the step of forming the wire trench 124 into which the uppermost wire 114 will be formed, the wire trench 124 into which the uppermost wire 114 will be formed, are formed using a desired mask in the (n+1)-th interlayer insulating layer 115 formed on the n-th interlayer insulating layer 112 covering the transistors and the lower wires.

Then, as shown in FIG. 22(*b*), in the step of forming the uppermost wire 114, a conductive material is filled into the wire trench, thereby forming the uppermost wire 114. In this case, concurrently, pad metal for allowing signal transmission and reception between the semiconductor device 900 and the external device is formed. In this embodiment, a damascene process is conducted using tantalum for the barrier layer and copper for the wires as a major component.

Then, as shown in FIG. 22(c), in the step of forming the resistance variable layer 119 and the upper electrode 122e of the resistance variable element, the resistance variable layer 119 and the upper electrode 122e of the resistance variable element are formed by patterning using a desired mask on the (n+1)-th interlayer insulating layer 115 to cover a part of the uppermost wire 114. In this case, the resistance variable layer 119 comprises tantalum oxide and the upper electrode 122e comprises platinum, in order to provide a reversible and stable rewrite characteristic and a good resistance value retention characteristic as well as high-speed operability and to implement a manufacturing process which is highly compatible with a standard Si semiconductor process. In the above configuration, portions of the uppermost wire 114 serves as the first terminal, while other portions of the uppermost wire 114 at a different potential from the portions of uppermost wire 114 serves as the second terminal.

Then, as shown in FIG. 22(d), in the step of forming the passivation layer 120 and the pad hole 121, the passivation layer 120 is formed to directly cover the entire surface (especially, upper surface of the resistance variable element) of the resistance variable element including the upper electrode 122e, and then the pad hole 121 for allowing transmission and reception of electric signals between the semiconductor device 900 and the external device is formed by patterning using a desired mask such that the pad hole 121 penetrates the passivation layer 120 and is connected to the uppermost wire 114.

In such a method, since the resistance variable layer is formed at the upper side of the uppermost wire and electric potential is led out from underlying layers, it is possible to manufacture a semiconductor device incorporating a resistance variable memory stably without being affected by the post-process steps such as the wiring step. In addition, since the entire upper surface of the resistance variable element is covered with the highly moisture-resistant passivation layer, it is possible to manufacture a semiconductor device having a stable resistance changing characteristic and reliability without being affected by external environment.

(Embodiment 10)

Figure 23:
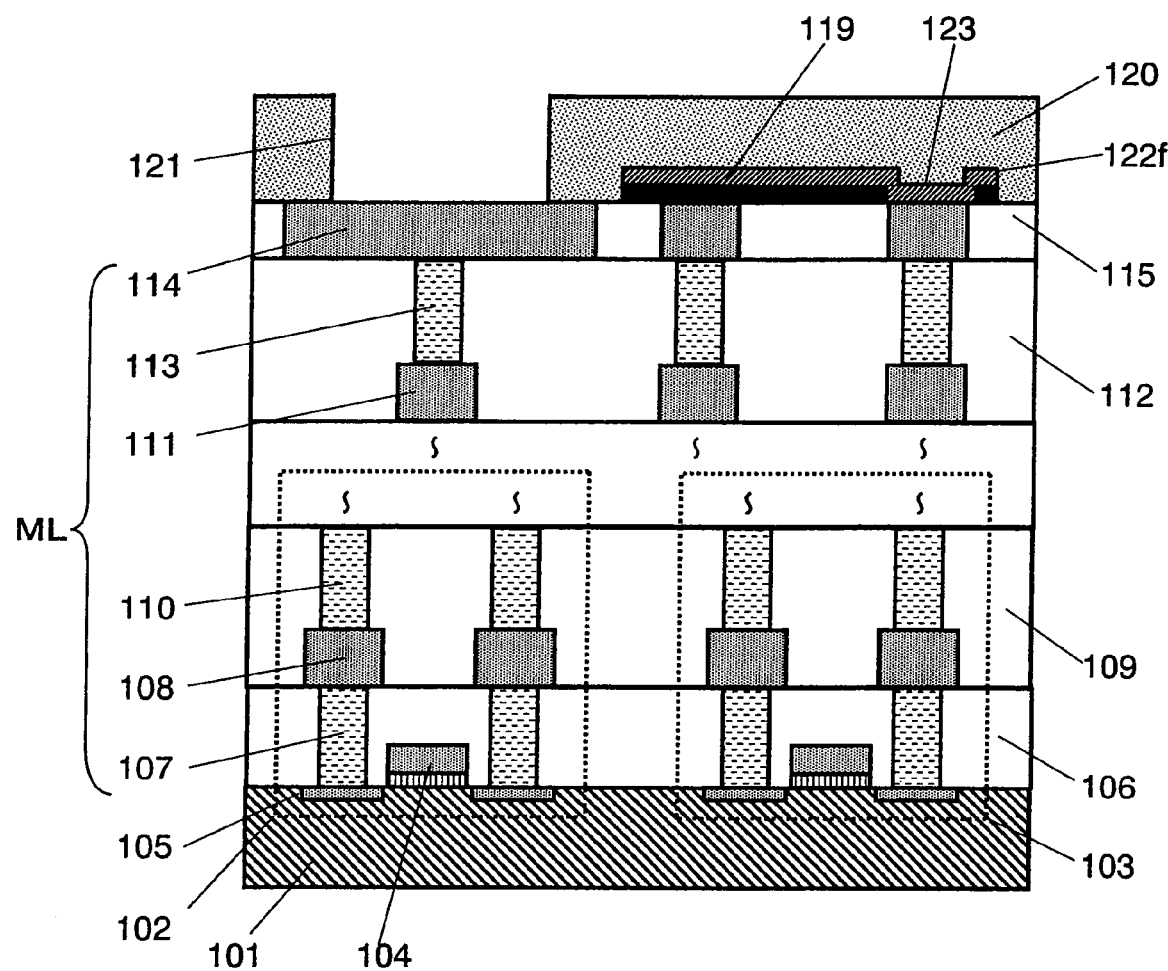
[FIG. 23]

FIG. 23 is a cross-sectional view showing an exemplary configuration of a semiconductor device 1000 according to Embodiment 10 of the present invention.

As shown in FIG. 23, the semiconductor device 1000 of Embodiment 10 has a configuration in which the (n+1)-th interlayer insulating layer 115 is formed between the uppermost wire 114, and the uppermost wire 114 and the (n+1)-th interlayer insulating layer 115 is substantially equal in height from the semiconductor substrate 101, and form a flat surface. The resistance variable layer 119 of the resistance variable element is formed on the (n+1)-th interlayer insulating layer 115 to cover a part of the uppermost wire 114. Furthermore, upper electrode 122f is formed to cover the resistance variable layer 119. The upper electrode 122f is connected to a part of the uppermost wire 114 via the hole 123 of the resistance variable layer. In this case, portions of the uppermost wire 114 serves as the first terminal, while other portions of the uppermost wire 114 and the upper electrode 122f which are at different electric potential from the portions of the uppermost wire 114 serve as the second terminal. Only the passivation layer 120 is formed to directly cover the entire surface (especially, upper surface of the resistance variable element) including the resistance variable element. The pad hole 121 for allowing transmission and reception of electric signals between the semiconductor device 1000 and the external device is formed such that the pad hole 121 penetrates the passivation layer 120 and is connected to the uppermost wire 114. The uppermost wire 114 and the underlying constituents are identical in structure to those of the semiconductor device 100, and will not be described repetitively.

In such a configuration, since the resistance variable layer is formed at the upper side of the uppermost wire and the potential is led out from the underlying layers, it is possible to implement a semiconductor device incorporating a resistance variable memory stably without being affected by the post-process steps such as the wiring step. In addition, since the entire upper surface of the resistance variable element is covered with the highly moisture-resistant passivation layer, the resistance variable element has a stable resistance changing characteristic and reliability without being affected by external environment.

Furthermore, the semiconductor device 1000 has an advantage over the semiconductor device 700 in that the number of masks is less by one than the number of masks for the semiconductor device 700, and the resistance variable element can be incorporated into the existing LSI by adding two masks at least, which results in a reduced process cost.

In this embodiment, the uppermost wire comprises a filling material containing copper as a major component, the upper electrode 122f comprises platinum, and the resistance variable layer 119 comprises tantalum oxide.

The first terminal comprises copper, a portion of the second terminal which contacts the resistance variable layer 119 comprises platinum. Thus, the terminals comprise different materials. In such a configuration, resistance change is allowed to occur at platinum side (upper electrode side) where the standard electrode potential of redox is relatively higher.

The resistance variable layer 119 comprises oxide of transition metal (in this embodiment, tantalum) and comprises at least two layers which are different in oxygen concentration. To be specific, the upper layer (portion corresponding to upper surface and side surface of the resistance variable layer 119 which contacts the upper electrode 122f) is formed by a transition metal oxide layer with higher oxygen concentration. This can dispense with a step (forming step) for allowing oxygen to concentrate at one of the first and second terminals by applying a voltage after the end of diffusion of oxygen. The resistance variable layer 119 are operable in a forming-less method, without a need for a high forming voltage, and at low voltages.

FIGS. 24(a) to 24(e) are cross-sectional views showing the manufacturing method of the major constituents which are the uppermost wire 114 and the following constituents of the semiconductor device 1000 of Embodiment 10. The steps for forming the transistors and the lower wires are omitted. The manufacturing method of the major constituents of the semiconductor device 1000 of Embodiment 10 will be described with reference to these drawings.

Figure 24:
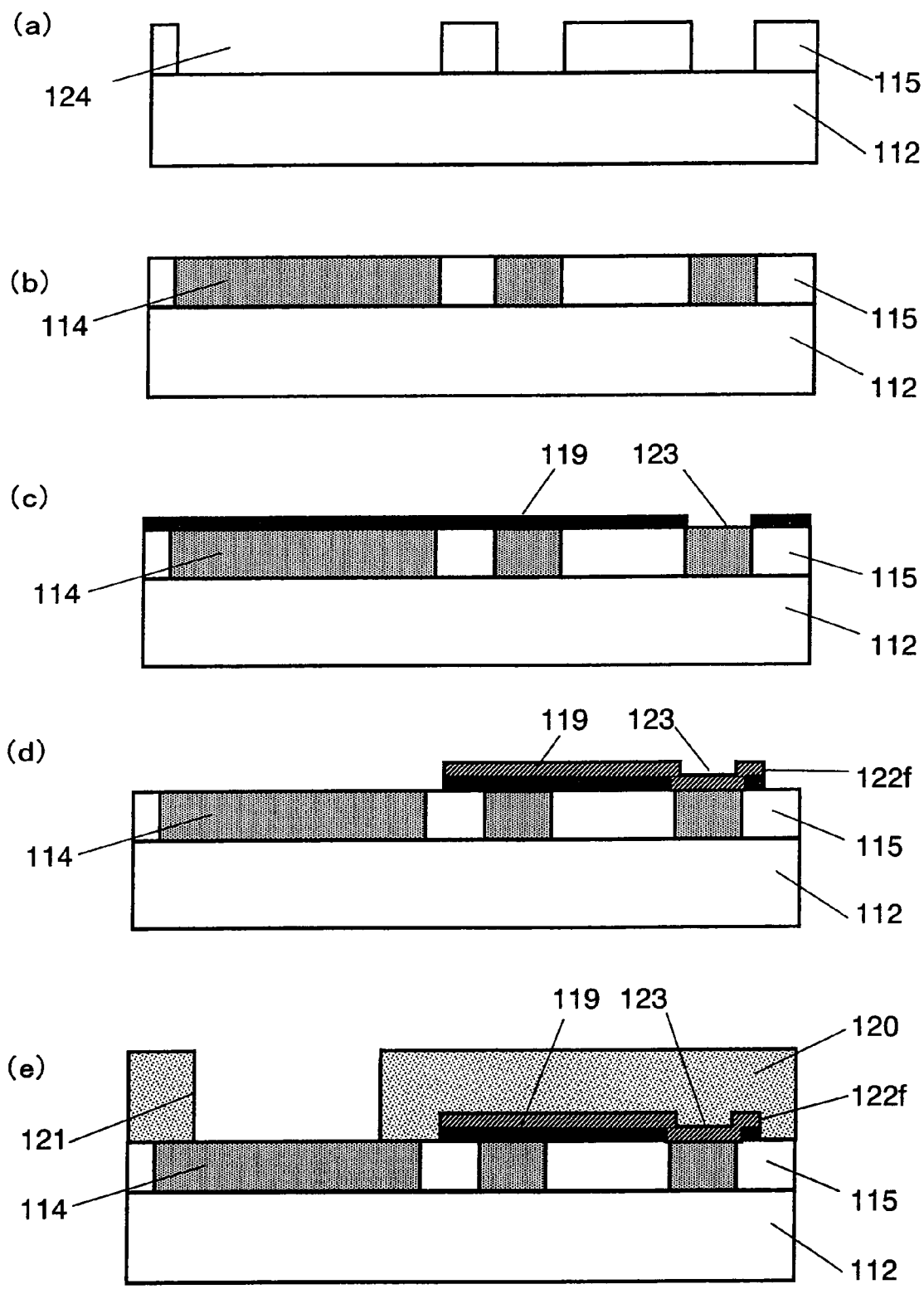
[FIG. 24]

As shown in FIG. 24, the manufacturing method of Embodiment 10 includes a step for forming the wire trench 124 into which the uppermost wire 114 will be formed, a step for forming the uppermost wire 114, a step of forming the hole 123 in the resistance variable layer 119, a step of forming the resistance variable layer 119 and the upper electrode 122f, and a step for forming the passivation layer 120 and the pad hole 121.

As shown in FIG. 24(a), in the step of forming the wire trench 124 into which the uppermost wire 114 will be formed, the wire trench 124 into which the uppermost wire 114 will be formed are formed using a desired mask in the (n+1)-th interlayer insulating layer 115 formed on the n-th interlayer insulating layer 112 covering the transistors and the lower wires.

Then, as shown in FIG. 24(b), in the step of forming the uppermost wire 114, a conductive material is filled into the wire trench, thereby forming the uppermost wire 114. In this case, concurrently, pad metal for allowing signal transmission and reception between the semiconductor device 1000 and external device is formed. In this embodiment, a damascene process is conducted using tantalum for the barrier layer and copper for the wires as a major component.

Then, as shown in FIG. 24(c), in the step of forming the holes 123 in the resistance variable layer 119, the resistance variable layer is formed over the entire surface of the (n+1)-th interlayer insulating layer 115, and then the hole 123 connected with a part of the uppermost wire 114 is formed by patterning using a desired mask. In this embodiment, the resistance variable layer 119 comprises tantalum oxide, in order to provide a reversible and stable rewrite characteristic and a good resistance value retention characteristic as well as high-speed operability and to implement a manufacturing process which is highly compatible with a standard Si semiconductor process.

Then, as shown in FIG. 24(d), in the step of forming the resistance variable layer 119 and the upper electrode 122f, the upper electrode is formed over the entire resistance variable layer, and then the resistance variable layer 119 and the upper electrode 122f are formed concurrently by patterning using a desired mask to cover a part of the uppermost wire 114 and the hole 123 of the resistance variable layer. In this case, the upper electrode 122f comprises platinum. In the above configuration, a portion of the uppermost wire 114 serves as the first terminal, while the other portion of the uppermost wire 114 and the upper electrode 122f which is at a different electric potential from the portion of the former uppermost wire 114 serves as the second terminal.

Then, as shown in FIG. 24(d), in the step of forming the passivation layer 120 and the pad hole 121, the passivation layer 120 is formed to directly cover the entire surface (especially upper surface of the resistance variable element) of the resistance variable element, including the upper electrode 122f, and then the pad hole 121 for allowing transmission and reception of electric signals between the semiconductor device 1000 and the external device is formed by patterning using a desired mask such that the pad hole 121 penetrates the passivation layer 120 and is connected to the uppermost wire 114.

In such a method, since the resistance variable layer is formed at the upper side of the uppermost wire and electric potential is led out from underlying layers, it is possible to manufacture a semiconductor device incorporating a resistance variable memory stably without being affected by the post-process steps such as the wiring step. In addition, since the entire upper surface of the resistance variable element is covered with the highly moisture-resistant passivation layer, it is possible to manufacture the semiconductor device having a stable resistance changing characteristic and reliability without being affected by external environment.

(Element Characteristic of Embodiment 1)

Figure 25:
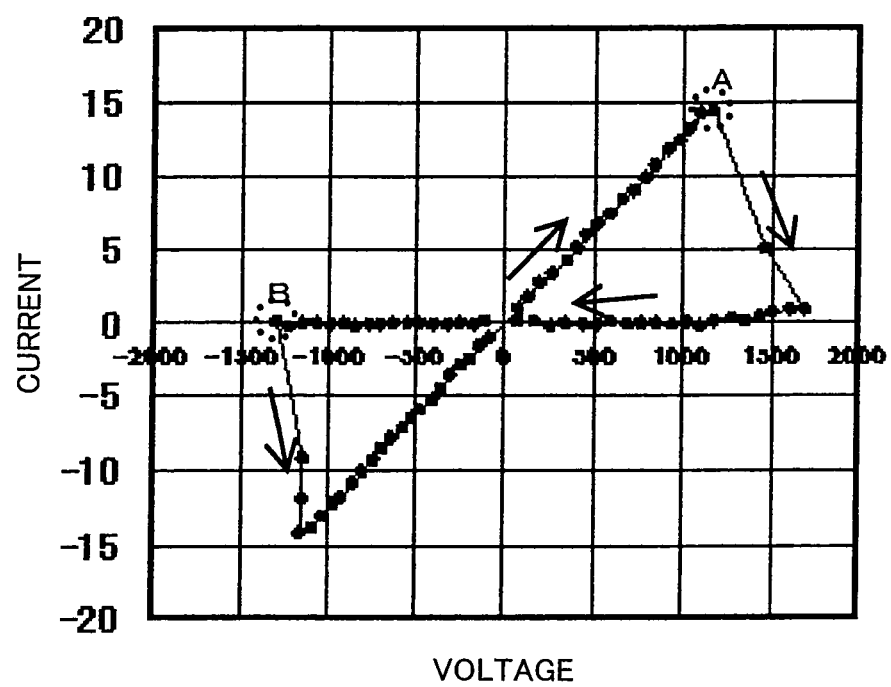
[FIG. 25]

FIG. 25 is a graph of a voltage-current hysteresis characteristic, showing an exemplary resistance change of the element having a structure in which tantalum oxide used for the resistance variable layer 119 of Embodiment 1 of the present invention is sandwiched between the electrodes. In the structure of Embodiment of FIG. 1, a horizontal axis indicates a voltage between the contact 116 and the contact 117, while a vertical axis indicates a value of a current flowing through the resistance variable layer 119. When a positive voltage is applied between the electrodes, the current increases substantially in proportion to the voltage and drastically decreases when the voltage exceeds a positive voltage at A point, which indicates that the element changes from a low-resistance state to a high-resistance state (attains high-resistance state). In contrast, in the high-resistance state, when a negative voltage is applied, a current drastically increases when the voltage exceeds a negative voltage at point B, which indicates that the element changes from the high-resistance state to the low-resistance state (attains low-resistance state).

Figure 26:
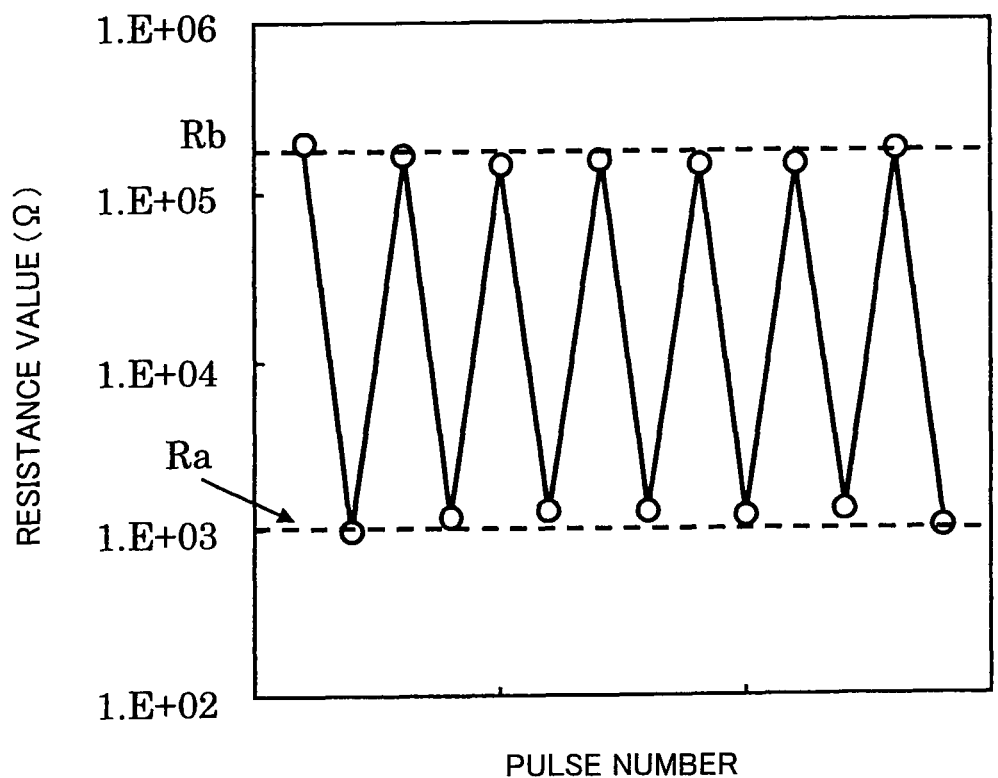
[FIG. 26]

FIG. 26 shows another example of resistance change of tantalum oxide used for the resistance variable layer 119 of Embodiment 1 of the present invention and shows a change in resistance values occurring by applying positive and negative voltage pulses with 100 ns alternately. Similarly to the case shown in FIG. 25, the resistance value decreases to a low-resistance value Ra of $1.0 \times 10^3$ Ω by applying a negative voltage between the electrodes, whereas the resistance value increases to a high-resistance value Rb of $1.2 \times 10^5$ Ω by applying a positive voltage between the electrodes. One of the two different values Ra and Rb is allocated to "0" and another is allocated to "1." Under this condition, data "0" or data "1" is stored depending on which one of these data the resistance value corresponds to. In this example, the larger resistance value Rb is allocated to data "0" and the smaller resistance value Ra is allocated to data "1." As shown in FIG. 26, by applying a positive or negative pulse according to data to be stored, the resistance value, i.e., data of the resistance variable layer 119 can be rewritten reversibly as nonvolatile data.

Hereinafter, the feature of the resistance variable materials used in the present invention and their characteristics which was discovered by the present inventors will be described briefly.

Oxide of transition metal such as tantalum (Ta) or hafnium (Hf) changes its resistance by connecting the both sides of the transition metal oxide to electrodes made of metals different from the transition metal and applying electric signals, if it has an oxygen-deficient composition. Especially, the resistance changing characteristic is so-called a bipolar characteristic in which the transition metal oxide changes between the high-resistance state and the low-resistance state in response to bipolar voltages applied between the electrodes.

For a specified transition metal oxide, there are an electrode material which easily causes resistance change and an electrode material which does not easily cause resistance change, when the specified transition metal oxide is combined with electrode materials. This is closely related to standard electrode potentials which are indicators indicating degree of easiness of oxidation. For example, if the transition metal oxide is combined with a platinum electrode which has a higher standard electrode potential than tantalum and is less easily oxidated, resistance change easily occurs, while if the transition metal oxide is combined with tungsten which has a lower standard electrode potential than tantalum, the resistance change does not easily occur.

This is based on a mechanism in which oxygen ions in the transition metal oxide migrate toward the electrode to which a positive voltage is applied and stay there, and thereby oxidation reaction of transition metal in a region in the vicinity of the electrode is facilitated, allowing the transition metal oxide to change to the high-resistance state, while oxygen migrate away from the electrode by applying a voltage in a reverse direction, and reduction reaction of the transition metal oxide is facilitated, allowing the transition metal oxide to change to the low-resistance state. It was found out that a stable resistance changing characteristic is effectively produced by using an electrode material which does not easily react with oxygen ions.

It is supposed that the above finding is applied to the semiconductor device having the structure of Embodiment 1 shown in FIG. 1. A resistance changing phenomenon stably occurs in a region of the resistance variable layer 119 which is in contact with the lower electrode 118a made of platinum, while the resistance changing phenomenon does not occur in a region of the resistance variable layer 119 which is in contact with the contact 117 made of the filling material containing tungsten as a major component. A specific operation occurs in such a manner that, when the positive voltage is applied to the contact 116 on the basis of the contact 117, the resistance variable layer 119 changes to the high-resistance state when a voltage exceeding the voltage at the point A of FIG. 25 is applied, while the resistance variable layer 119 changes to the low-resistance state when a voltage exceeding the threshold voltage at point B is applied in an opposite direction.

APPLICATION EXAMPLES

Hereinafter, several application examples to which the semiconductor device of Embodiment 1 is applied will be described. In any of the structures of Embodiments 2 to 10, one terminal of the resistance variable layer comprises an electrode material such as platinum with higher standard electrode potential and the other terminal comprises electrode material with lower standard electrode potential. Therefore, any of the structures may be used as the semiconductor device in the application examples described below.

Application Example 1 of Embodiment 1

A first application example is used to relieve faulty bits or regulate voltage levels in one semiconductor device, and conventionally, laser trimming means and electric fuse means are known.

Figure 27:
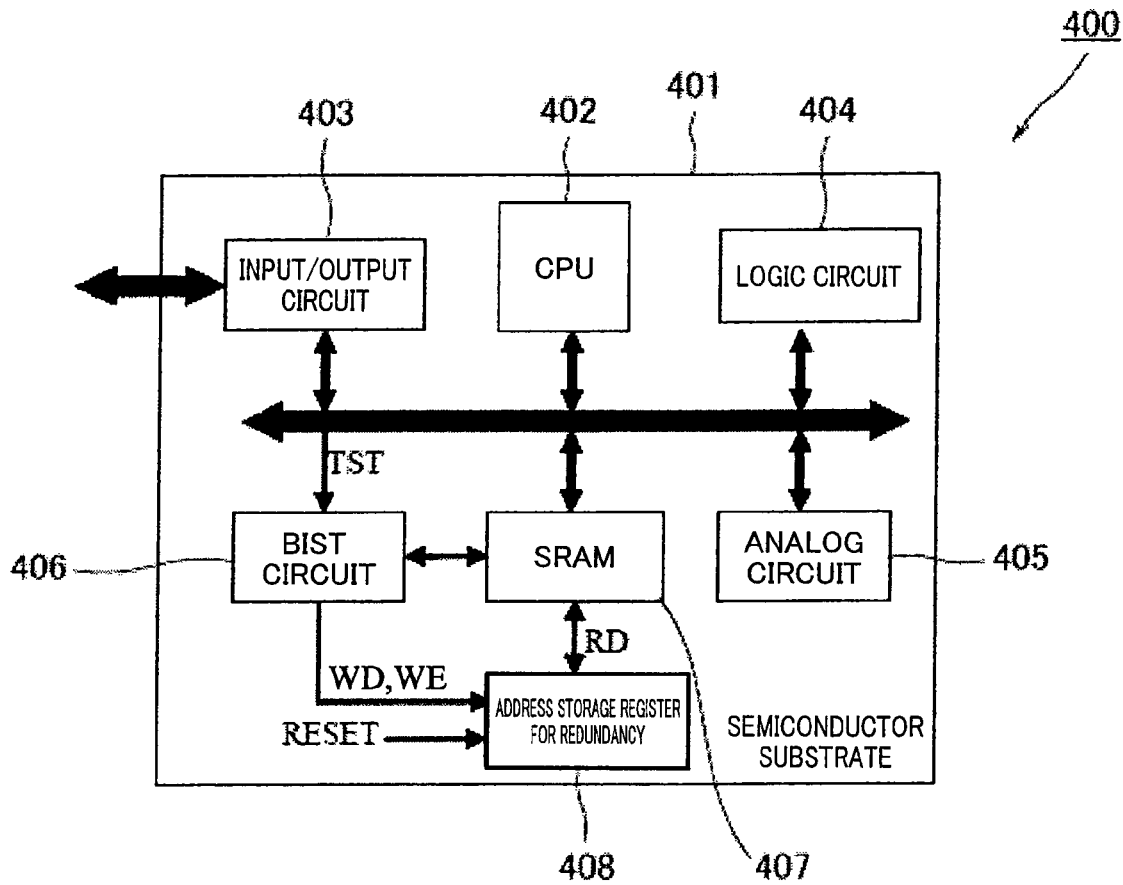
[FIG. 27]

FIG. 27 is a block diagram showing an application of the semiconductor device of Embodiment 1 to LSI having a program function, which includes a logic circuit configured execute predetermined calculation.

As shown in FIG. 27, a semiconductor device 400 (fuse circuit) in this application example, includes, on a single semiconductor substrate 401, a CPU 402, an input/output circuit 403 used for inputting/outputting data to/from an external circuit, a logic circuit 404 for executing predetermined calculation, an analog circuit 405 for processing analog signals, a BIST (Built In Self Test) circuit 406 for performing self diagnosis, a SRAM (semiconductor memory) 407, and an address storage register for redundancy 408 which is connected to the BIST circuit 406 and to the SRAM 407 and is configured to store specific address information. In other words, in the semiconductor chip of this application example, the semiconductor device of Embodiment 1 is incorporated into the fuse circuit used to relieve faulty bits of the semiconductor memory, as will be described later.

Figure 28:
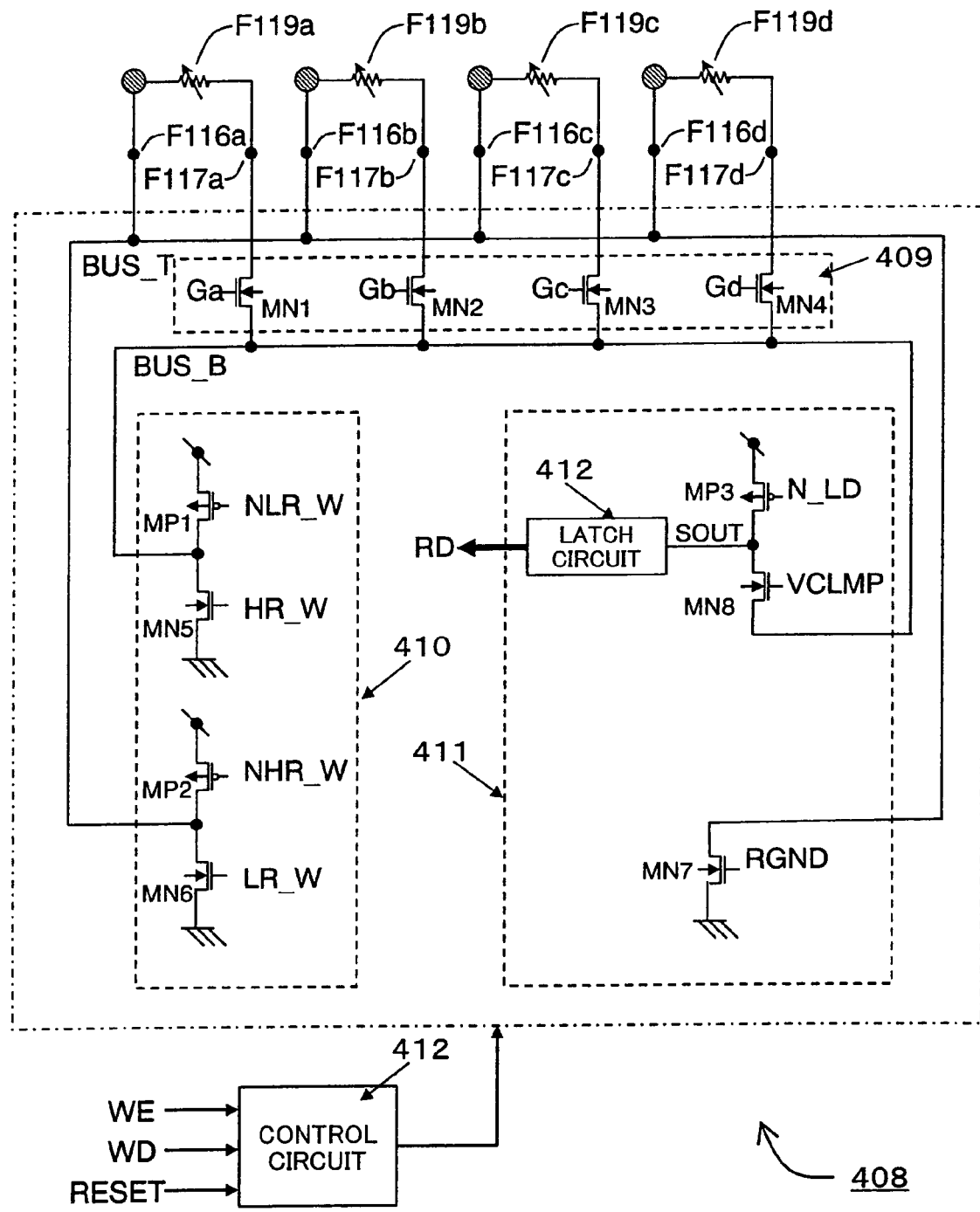
[FIG. 28]

FIG. 28 is a circuit diagram showing a configuration of the address storage register for redundancy 408 of FIG. 27. In the semiconductor device 400 of this application example, data of 4 bits are programmed for the purpose of simplicity, but the present invention is not limited to this. F119a, F119b, F119c and F119d indicate program elements each of which corresponds to the resistance variable layer 119 of the semiconductor device 100 of Embodiment 1 of the present invention shown in FIG. 1. Hatched circles indicate the lower electrodes 118a made of platinum. Contact points F116a to F116d of the program elements F119a to F119d correspond to the contacts F116 of the semiconductor device 100 of FIG. 1. Likewise, contact points F117a to F117d of the program elements F119a to F119d correspond to the contacts 117 of the semiconductor device 100 of FIG. 1. The contact points F116a to F116d are connected to BUS_T which is a first common signal line.

409 designates a program element selector circuit for selecting one of the program elements F119a, F119b, F119c and F119d. 410 designates a write circuit for writing data to the program elements F119a, F119b, F119c and F119d. 411 designates a read circuit for reading stored data from the program elements F119a, F119b, F119c and F119d. 412 designates a control circuit which receives as inputs, write enable signals WE and write data signals WD which are output from the BIST circuit 406 of the semiconductor device 400, reset signals RESET associated with the overall operation of the semiconductor device 400 and clocks (not shown), and outputs a control signal to the program element selector circuit 409, the write circuit 410 and the read circuit 411.

The program element selector circuit 409 comprises N-type MOS transistors MN1, MN2, MN3 and MN4. One of the sources and the drains of the respective N-type MOS transistors MN1, MN2, MN3 and MN4 are connected to portions leading to the contact points 117a to F117d, respectively. The other of the sources and the drains of the respective N-type MOS transistors MN1, MN2, MN3 and MN4 are connected to BUS_B which is a second common signal line. Select signals Ga to Gd which are the output signals of the control circuit 412 are coupled to the gates of the N-type MOS transistors MN1, MN2, MN3 and MN4, respectively.

The write circuit 410 includes a P-type MOS transistor MP1 having a source connected to a power supply VDD, a drain connected to the second common signal line BUS_B, and a gate connected to a low-resistance state attaining command signal NLR_W which is an output signal of the control circuit 412, and a N-type MOS transistor MN6 having a source connected to a ground level VSS, a drain connected to the first common signal line BUS_T, and a gate connected to another low-resistance state attaining command signal LR_W which is an output signal of the control circuit 412, thus constructing a low-resistance state attaining write circuit.

The write circuit 410 includes a P-type MOS transistor MP2 having a source connected to the power supply VDD, a drain connected to the first common signal line BUS_T, and a gate connected to a high-resistance state attaining command signal NHR_W which is an output signal of the control circuit 412, and a N-type MOS transistor MN5 having a source connected to the ground level VSS, a drain connected to the second common signal line BUS_B, and a gate connected to another high-resistance state attaining command signal HR_W which is an output signal of the control circuit 412, thus constructing a high-resistance state attaining write circuit.

The read circuit 411 includes a N-type MOS transistor MN7 having a drain connected to the first common signal line BUS_T, a source connected to the ground level VSS, and a gate connected to a read command signal RGND output from the control circuit 412, a N-type MOS transistor MN8 having a source connected to second common signal line BUS_B, a drain coupled to node SOUT, and a gate coupled to voltage clamp signals VCLMP output from the control circuit 412, a load current feeding P-type MOS transistor MP3 having a source connected to the power supply VDD, a drain coupled to the node SOUT, and a gate coupled to a load command signal N_LD output from the control circuit 412, and a latch circuit 412 which receives the node SOUT as an input and latches data SOUT at specified timings, and is configured to output signals RD as read result.

During a read operation, the voltage clamp signals VCLMP are constant voltage signals set at a predetermined voltage VC, and the voltage at the second common signal line BUS_B is substantially clamped to a value which is not more than a voltage obtained by subtracting a threshold voltage VT of the N-type MOS transistor MN8 from the voltage VC. Therefore, during the reading, the voltages applied to the program elements F119*a* to F119*d* are restricted to prevent disturb occurring in these program elements. The size of the load current feeding PMOS transistor MP3 is set to have a substantially intermediate current drivability between a current drivability in a state where the program elements F119*a* to F119*d* are set in a high-resistance state and a current drivability in a state where the program elements F119*a* to F119*d* are set in a low-resistance state. Therefore, the node SOUT is High level in the state where the program elements F119*a* to F119*d* are placed in the high-resistance state, while the node SOUT is Low level in the state where the program elements F119*a* to F119*d* are placed in the low-resistance state.

The operation associated with the address storage register for redundancy 408 in the semiconductor device 400 configured as described above will be described.

Receiving a diagnosis command signals TST, the BIST circuit 406 inspects a memory block of the SRAM 407. The memory block is inspected during inspection in a manufacturing process of LSI, and during various diagnostic processes carried out in the case where the LSI is mounted in an actual system.

If a faulty bit is detected as a result of inspection of the memory block, the BIST circuit 406 outputs the write enable signals WE and the write data signals WD to the address storage register for redundancy 408. The address storage register for redundancy 408 stores therein address information corresponding to the faulty bit.

The address information is stored in such a manner that address information is written to the address storage register for redundancy 408 by changing the resistance state of the program element in the associated register to the high-resistance state or to the low-resistance state, according to the address information.

The address information is read during a reset period at start-up of the semiconductor device 400, etc and is set in a register within the SRAM 407. When the SRAM 407 is accessed, target address information is compared to the address information stored in the register concurrently. When there is a match between the address information, a memory cell for redundancy provided within the SRAM 407 is accessed, thus reading or writing data.

Figure 29:
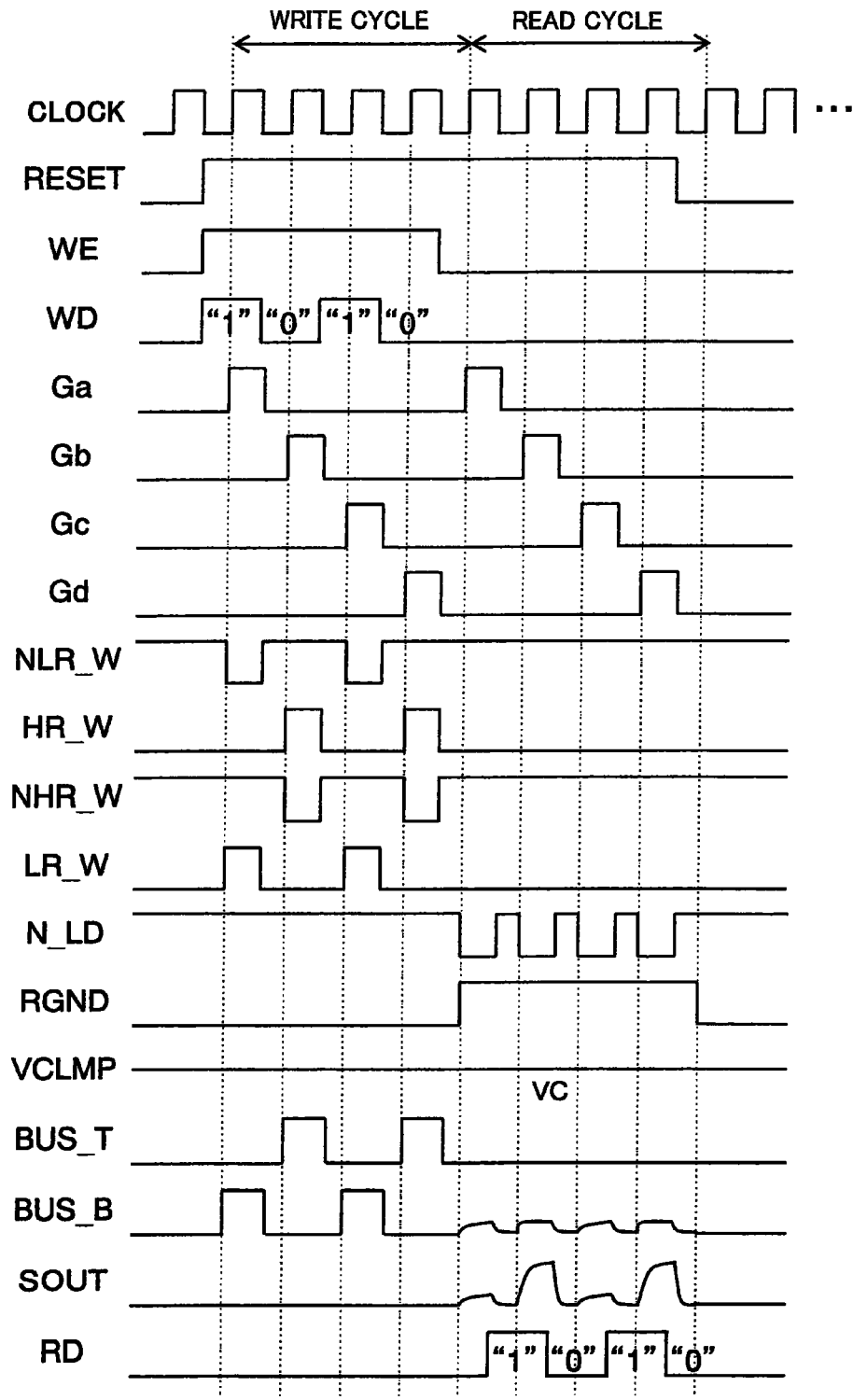
[FIG. 29]

Next, the operation of the storage address register for redundancy 408 will be described with reference to the timing chart of FIG. 29. FIG. 29 exemplarily shows a case where a write cycle and a read cycle occur in succession and data "1" (low-resistance value) is written to the program elements F119*a* and F119*c* and the data "0" (high-resistance value) is written to the program elements F119*b* and F119*d*.

The address storage register for redundancy 408 is configured to start a predetermined operation in synchronization with a timing at which a clock changes to High level and complete writing or reading with respect to one program element within one clock cycle.

Firstly, the operation of the write cycle will be described. When the RESET signals and the write enable signals WE are set at High level, the address storage register for redundancy 408 recognizes a present cycle as a write cycle, and executes a write operation.

Select signals Ga, Gb, Gc, and Gd set at High level for a predetermined period are output in this order to the gates of the N-type MOS transistors MN1 to MN4 of the program element selector circuit 409 in respective clock cycles, thereby allowing the program elements F119*a* to F119*d* to be sequentially connected to the second common signal line BUS_B.

The write data signals WD are written in such a manner that since data "1" is written (low-resistance state is attained) in a first cycle and a third cycle, NLR_W is set at Low level and LR_W is set at High level for a predetermined period in synchronization with clocks, to activate the P-type MOS transistor MP1 and the N-type MOS transistor MN6, and place the second common signal line BUS_B at High level with respect to the first common signal line BUS_T. Thus, a voltage application pulse for writing data to the program elements to attain the low-resistance state is set. Furthermore, the power supply voltage which is the source voltage of the P-type MOS transistor MP1 is set so that a voltage difference between the contact point F117*a* and the contact point F116*a* reaches a voltage which is not less than the voltage at point B shown in FIG. 25. Thus, the data "1" is written (low-resistance state is attained) in the first cycle and the third cycle.

In the same manner, the write data signals WD are written in such a manner that since data "0" is written (high-resistance state is attained) in a second cycle and a fourth cycle, NHR_W is set at Low level and HR_W is set at High level for a predetermined period in synchronization with clocks, to activate the P-type MOS transistor MP2 and the N-type MOS transistor MN5, and place the first common signal line BUS_T at High level with respect to the second common signal line BUS_B. Thus, a voltage application pulse for writing data to the program elements to attain the high-resistance state is set. Furthermore, the power supply voltage which is the source voltage of the P-type MOS transistor MP2 is set so that a voltage difference between the contact point F117*b* and the contact point F116*b* reaches a voltage which is not less than the voltage at point A shown in FIG. 25. Thus, the data "0" is written (high-resistance state is attained) in the second cycle and the fourth cycle.

Next, a read cycle will be described.

When only the RESET signals are set at High level, the address storage register for redundancy 408 recognizes a present cycle as the read cycle and executes a read operation.

Select signals Ga, Gb, Gc, and Gd set at High level for a predetermined period are output in this order to the gates of the N-type MOS transistors MN1 to MN4 of the program element selector circuit 409 in respective clock cycles, thereby allowing the program elements F119*a* to F119*d* to be sequentially connected to the second common signal line BUS_B.

During a read cycle, RGND set at High level is output to activate the N-type MOS transistor MN7 and places the first common signal line BUS_T at ground level. On the other hand, the load command signal N_LD is set at Low level for a predetermined period in synchronization with a clock to activate the P-type MOS transistor MP3, and a load current is fed to any one of the program elements F119*a* to F119*d* which is selected via the second common signal line BUS_B.

As a result, the node SOUT converges a voltage corresponding to a ratio of an actual resistance value of the P-type MOS transistor MP3 to a resistance value of the selected program element. The level of the node SOUT is determined as High level or Low level, and the data is latched by the latch circuit 412 at a specified timing. Thus, data is read.

As should be appreciated from the above, since data can be written and rewritten to the program elements in the application example at a high speed using a simple circuit and a control method, inspection and relieving of faulty bits in manufacturing process steps are easily carried out. In addition, the faulty bits can be relieved when the program elements have changed with a lapse of time. This results in an advantage that a high quality of the program elements is kept.

In the case of the semiconductor device of Embodiment 1, since the nonvolatile resistance variable elements are formed in such a way that the resistance variable layers are formed at the upper side of the uppermost wires and the potential is led out from the underlying layers, program elements which are more stable and highly reliable can be provided by making use of the manufacturing process steps and library of the existing LSI and by adding a few manufacturing process steps.

In addition to the use of relieving of the faulty bits of the semiconductor device explained in the application example 1, the semiconductor device is applicable to known uses in which the fuse elements are used, such as regulation of voltage values and timings of internal power supply voltages, change of specification and function of LSI, etc.

Application Example 2 of Embodiment 1

Application example 2 relates to regulation of a system including a plurality of semiconductor devices such as DDR-specification DRAM and control LSI.

DRAM of DDR interface specification which is operable by high-speed clocks of several hundreds MHz is a representative of memories which have a feature of larger capacities and high-speed data transfer speeds. Therefore, when a system is designed using these memories, it is required that the control LSI or a printed board be designed with high precision in view of positions of the individual memories and distance between them on the printed board, wire or signal properties, and a variation in respective LSIs, and the control LSI or the printed board be regulated on a system board onto which they are placed and coupled.

Figure 30:
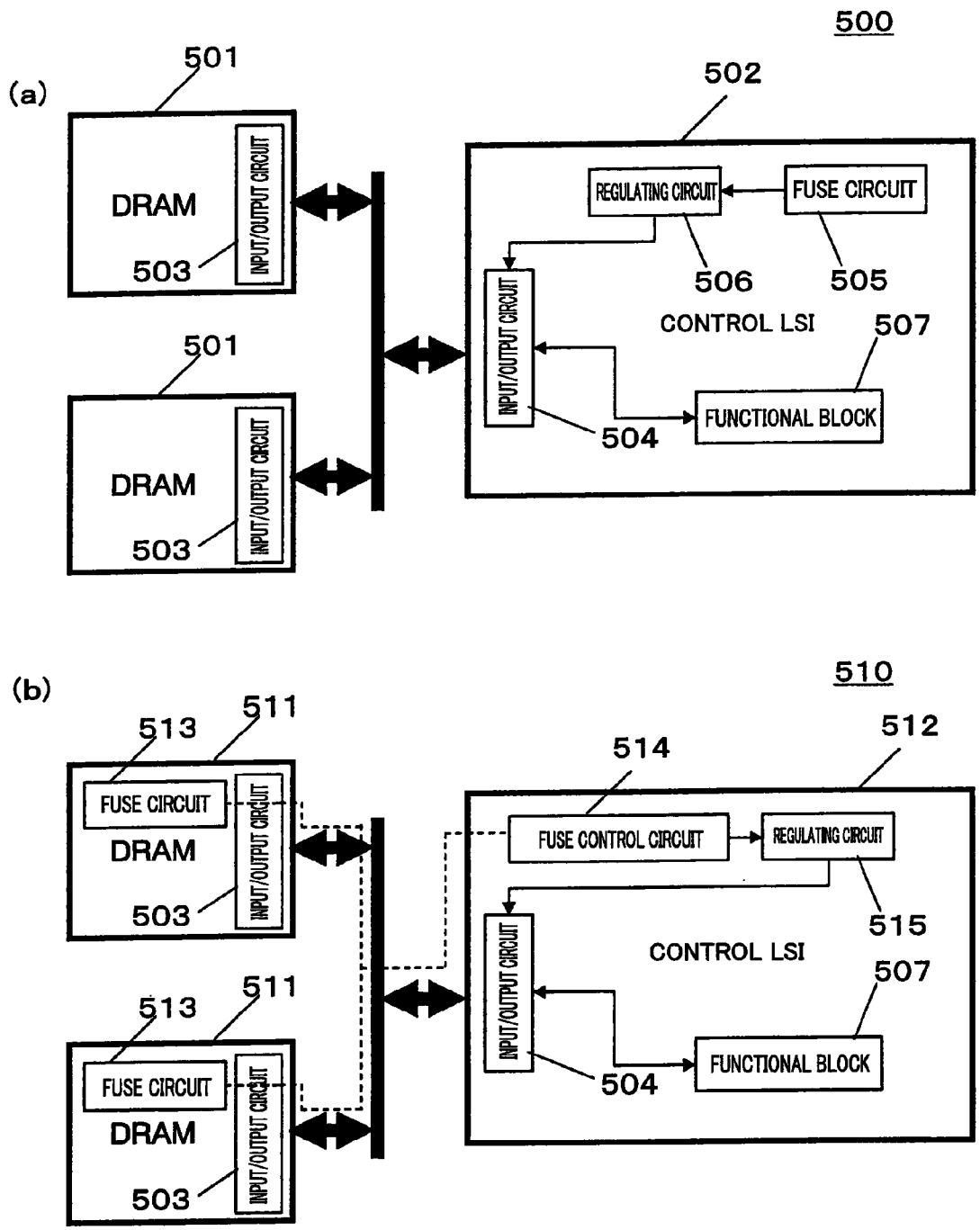
[FIG. 30]

FIG. 30(a) is a view showing an exemplary application of the semiconductor device of Embodiment 1 to a semiconductor system including DRAMs and control LSI. As shown in FIG. 30(a), a system 500 includes semiconductor memory mounted chips (hereinafter referred to as "DRAM 501") and a control LSI mounted chip (hereinafter referred to as "control LSI502") electrically connected to the semiconductor memory mounted chips, and a fuse circuit 502 described later using the semiconductor device 100 of Embodiment 1 as the element for relieving faulty bits of the semiconductor memories is mounted into the control LSI mounted chip.

The system 500 includes a plurality of DRAMs 501 of DDR interface specification and the control LSI502. Input circuits 503 in the DRAMs 501 are connected to an input/output circuit 504 in the control LSI 502 by means of bus to allow data transmission and reception between them. These are arranged on one or a plurality of printed boards (not shown) and are interconnected via metal wires, thus constructing a system board.

505 designates a fuse circuit. 506 designates a regulating circuit for controlling the input/output circuit 504. 507 designates a functional block which has a function of the application in which the control LSI is used. The fuse circuit 505 includes resistance variable layers 119 of a required number having the structure of Embodiment 1 as fuse elements. Timing delay information between the plurality of DRAMs 501 and the control LSI 502 which are placed in the system 500 and the like are programmed in the fuse circuit 505. In the fuse circuit 505, program information of a fuse element corresponding to DRAM 501 which is accessed, among the plurality of DRAMs 501, is read, the data timings and the like taken in from the input/output circuit 504 via the regulating circuit 506 are regulated. The configuration of the fuse circuit 505 is identical to that of the address storage register for redundancy 408 described in application example 1 and will not be described in detail.

As should be appreciated from the above, data can be written and rewritten to the program elements in the application example at a high speed using a simple circuit and a control method. Therefore, the program information may be written to the fuse circuits 505 based on design information of system boards when the control LSIs are manufactured and shipped, or after the system boards are completed with the DRAMs 501 and the control LSIs 502 being coupled to the system boards in such a manner that system boards can be individually regulated so that optimal values are written by reflecting variations in mounted semiconductor devices or printed boards. Thus, the system design is easily made, and as a result, a highly reliable semiconductor system is provided.

In this embodiment, since the nonvolatile resistance variable elements are formed in such a way that the resistance variable layers are formed at the upper sides of the uppermost wires and the potential is led out from the underlying layers, program elements which are more stable and highly reliable can be provided by making use of the manufacturing process steps and library of the existing LSI and by adding a few manufacturing process steps.

FIG. 30(b) shows another example embodied for the same purpose of the example of FIG. 30(a). The example of FIG. 30(b) is different from the example of FIG. 30(a) in that a part of the fuse circuits are placed in the DRAMs.

As shown in FIG. 30(a), a system 510 includes semiconductor memory mounted chips (hereinafter referred to as "DRAMs 511"), and a control LSI mounted chip (hereinafter referred to as "control LSI 512") electrically connected to the semiconductor memory mounted chips, and fuse circuits 513 described later using the semiconductor devices 100 of Embodiment 1 as the elements for relieving faulty bits of the semiconductor memories are mounted into the semiconductor memory mounted chips.

The system 510 includes a plurality of DRAMs 511 of DDR interface specification and the control LSI 512. Input/output circuits 503 in the DRAMs 511 are connected to an input/output circuit 504 in the control LSI 512 by means of bus to allow data transmission and reception between them. These are arranged on one or a plurality of printed boards (not shown) and are interconnected via metal wires, thereby constructing the system board.

513 designates the fuse circuits. 514 designates a fuse control circuit. 515 designates a regulating circuit for controlling the input/output circuit 504. 507 designates a functional block which has a function of the application in which the control LSI is used. The fuse circuit 513 includes resistance variable layers 119 of a prescribed number having the structure of Embodiment 1 as fuse elements. The fuse circuits 513 and the fuse control circuit 514 correspond to portions of the address storage register for redundancy 408 shown in FIG. 28 described in application example 1 such that they are separately arranged. Each of the fuse circuits 513 includes the program elements F119a . . . and the program element selector circuit 408, in the address storage register for redundancy 408. The fuse control circuit 514 includes circuits corresponding to the write circuit 410, the read circuit 411, and the control circuit 412 in the address storage register for redundancy 408. The fuse circuits 513 and the fuse control circuit 514 which are separately arranged are interconnected by means of a signal line corresponding to the first common signal line BUS_T or the second common signal line BUS_B. In this application example, as shown in one-dotted line of FIG. 30(b), the DRAMs 511 are connected to the control LSI by means of a common bus. In an initialization stage of the system just after a power is ON, when the DRAMs are not operated yet, the program information is transmitted. In the following normal operation, the fuse elements are set to be electrically disconnected by the program selector circuit.

In this application example, even after system boards are each completed with the DRAMs 501 and the control LSI 502 being coupled to the system board, the system boards can be individually regulated so that optimal values are written by reflecting variations in mounted semiconductor devices or printed boards. Thus, the system design is easily made, and as a result, a highly reliable semiconductor system is provided.

Placing the fuse elements in the DRAMs like this application example, has an advantage, because in actual circumstances, the control LSI is manufactured in various manufacturing process steps and have been developed to have various specification and functions, and many manufacturers are generally developing and producing many kinds of control LSI in small quantities.

Therefore, the program elements which are stable and highly reliable can be provided by addition of a few manufacturing process steps and with a simple circuit configuration, but they cannot be always incorporated into the system which requires these program elements.

In contrast, DRAMs have standardized specification and have been developed and produced in a few kinds and in large quantities. In accordance with Embodiment 1, since the nonvolatile resistance variable elements are formed in such a way that the resistance variable layers are formed at the upper side of the uppermost wires and the potential is led out from the underlying layers, even in the case of the DRAM, program elements which are stable and highly reliable can be provided by making use of the existing DRAM manufacturing process steps or circuits, by adding a few manufacturing process steps and with a simple circuit configuration.

By placing the fuse elements of a prescribed number in the DRAMs and standardizing control specification of writing and reading for the fuse elements, many control LSI manufacturers may design the fuse control circuits 514 according to the specification and with the existing control LSI manufacturing process steps. In the system incorporating the DRAMs, the fuse elements in this application example can be used widely, when necessary.

Although in the example of FIG. 30(b), the fuse circuits 513 and the fuse control circuit 514 are placed separately such that the fuse circuits 513 are placed in the DRAMs and the fuse control circuit 514 is placed in the control LSI, they may be placed together in the DRAMs like the example of FIG. 30(a), instead of separately.

Although in this application example, the system incorporating the DRAMs of DDR specification is described, the present invention is not limited to this, but may be applied to a system incorporating a plurality of high-speed processors, in the same manner.

Application Example 3 of Embodiment 1

Application example 3 relates to regulation in a system including various sensors and semiconductor devices.

Figure 31:
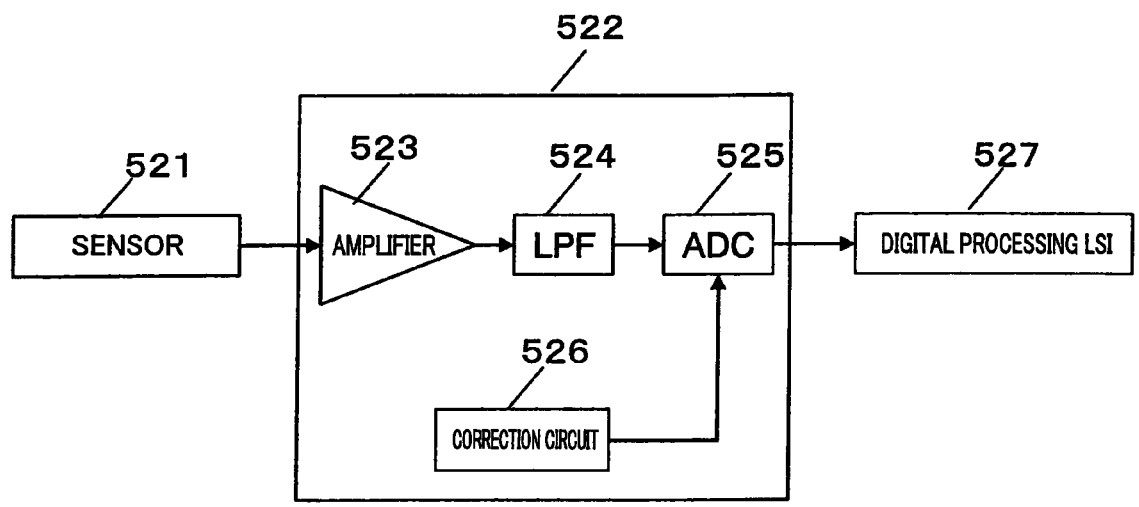
[FIG. 31]
Figure 32:
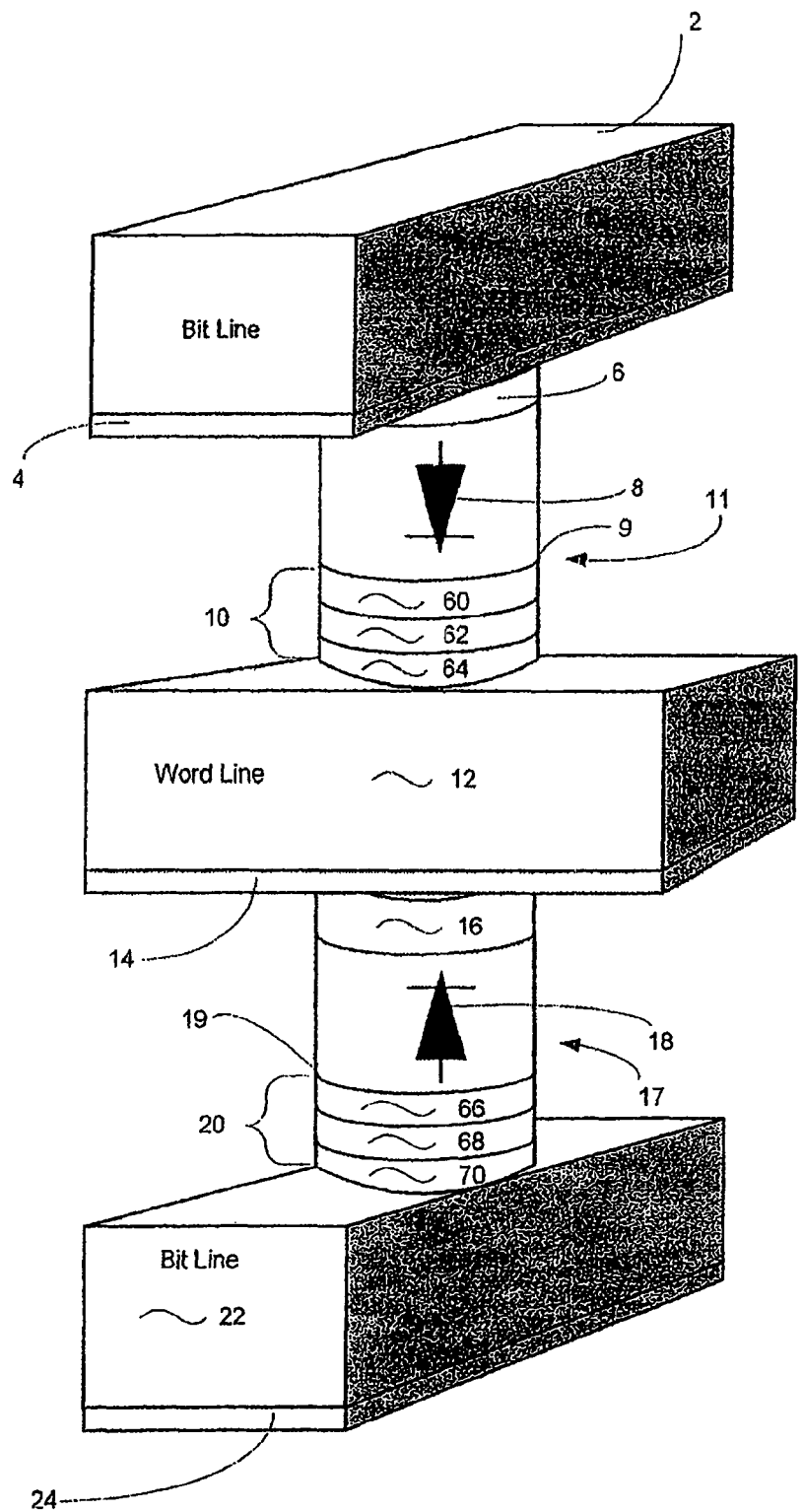
FIG. 32 is a cross-sectional view of a conventional semiconductor device.

FIG. 31 is a view showing an exemplary application of the semiconductor device of Embodiment 1 to a system including an external information input device. A system 520 is configured to include a sensor 521, an analog processing LSI 522 and a digital processing LSI 527. As shown, the system 520 is configured to include an external information input device (sensor 521), an analog processing LSI mounted chip (hereinafter referred to as "an analog processing LSI 522") which receives an output signal from the input device, and a digital processing LSI mounted chip (hereinafter referred to as "digital processing LSI 527") which receives an output signal from the analog processing LSI mounted chip, and a correction circuit 526 using the semiconductor device 100 of Embodiment 1 as the element for regulating the output of the analog processing LSI mounted chip is incorporated into the analog processing LSI mounted chip.

The sensor 521 corresponds to the external information input device, and is constituted by a sound source input microphone, MEMS for detecting a position change, etc.

The analog processing LSI 522 includes an amplifier 523, a LPF (a low pass filter) 524, an ADC (an A-D converter) 525, and the correction circuit 526. The correction circuit 526 includes the program elements having the structure of Embodiment 1 of the present invention and has a circuit configuration similar to that of the address storage register for redundancy 408 shown in FIG. 28 in application example 1. Conventionally generally known means is used as a regulation method of an analog circuit, and therefore, will not be described in detail.

The digital processing LSI 527 has a function of an application in which the LSI is used.

In the above configuration, the correction circuit 526 is configured to finely regulate the output of ADC 525 which is signals given to the digital processing LSI, to correct both of a manufacturing variation in sensors 521 and a manufacturing variation in respective blocks constituting the analog processing LSI. Thus, a high-performance analog circuit system can be constructed.

The analog processing LSI is not so highly integrated but requires a high precision property with a less variation in transistors, etc or a high output property. Therefore, a CMOS process or Bipolar CMOS process which is not relatively restricted in process rule is frequently used for the analog processing LSI. On the other hand, the digital processing LSI requires high integration and high-speed processing. Therefore, CMOS process using microfabrication is frequently used for the digital processing LSI.

In the above configuration, also, in accordance with Embodiment 1, since the nonvolatile resistance variable elements are formed in such a way that the resistance variable layers are formed at the upper side of the uppermost wires and the potential is led out from the underlying layers, in the analog processing LSI, program elements which are stable and highly reliable can be provided by making use of the manufacturing process steps and library of the analog processing LSI, by adding a few manufacturing process steps and with a simple circuit configuration. Thus, the system is easily designed. In addition, after completing system boards, the system boards can be individually regulated. As a result, a semiconductor system which is highly reliable is provided.

INDUSTRIAL APPLICABILITY

A semiconductor device of the present invention is useful as switching elements incorporated into electronic hardware, as a device for regulating an element characteristic of a semiconductor device of analog elements or memory elements, and a device for regulating a variation in many semiconductor devices other than chips or a variation in electronic hardware such as sensors.

DESCRIPTION OF REFERENCE NUMERALS 10 semiconductor device incorporating conventional nonvolatile resistance variable element
100, 200, 300, 400, 500, 600, 700, 800, 900 and 1000 semiconductor devices incorporating nonvolatile resistance variable element of the present invention
101 substrate
102 main circuit
103 fuse circuit
104 gate electrodes of transistors
105 diffusion layers of transistors
106 first interlayer insulating layer
107 first contact
108 first wire
109 second interlayer insulating layer
110 second contact
111 (n−1)-th wire
112 n-th interlayer insulating layer
113 n-th contact
114 uppermost wire (n-th wire)
115 (n+1)-th interlayer insulating layer
116, 117 (n+1)-th contact
118a, 118b, 118c, 118d lower electrode of resistance variable element
119 resistance variable layer
120 passivation layer
121 pad hole
122a, 122b, 122c, 122d, 122e, 122f upper electrode of resistance variable element
123 hole of resistance variable layer
124, 125 wire trench

The invention claimed is:
1. A semiconductor device, comprising:
a semiconductor substrate;
a plurality of transistors formed on the semiconductor substrate;
a multi-layered wire structure including wires arranged in different layers via an insulating layer above the plurality of transistors, the multi-layered wire structure connecting a resistance variable element to the transistor, the resistance variable element being configured to change its resistance in response to voltages applied thereto;
a first terminal and a second terminal which are formed above an uppermost wire of the multi-layered wire structure and are directly connected to the uppermost wire, or which are formed in a part of the uppermost wire; and
a resistance variable layer which is arranged to cover and contact an upper surface of at least one of the first terminal and the second terminal, wherein:
the resistance variable element is covered with only a moisture-resistant passivation layer without forming wires above the resistance variable element, and includes the first terminal, the resistance variable layer and the second terminal,
a conductive layer is formed on the upper surface of the resistance variable layer and has a lower resistance than the resistance variable layer,
the resistance variable layer includes two transition metal oxide layers which comprise a transition metal oxide and are different in oxygen concentration,
a portion of the resistance variable layer, which is in contact with one of the first terminal, the second terminal and the conductive layer, is a transition metal oxide layer with higher oxygen concentration of the two transition metal oxide layers, and
the resistance variable layer is arranged to cover and contact the upper surface of one of the first terminal and the second terminal, and
the conductive layer is arranged to cover and contact the resistance variable layer and to cover and contact the upper surface of the other of the first terminal and the second terminal via a hole formed in the resistance variable layer.

2. A semiconductor chip comprising:
the semiconductor device as recited in claim 1; and
a semiconductor memory or an analog processing LSI.

3. A system comprising:
a semiconductor chip incorporating the semiconductor device as recited in claim 1; and
a chip incorporating a semiconductor memory or a chip incorporating an analog processing LSI, the chip being electrically connected to the semiconductor chip.

4. A semiconductor chip comprising a fuse circuit into which the semiconductor device as recited in claim 1 is incorporated to relieve faulty bits in a semiconductor memory.

5. A system comprising:
a semiconductor memory mounted chip; and
a control LSI mounted chip electrically connected to the semiconductor memory mounted chip;
wherein a fuse circuit using the semiconductor device as recited in claim 1 is incorporated into the control LSI mounted chip to relieve faulty bits in a semiconductor memory.

6. A system comprising:
a semiconductor memory mounted chip; and
a control LSI mounted chip electrically connected to the semiconductor memory mounted chip;
wherein a fuse circuit using the semiconductor device as recited in claim 1 is incorporated into the semiconductor memory mounted chip to relieve faulty bits in a semiconductor memory.

7. A semiconductor chip comprising:
a correction circuit configured to regulate an output of an analog circuit, the correction circuit incorporating the semiconductor device as recited in claim 1.

8. A system comprising:
an external information input device;
an analog processing LSI mounted chip configured to receive an analog output signal from the input device; and
a digital processing LSI mounted chip configured to receive a digital output signal from the analog processing LSI mounted chip,
wherein a correction circuit incorporating the semiconductor device as recited in claim 1 is incorporated into the analog processing LSI mounted chip to regulate an output of the analog processing LSI mounted chip.

9. A method of manufacturing a semiconductor device, the method comprising steps of:
forming a plurality of transistors on a semiconductor substrate;
forming wires in different layers via an insulating layer above the plurality of transistors;
forming a first terminal and a second terminal on an uppermost wire such that the first terminal and the second terminal are electrically connected to the uppermost wire;

forming a resistance variable layer such that the resistance variable layer covers and contacts an upper surface of at least one of the first terminal and the second terminal; and covering an entire surface of the resistance variable layer with only a moisture-resistant passivation layer without forming wires above the resistance variable layer after the step of forming the resistance variable layer, wherein the resistance variable layer includes two transition metal oxide layers which comprise a transition metal oxide and are different in oxygen concentration, the resistance variable layer is arranged to cover and contact the upper surface of one of the first terminal and the second terminal, the method further comprises a step of forming a conductive layer over the upper surface of the resistance variable layer, the conductive layer having a lower resistance than the resistance variable layer, and the conductive layer is arranged to cover and contact the resistance variable layer and to cover and contact the upper surface of the other of the first terminal and the second terminal via a hole formed in the resistance variable layer.

10. The method of manufacturing the semiconductor device according to claim 9, wherein a portion of the resistance variable layer, which is in contact with one of the first terminal, the second terminal and the conductive layer, is a transition metal oxide layer with higher oxygen concentration of the two transition metal oxide layers.

* * * * *